(12) United States Patent
Yamamoto et al.

(10) Patent No.: US 7,968,271 B2
(45) Date of Patent: Jun. 28, 2011

(54) PHOTOSENSITIVE RECORDING MATERIAL, PLANOGRAPHIC PRINTING PLATE PRECURSOR, AND STACKS OF THE SAME

(75) Inventors: Hisao Yamamoto, Shizuoka-ken (JP); Hiromitsu Yanaka, Shizuoka-ken (JP); Takahiro Goto, Shizuoka-ken (JP); Shigeo Koizumi, Shizuoka-ken (JP)

(73) Assignee: FUJIFILM Corporation, Tokyo (JP)

( * ) Notice: Subject to any disclaimer, the term of this patent is extended or adjusted under 35 U.S.C. 154(b) by 183 days.

(21) Appl. No.: 11/715,995

(22) Filed: Mar. 9, 2007

(65) Prior Publication Data

US 2007/0212644 A1 Sep. 13, 2007

(30) Foreign Application Priority Data

Mar. 10, 2006 (JP) ................... 2006-066784
Mar. 31, 2006 (JP) ................... 2006-100905

(51) Int. Cl.
*G03F 7/00* (2006.01)
*G03F 7/26* (2006.01)
(52) U.S. Cl. .................. 430/273.1; 430/270.1
(58) Field of Classification Search ............. 430/270.1, 430/273.1, 271.1, 300, 302
See application file for complete search history.

(56) References Cited

U.S. PATENT DOCUMENTS

| | | | |
|---|---|---|---|
| 6,547,075 B1 * | 4/2003 | Usui | 206/455 |
| 6,706,462 B2 * | 3/2004 | Murota et al. | 430/273.1 |
| 2002/0012808 A1 * | 1/2002 | Ishizaki et al. | 428/516 |
| 2002/0182538 A1 * | 12/2002 | Tomita et al. | 430/278.1 |
| 2003/0143473 A1 * | 7/2003 | Goto | 430/7 |
| 2004/0180789 A1 * | 9/2004 | Yamamoto et al. | 503/201 |
| 2006/0216637 A1 * | 9/2006 | Koizumi | 430/270.1 |
| 2007/0148593 A1 * | 6/2007 | Shimada et al. | 430/270.1 |

FOREIGN PATENT DOCUMENTS

| | | | |
|---|---|---|---|
| EP | 0 274 723 A1 | | 7/1988 |
| EP | 0 276 566 A1 | | 8/1988 |
| EP | 0 299 435 A2 | | 1/1989 |
| EP | 1 450 207 A1 | | 8/2004 |
| EP | 1 629 975 A1 | | 3/2006 |
| EP | 1 630 611 A2 | | 3/2006 |
| JP | 7-103171 B2 | | 11/1995 |
| JP | 10-228109 A | | 8/1998 |
| JP | 11-38633 A | | 2/1999 |
| JP | 11038633 A | * | 2/1999 |
| JP | 2004-318053 A | | 11/2004 |
| JP | 2005-121863 A | | 5/2005 |
| WO | 88/04794 A1 | | 6/1988 |

OTHER PUBLICATIONS

European Search Report dated Jan. 5, 2009.

* cited by examiner

*Primary Examiner* — Cynthia H Kelly
*Assistant Examiner* — Chanceity N Robinson
(74) *Attorney, Agent, or Firm* — Sughrue Mion, PLLC

(57) ABSTRACT

The present invention provides a photosensitive recording material having a support, and a photosensitive layer and a protective layer formed in this order on or above the support. The photosensitive layer contains a polymerization initiator, a sensitizing agent, and a polymerizable compound. Further, the protective layer contains a water-insoluble and alkali-soluble dye that has an absorption wavelength region different from the absorption wavelength region of the sensitizing agent, and the dye is dispersed in a solid state in the protective layer. The present invention also provides a planographic printing plate precursor including the photosensitive recording material, a stack of the photosensitive recording materials, and a stack of the planographic printing plate precursors.

14 Claims, No Drawings

PHOTOSENSITIVE RECORDING MATERIAL, PLANOGRAPHIC PRINTING PLATE PRECURSOR, AND STACKS OF THE SAME

CROSS-REFERENCE TO RELATED APPLICATION

This application claims priority under 35USC 119 from Japanese Patent Applications Nos. 2006-066784 and 2006-100905, the disclosures of which are incorporated by reference herein.

BACKGROUND OF THE INVENTION

1. Field of the Invention

The present invention relates to a photosensitive recording material, a photosensitive planographic printing plate precursor, and stacks thereof. In particular, the present invention relates to a photosensitive recording material suitable for a negative planographic printing plate precursor capable of direct drawing with a laser light and high speed processing. More particularly, the present invention relates to a photosensitive recording material improved in adhesiveness between the recording materials even by stacking plural sheets of the photosensitive recording material, and a planographic printing plate precursor using the photosensitive recording material.

2. Description of the Related Art

Conventionally, a plate having a lipophilic photosensitive resin layer provided on a hydrophilic support has been used widely as a planographic printing plate precursor, and a desired printing plate is obtained by a plate-making method which usually involves masked light exposure (surface light exposure) via a lithographic film and then removing a non-image area by dissolution. In recent years, digitalization techniques which involve electronic processing, accumulation and output of image information with a computer are spreading. A wide variety of new image output systems compatible with these digitalization techniques have come to be used in practice. As a result, there has been demand for computer-to-plate (CTP) techniques for producing a printing plate directly by scanning a highly directional light such as a laser light according to digitalized image information without a lithographic film, and the provision of a planographic printing plate precursor adapted to these techniques has proved a significant technical challenge.

As a planographic printing plate precursor capable of such scanning exposure, a planographic printing plate precursor including a hydrophilic support provided thereon with a lipophilic photosensitive resin layer (hereinafter, sometimes referred to as "photosensitive layer") containing a photosensitive compound capable of generating active species such as radicals or Brønsted acid upon exposure to a laser light has been proposed and made commercially available. This planographic printing plate precursor is subjected to laser scanning according to digital information to generate active species acting on the photosensitive layer to cause physical or chemical change, thus making the layer insoluble, and then subjected to development treatment to give a negative planographic printing plate.

In particular, a planographic printing plate precursor provided with a photopolymerizable type photosensitive layer containing a photopolymerization initiator superior in photosensitive speed, an addition polymerizable ethylenic unsaturated compound and a binder polymer soluble in an alkali developing solution on a hydrophilic support and, as required, a protective layer having oxygen blocking property on a hydrophilic support has the advantages of high productivity, simple development treatment and high resolution and print adhesion, which advantages give the planographic printing plate precursor a desirable printing performance (see for example, Japanese Patent Application Laid-Open (JP-A) No. 10-228109).

Further, a planographic printing plate precursor has been disclosed which includes a photopolymerizable photosensitive layer containing a photopolymerization initiator, an ethylenically unsaturated compound capable of addition polymerization, and a binder polymer soluble in an alkaline developer and having a repeating unit of a specified structure on a hydrophilic support and, as required, a protective layer having oxygen blocking property on a hydrophilic support (see, for example JP-A 2004-318053). Further, a negative planographic printing plate precursor has been disclosed which includes a photopolymerizable photosensitive layer, and an oxygen blocking protective layer containing an inorganic lamellar compound on a hydrophilic support (see, for example JP-A No. 11-38633).

Also, in order to further improve productivity, that is, to enhance plate making speed, a recording material which employs a photopolymerizable composition containing a cyanine dye having a specific structure, an iodonium salt and an addition polymerizable compound having an ethylenic unsaturated double bond in a photosensitive layer and needs no heating treatment after imagewise exposure (see, for example, Japanese Patent Application Publication (JP-B) No. 7-103171). This image recording material, however, has a drawback in that polymerization inhibition is caused by oxygen in the air in the polymerization reaction, bringing about reduced sensitivity and unsatisfactory strength of the formed image.

To address this problem, the following methods are known: a method in which a protective layer containing a water-soluble polymer is formed on a photosensitive layer and a method in which a protective layer containing an inorganic lamellar compound and a water-soluble polymer is formed (see, for example, JP-A No. 11-38633). The presence of the protective layer prevents polymerization inhibition so that a curing reaction is promoted at the photosensitive layer and it is therefore possible to improve the strength of the image area.

Meanwhile, with regard to productivity in the plate-making operation of a photopolymerization type planographic printing plate precursor featuring a simple development treatment, it is important to shorten the time required in the exposure process.

In the exposure process, a planographic printing plate precursor is usually supplied as a stack of the planographic printing plate precursors in which an interleaf sheet is inserted between each of the planographic printing plate precursors. The interleaf sheet has a function for preventing the planographic printing plate precursors from adhering to one another, and a function for preventing the surface of a relatively soft protective layer from being damaged by being rubbed with an aluminum support. However, the time necessary for removing the interleaf sheet in the exposure process has been the cause of inefficiency in plate-making. The process for removing the interleaf sheet may be omitted by using a stack having no inserted interleaf sheet between the planographic printing plate precursors, in order to make the exposure process more efficient. However, the problems of adhesion of the planographic printing plate precursor and damage of the surface of the protective layer provided on the photosensitive layer by rubbing with the back face of the aluminum support need to be addressed when a stack having no inserted interleaf sheet is used.

When a photosensitive planographic printing plate precursor is manipulated under room light, unintended fogging due to long term exposure to the room light having lower luminance than laser exposure (safety light fogging in visible light sensitive materials; referred to as "safety light fogging" hereinafter when appropriate) may be caused. In order to prevent this problem from occurring, radical species generated unintentionally are quenched by controlling oxygen permeability of the protective layer by a known method. Specifically, a method in which a protective layer including at least one of polyvinyl pyrrolidone and a copolymer of polyvinyl pyrrolidone and vinyl acetate is formed, and the mass of the protective layer is controlled to within a range of from 0.50 g/m$^2$ to 2.30 g/m$^2$ has been proposed (see, JP-A2005-121863).

As described above, there has been a need for a photosensitive recording material, and particularly a photosensitive planographic printing plate precursor, which is capable of suppressing polymerization inhibition of the photosensitive layer, does not require insertion of interleaf sheets when a plurality of planographic printing plate precursors are stacked, and is capable of improving productivity of plate making operations. However, such a photosensitive recording material and a planographic printing plate precursor have not yet been provided.

SUMMARY OF THE INVENTION

The present invention has been made in consideration of the above-described circumstances.

A first aspect of the present invention is to provide a photosensitive recording material comprising a support, and a photosensitive layer and a protective layer formed in this order on or above the support, wherein: the photosensitive layer comprises a polymerization initiator, a sensitizing agent, and a polymerizable compound; and the protective layer comprises a water-insoluble and alkali-soluble dye that has an absorption wavelength region different from the absorption wavelength region of the sensitizing agent, wherein the dye is dispersed in a solid state in the protective layer.

A second aspect of the present invention is to provide a stack of photosensitive recording materials comprising a plurality of the photosensitive recording materials according to according the first aspect of the present invention, wherein an outermost surface at a photosensitive layer side of a photosensitive recording material directly contacts an outermost surface of a side opposite to the photosensitive layer side of a contiguous photosensitive recording material.

A third aspect of the present invention is to provide a photosensitive planographic printing plate precursor using the photosensitive recording material of the first aspect of the present invention.

A fourth aspect of the present invention is to provide a s stack of photosensitive recording materials comprising a plurality of the planographic printing plate precursors according to the third aspect of the present invention, wherein an outermost surface of a photosensitive layer side of a planographic printing plate precursor directly contacts an outermost surface of a side opposite to the photosensitive layer side of a contiguous planographic printing plate precursor.

The phrase "form(ed) in this order" means that a photosensitive layer and a protective layer are arranged on or above a support in this order, but this phrase dose not deny the presence of other layers (for example, an intermediate layer, a back coat layer, etc.) arranged in accordance with specific objectives.

DETAIL DESCRIPTION OF THE INVENTION

<Photosensitive Recording Material, Photosensitive Planographic Printing Plate Precursor, and Stacks Thereof>

The photosensitive recording material of the present invention includes a support, a photosensitive layer and a protective layer, which are formed in this order on or above the support. The photosensitive layer contains a polymerization initiator, a sensitizing agent, and a polymerizable compound. The protective layer contains a water-insoluble and alkali-soluble dye that has an absorption wavelength region different from the absorption wavelength region of the sensitizing agent, wherein the water-insoluble and alkali-soluble dye is dispersed in a solid state in the protective layer.

In a preferred embodiment, the present invention further provides a photosensitive recording material having an intermediate layer that has oxygen blocking property between the photosensitive layer and the protective layer.

In the descriptions hereinafter, the dye dispersed in the protective layer in a solid state is sometimes referred to as "solid dispersion dye".

In the present specification " . . . to . . . " represents a range including the numeral values represented before and after "to" as a minimum value and a maximum value, respectively.

The photosensitive recording material of the present invention is suitably applied to a photo resist, a flexographic printing plate and a photosensitive planographic printing plate precursor. Among these, the photosensitive recording material of the preset invention is particularly preferably applied to the photosensitive planographic printing plate precursor. That is, the photosensitive planographic printing plate precursor of the invention (hereinafter, sometimes referred to as "planographic printing plate precursor") uses the photosensitive recording material of the present invention.

The stack of photosensitive recording materials of the invention includes a plurality of the photosensitive recording materials of the present invention, in which the outermost surface at the photosensitive layer side of a photosensitive recording material directly contacts the outermost surface opposite to the photosensitive layer side of a contiguous photosensitive recording material.

The photosensitive recording material of the present invention is capable of recording with laser and suppressing polymerization inhibition of the photosensitive layer. In addition, even when the photosensitive recording materials are stored long term in a high humidity environment or transported as a stack of the recording materials, the outermost surface at the photosensitive layer side of the photosensitive recording material and the outermost surface opposite to the photosensitive layer side of a contiguous photosensitive recording material are prevented from adhering to one another.

Accordingly, the planographic printing plate precursor according to a preferred embodiment of the photosensitive recording material is excellent in peelability between each plates even when the planographic printing plate precursors are stacked without insertion of interleaf sheets for storage and transportation. Accordingly, stacking the planographic printing plate precursors of the present invention does not require an additional process for alternately stacking the planographic printing plate precursors and the interleaf sheets, nor the materials used for the interleaf sheets.

The protective layer of the photosensitive recording material or the photosensitive planographic printing plate precursor is capable of improving compatibility with safelight by using a solid dispersion dye in accordance with its compatibility with exposure.

The "outermost surface opposite to the photosensitive layer side" may be an opposite surface (back surface of the support), per se, to the surface of the support having the photosensitive layer, or a surface at the back of the support when a certain layer (for example, a back layer as described below) is formed on the back surface of the support.

While the function of the present invention has not been elucidated yet, it is presumed to be as follows.

The protective layer of the present invention contains a water-insoluble and alkali-soluble dye that has an absorption wavelength region different from the absorption wavelength region of the sensitizing agent contained in the photosensitive layer.

The photosensitive recording material having the protective layer described above is able to block oxygen sufficiently from the outside. Thus, the curing reaction of the photosensitive layer is accelerated and the strength of the image portion is improved.

Further, in a preferred embodiment of the present invention, an oxygen-permeable intermediate layer is provided between the photosensitive layer and the protective layer. In this case also, oxygen from the outside can be sufficiently blocked, and oxygen as a cause of the polymerization inhibition can be effectively suppressed from permeating. Consequently, a high quality image without image formation problems and image defects at the exposed portion can be formed while taking advantage of compatibility with safelight.

Since the solid dispersion dye of the present invention is dispersed in the protective layer in a solid state, the dye is considered to function as a matting agent. Therefore, adhesion between the recording materials can be effectively prevented when the recording materials are stacked in contact with one another. In particular, since the planographic printing plate precursors can be stacked while preventing them from adhering to one another without inserting interleaf sheets in the photosensitive planographic printing plate precursors of a preferred embodiment of the photosensitive recording material of the present invention, high efficiency of plate-making can be achieved.

Since the solid dispersion dye may function as a kind of filter when it is used in accordance with its compatibility with exposure, the dye is considered to be able to prevent unintended polymerization. Consequently, fogging does not easily occur even due to manipulation in a bright room, and compatibility with the safelight may be improved.

The constituent elements of the photosensitive recording material of the present invention will be sequentially described below.

While the present invention is described with respect to the photosensitive planographic printing plate precursor as an example of a preferred embodiment of the photosensitive recording material, the photosensitive recording material of the present invention is not restricted thereto.

1. Protective Layer

The protective layer according to the present invention contains solid dispersion of a water-insoluble and alkali-soluble dye (solid dispersion dye) having an absorption wavelength region different from the absorption wavelength region of the sensitizing agent contained in the photosensitive layer, which is described below.

1-1. Solid Dispersion Dye

The solid dispersion dye dispersed as a solid state in the protective layer of the present invention will be described below.

The term "Solid dispersion" as used herein refers to a dispersed state of a solid as fine particles in an inert carrier.

Examples of the solid dispersion dye of the present invention include compounds described in Tables I to X in International Publication No. 88/04794, compounds represented by the following formulae (I) to (VII), and other dyes described in the references listed below.

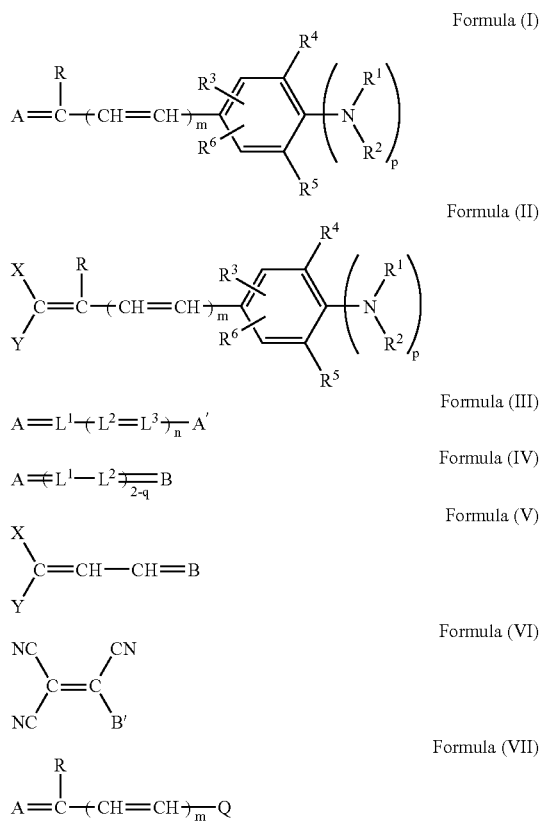

In formulae (I) to (VII), A and A' may be the same or different each other, and each independently represents an acidic nucleus. B represents a basic nucleus. X and Y may be the same or different each other, and each independently represents an electron absorbing group. R represents a hydrogen atom or an alkyl group. $R^1$ and $R^2$ each independently represents an alkyl group, an aryl group, an acyl group or a sulfonyl group, and $R^1$ and $R^2$ may be linked together to form a 5-membered or 6-membered ring. $R^3$ and $R^6$ each independently represents a hydrogen atom, a hydroxyl group, a carboxyl group, an alkyl group, an alkoxy group or a halogen atom. $R^4$ and $R^5$ each independently represents a hydrogen atom, or a non-metallic atom group necessary for forming a 5- or 6-membered ring by linking $R^1$ and $R^4$ or $R^2$ and $R^5$ together. $L^1$, $L^2$ and $L^3$ each independently represents a methine group. m represents an integer of 0 or 1, and n and q each independently represents an integer of 0, 1 or 2. p represents an integer of 0 or 1, and $R^3$ represents a hydroxyl group or a carboxyl group and $R^4$ and $R^5$ each represents a hydrogen atom when p represents 0. B' represents a carboxyl group, a sulfamoyl group or a heterocyclic group having a sulfonamide group. Q represents a heterocyclic group. The compounds represented by formulae (I) to (VII) have at least one dissociating group in a molecule having a pKa in the range from 4 to 11 in a mixed solvent of water and ethanol in a 1:1 volume ratio.

Other dyes available include those described in European Patent publication (EP) Nos. 0274723A1, 276,566 and 299, 435; JP-A Nos. 52-92716, 55-155350, 55-155351, 61-205934 and 48-68623; U.S. Pat. Nos. 2,527,583, 3,486,897, 3,746,539, 3,933,798, 4,130,429 and 4,040,841; and Japanese Patent applications Nos. 1-50874, 1-103751 and 307363.

The methods for dispersing the solid dispersion dye include a method for mechanically dispersing the solid dispersion dye with an appropriate dispersing agent in water with a ball mill, sand mill or colloid mill; and a method for obtaining a dispersed solid by dissolving the solid dispersion dye in an appropriate solvent followed by precipitating the dye by adding a poor solvent of the dye. The dispersing method described in the above-mentioned references on the solid dispersion dyes may be also applied in the present invention.

The absorption wavelength region of the solid dispersion dye is required to be different from the absorption wavelength region of the sensitizing agent described later as a component of the photosensitive layer.

The solid dispersion dye may be appropriately selected depending on compatibility with exposure of the photosensitive recording material (preferably the photosensitive planographic printing plate precursor).

The solid dispersion dye preferably has an absorption maximum in a range of from 300 to 500 nm.

Specific examples (exemplified compounds I-1 to VII-7) of the solid dispersion dye applicable in the present invention are shown below. However, the present invention is by no means restricted to these examples.

I-1

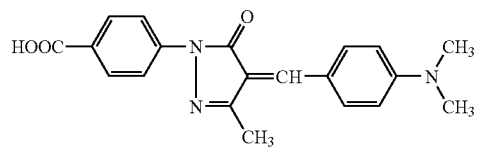

I-2

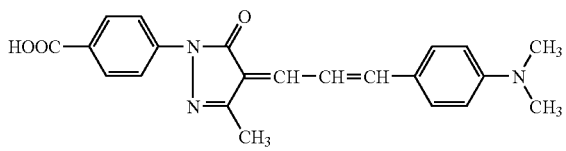

I-3

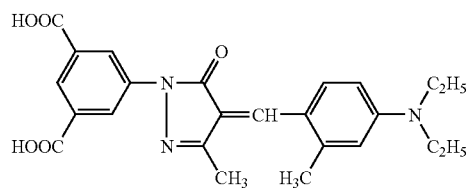

I-4

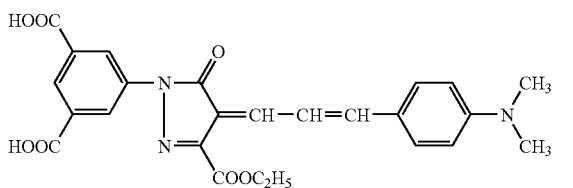

I-5

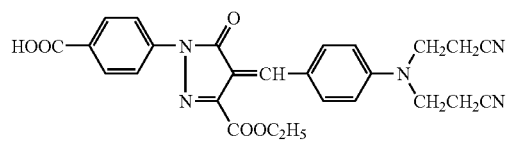

I-6

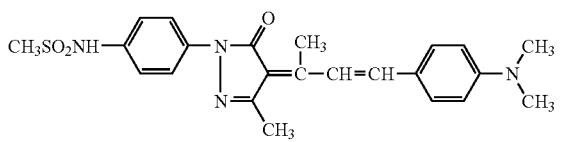

I-7

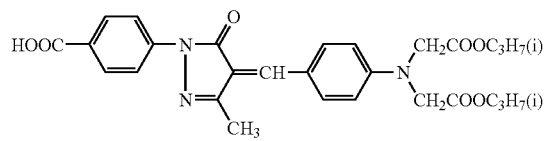

I-8

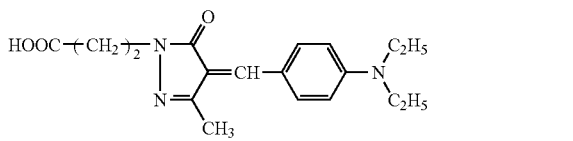

I-9

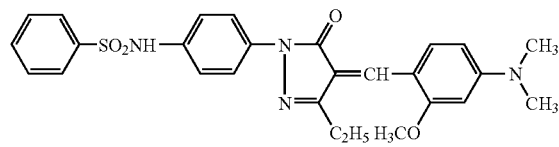

I-10

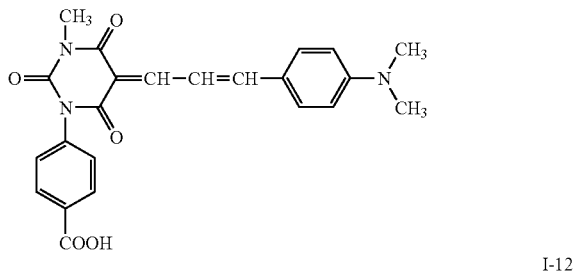

I-11

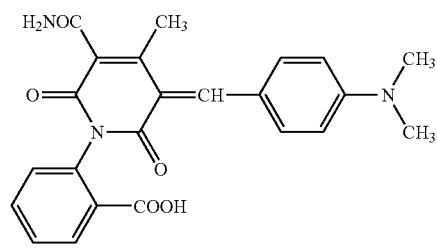

I-12

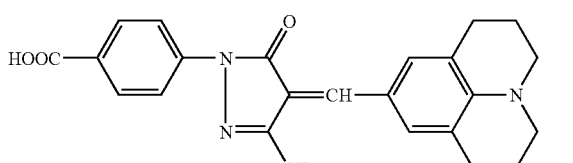

-continued
I-13
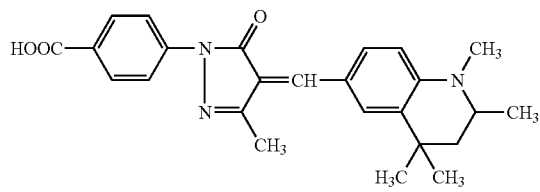
I-14
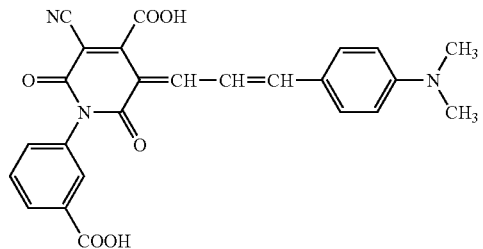
I-15
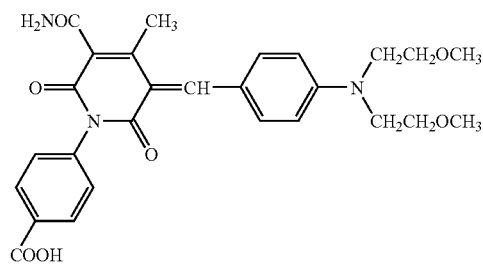
I-16
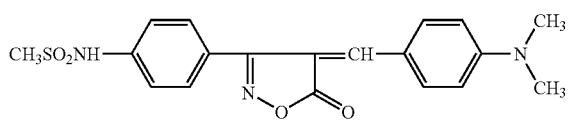
I-17
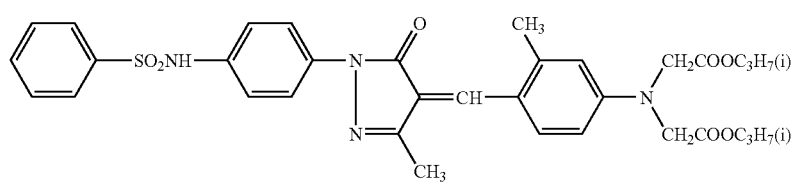
I-18
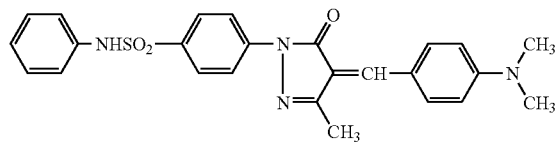
I-19
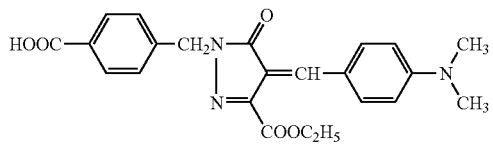
I-20
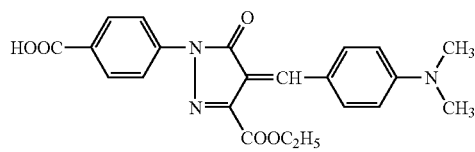
II-1
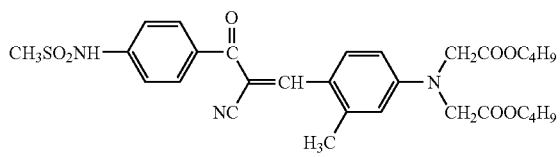
II-2
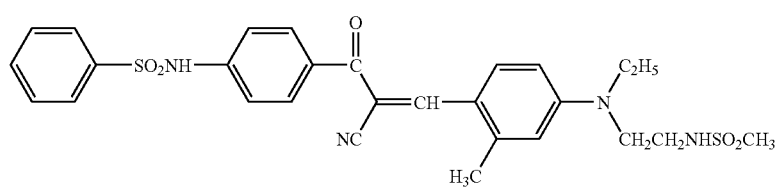
II-3
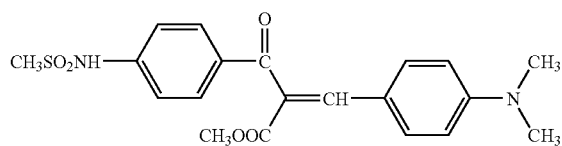
II-4
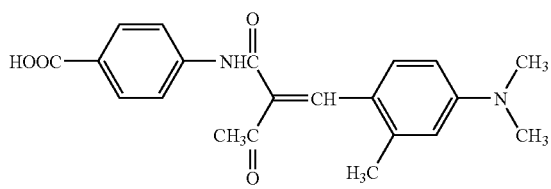

-continued
II-5
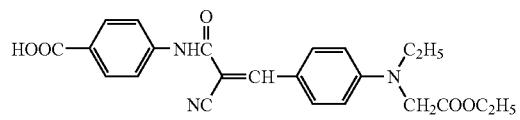
II-6
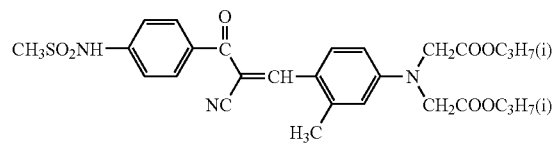
III-1
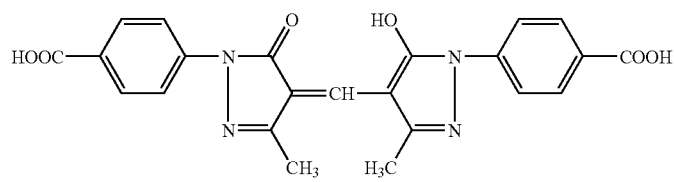
III-2
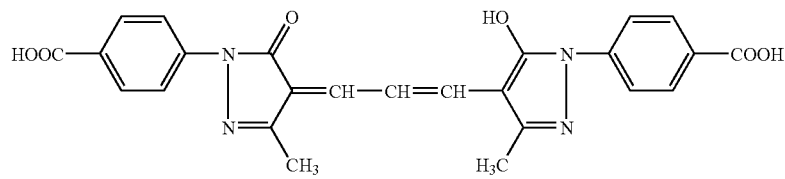
III-3
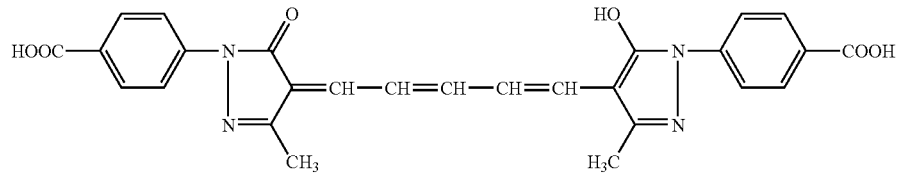
III-4
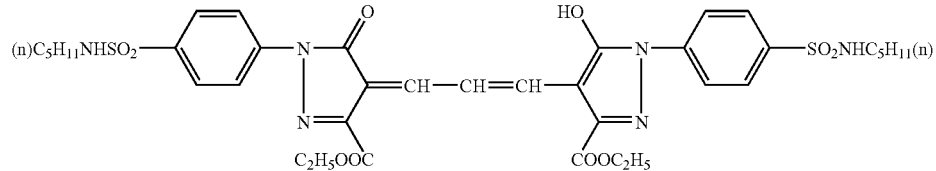
III-5
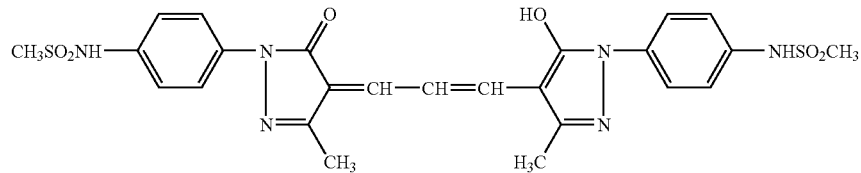
III-6
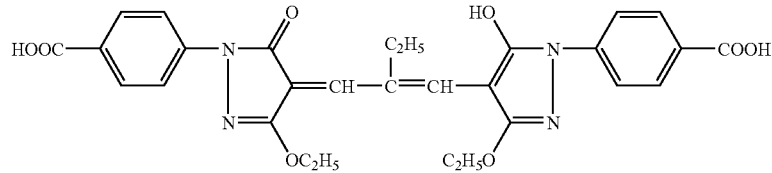
III-7
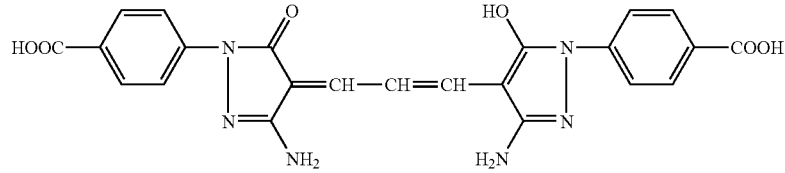
III-8
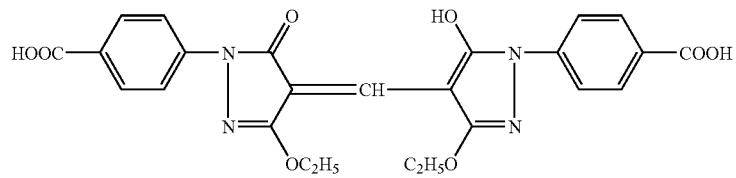

-continued
III-9
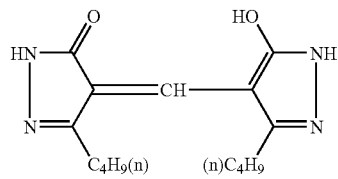
III-10
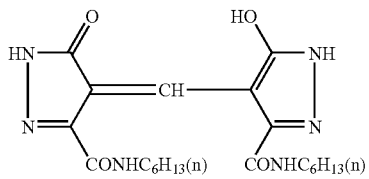
IV-1
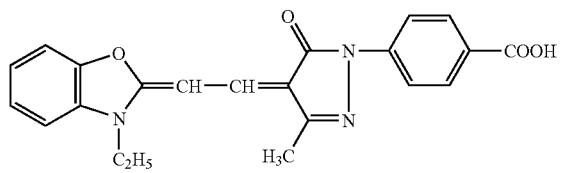
IV-2
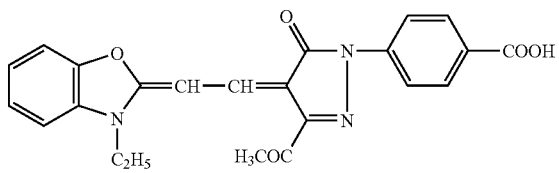
IV-3
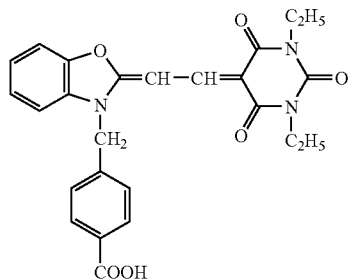
IV-4
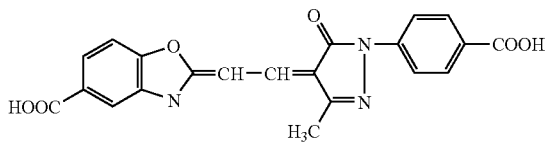
IV-5
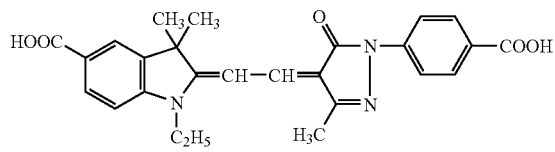
IV-6
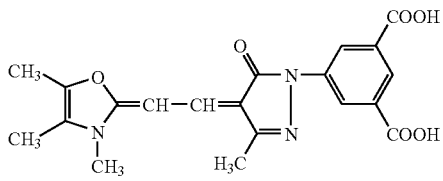
IV-7
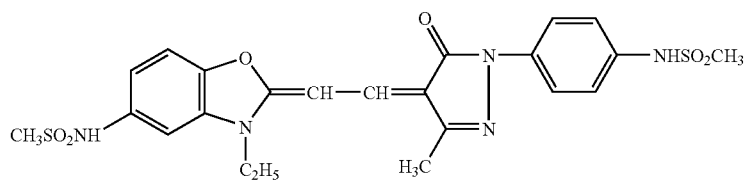
IV-8
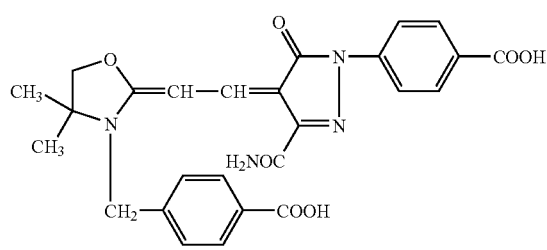
IV-9
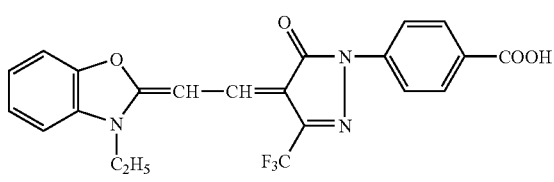
V-1
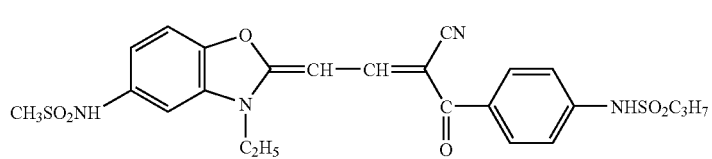
V-2
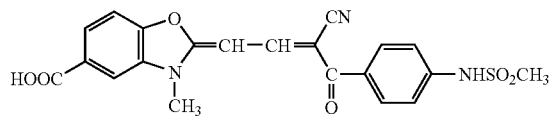
V-3
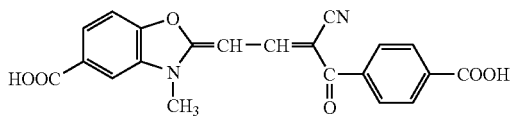

-continued
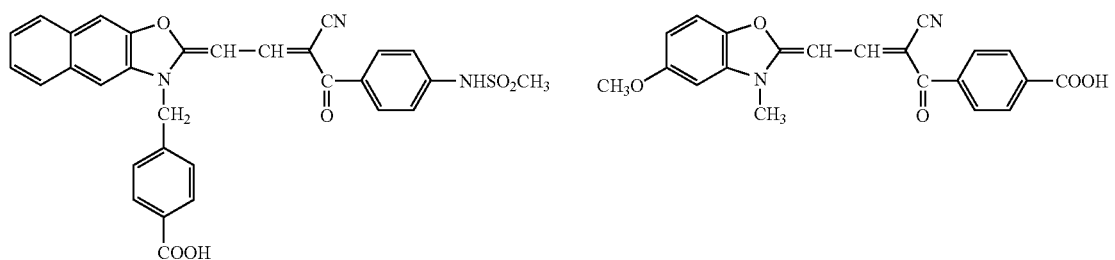
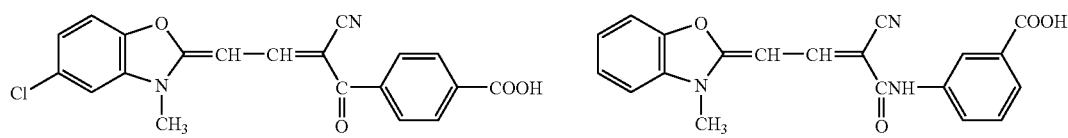
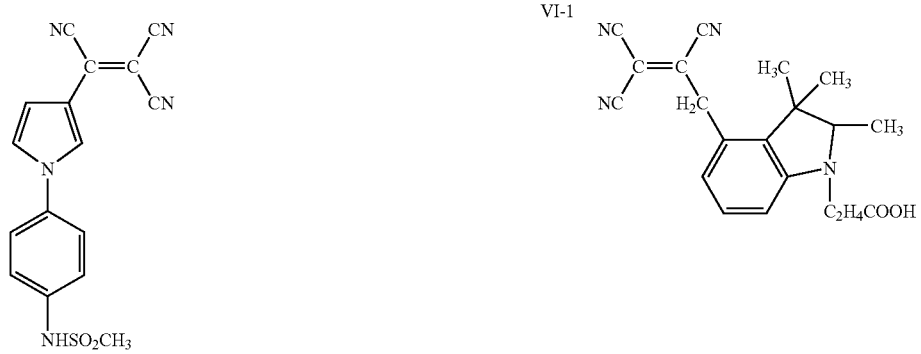
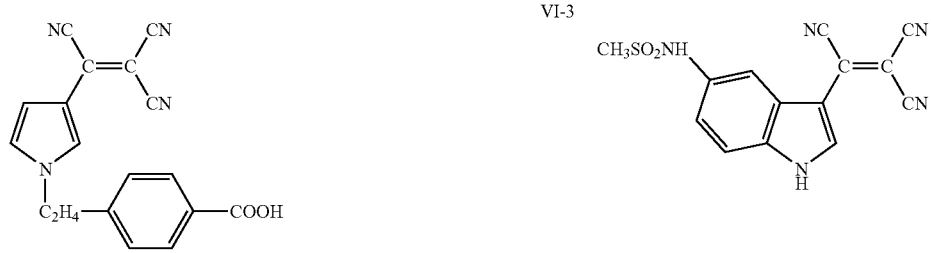
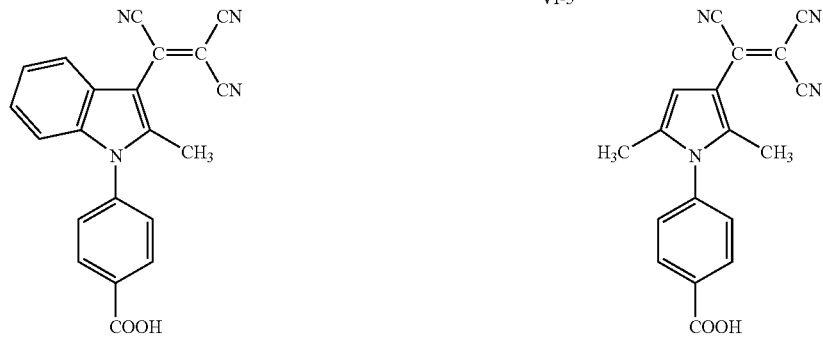

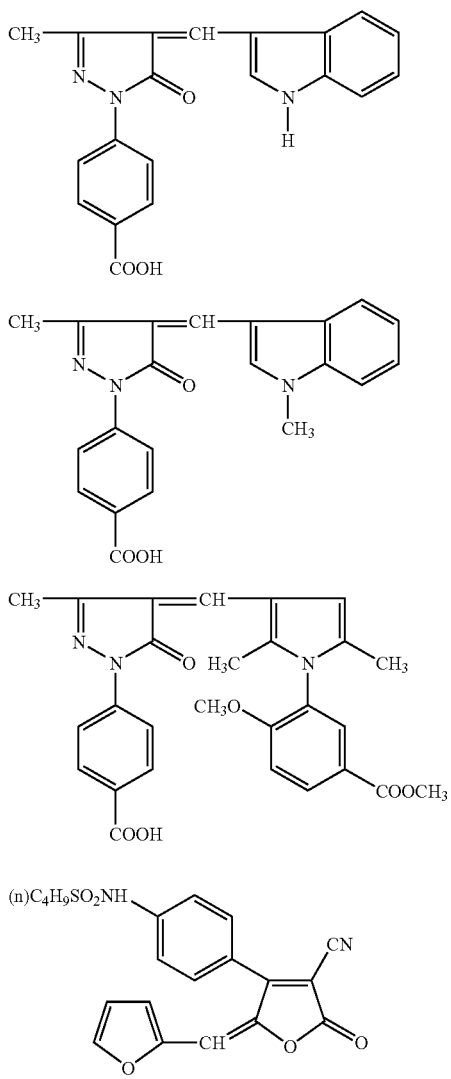

The solid dispersion dye can be readily synthesized according to the methods described in EP Nos. 0274723A1, 276,566 and 299,435; JP-A Nos. 52-92716, 55-155350, 55-155351, 61-205934 and 48-68623; U.S. Pat. Nos. 2,527, 538, 3,486,897, 3,746,539, 3,933,798, 4,130,429 and 4,040, 841; and Japanese Patent applications Nos. 1-50874, 1-103751 and 1-307363, and by modified methods thereof.

Among the above-mentioned solid dispersion dyes, dyes having a partial structure in which a nitrogen-containing five-membered heterocyclic ring is directly linked to the terminal of a methine chain are preferable.

The volume average particle diameter of the solid dispersion dye is preferably from 0.2 to 30 μm, and more preferably from 0.5 to 20 μm. Due to a sufficient matting effect being exhibited when the volume average particle diameter of the solid dispersion dye is within the above-described range, the surface at the photosensitive layer side of the planographic printing plate precursor is prevented from adhering to the back surface of the support of a contiguous planographic printing plate precursor when plural planographic printing plate precursors are stacked. Consequently, non-cured portions are not generated in the photosensitive layer, and image defects are not caused.

The volume average particle diameter of the solid dispersion dye was determined using LA-910 (trade name: manufactured by Horiba Co.).

The content of the solid dispersion dye in the protective layer is preferably from 1.0 to 25.0% by mass, and more preferably from 3 to 10% by mass, with respect to the solid content in the protective layer.

Due to a sufficient matting effect being exhibited when the content of the solid dispersion dye is within the above-described range, the surface at the photosensitive layer side of the planographic printing plate precursor is prevented from adhering to the back surface of the support of a contiguous planographic printing plate precursor when plural planographic printing plate precursors are stacked, and the properties of the surface of the protective layer are also excellent.

The protective layer may contain only one kind of the solid dispersion dye, or a plurality of the dyes may be used together.

1-2. Binder Polymer

The protective layer according to the present invention preferably contains a binder polymer.

Water-soluble polymer compounds having relatively excellent crystallinity are used as the binder polymer contained in the protective layer. Specific examples of the water-soluble polymer include polyvinyl alcohol, polyvinyl pyrrolidone, acidic cellulose, gelatin and gum Arabic, polyacrylic acid. Among these polymers, polyvinyl alcohol is preferably used as a principal component in terms of the properties of the membrane. Polyvinyl alcohol used for the protective layer may be partially substituted with esters, ethers or acetals so long as polyvinyl alcohol contains no n-substituted vinyl alcohol units for maintaining oxygen blocking property and water solubility necessary for the protective layer. Polyvinyl alcohol may be a copolymer having other repeating units.

Specific examples of the binder polymer contained in the protective layer include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L8 (trade names: manufactured by Kuraray Co.). Examples of the copolymers of the above-mentioned polymers include polyvinyl acetate, polyvinyl chloroacetate or polyvinyl propionate with a hydrolysis ratio from 88 to 100%, polyvinyl formal and polyvinyl acetal, and copolymers thereof. Other useful polymers include polyvinyl pyrrolidone, gelatin and gum Arabic. One of them may be used alone, or a plurality of them may be used together.

Polyvinyl alcohol favorably used in the present invention has a hydrolysis ratio from 71 to 100% and a molecular weight from 200 to 2400. Polyvinyl alcohol having a saponification ratio of 91 mol % or more is preferably used from the view points of high oxygen blocking property, excellent film forming ability and low adhesivity of the surface of the protective layer.

Examples of polyvinyl alcohol suitable for use in the protective layer include PVA-102, PVA-103, PVA-104, PVA-105, PVA-110, PVA-117, PVA-120, PVA-124, PVA-117H, PVA-135H, PVA-HC, PVA-617, PVA-624, PVA-706, PVA-613, PVA-CS and PVA-CST (trade names: manufactured by Kuraray Co.); GOHSENOL NL-05, NM-11, NM-14, AL-06, P-610, C-500, A-300 and AH-17 (trade names: manufactured by Nippon Synthetic Chemical Industry Co.); and JF-04, JF-05, JF-10, JF-17, JF-17L, JM-05, JM-10, JM-17, JM-17L, JT-05, JT-13 and JT-15 (trade names: manufactured by Japan Vam & Poval Co.).

Acid-modified polyvinyl alcohol may be also favorably used as the binder polymer contained in the protective layer. Specific examples of the favorable polyvinyl alcohol include carboxyl-modified polyvinyl alcohol such as those modified with itaconic acid and maleic acid, and polyvinyl alcohol modified with sulfonic acid. Acid-modified polyvinyl alcohol having a degree of saponification of 91 mol % or more is more favorably used.

Specific examples of acid-modified polyvinyl alcohol include KL-118, KM-618, KM-118, SK-5102, MP-102 and R-2105 (trade names: manufactured by Kuraray Co.); GOHSENAL CKS-50, T-HS-1, T-215, T-350, T-330 and T330H (trade names: manufactured by Nippon Synthetic Chemical Industry Co.); and AF-17 and AT-17 (trade names: manufactured by Japan Vam & Poval Co.).

The content of the binder polymer in the protective layer is preferably in the range from 45 to 95% by mass, more preferably in the range from 50 to 90% by mass, with respect to the total solid content in the protective layer from the view points of sensitivity of the photosensitive planographic printing plate precursor and adhesiveness between the printing plates when stacked.

At least one kind of the binder polymer is preferably contained in the protective layer, and a plurality of the binder polymers may be used together. The content is preferably in the above-mentioned range when plural binder polymers are used.

Adhesiveness of the photosensitive layer to the image portion, and uniformity of the coating layer are quite important for manipulating the plate in the protective layer of the present invention. A hydrophilic layer made of a water-soluble polymer is liable to be peeled due to insufficient adhesive force when the hydrophilic layer is stacked on a lipophilic photosensitive layer, and the peeled portion causes a defect such as poor hardening of the film by inhibition of polymerization with oxygen. Accordingly, various measures have been proposed for improving adhesiveness between two layers. For example, proposed methods in U.S. Pat. Nos. 292,501 and 44,563 have described that sufficient adhesiveness could be obtained by mixing from 20 to 60% by mass of acrylic emulsion or water-insoluble vinyl ester-vinyl acetate copolymer in the hydrophilic polymer mainly comprising polyvinyl alcohol.

These technologies known in the art may be applied to the protective layer of the present invention in the range not impairing the effect of the present invention.

A coloring agent (water-soluble dye) that is excellent in transmittance of the light (infrared light in the present invention) used for exposure of the photosensitive layer, and can efficiently absorb other light having wavelengths not concerned in exposure may be added to the protective layer according to the present invention. This enables compatibility to be enhanced without decreasing sensitivity.

1-3. Formation of Protective Layer

The protective layer is formed by preparing a dispersion solution in which the solid dispersion dye is dispersed, and by applying a coating solution for the protective layer prepared by blending the dispersion solution and a binder component (or an aqueous solution in which the binder component is dissolved) onto the photosensitive layer. When an oxygen blocking intermediate layer is formed between the photosensitive layer and protective layer, the coating solution for the protective layer is applied on the intermediate layer.

Known additives such as a surfactant for improving applicability and a water-soluble plasticizer for improving the properties of the coating film may be added to the coating solution for the protective layer. Examples of the water-soluble plasticizer include propionamide, cyclohexane diol, glycerin and sorbitol. A water-soluble (meth)acrylic polymer may be also added. The coating solution may further comprise known additives for improving adhesiveness with the photosensitive layer and time-dependent stability of the coating solution.

The coating method for applying the protective layer of the present invention is not particularly restricted, and methods described in U.S. Pat. No. 3,458,311 and JP-A No. 55-49729 may be used.

The coating amount of the protective layer (the amount coating after drying) is preferably from 0.1 to 4.0 g/m$^2$, more preferably from 0.3 to 3.0 g/m$^2$, from the viewpoints of film strength, flaw resistance, maintenance of image quality, and maintaining appropriate oxygen permeability for exhibiting compatibility with the safelight.

1-4. Protective Layer Containing Inorganic Lamellar Compound

In a preferable aspect of the present invention, the protective layer contains a lamellar mineral of inorganic compound (hereinafter, sometimes referred to as "inorganic lamellar compound") in addition to the solid dispersion dye. In a preferable aspect of the present invention, a protective layer containing the solid dispersion dye and inorganic lamellar compound is provided on the photosensitive layer for protecting the photosensitive layer from being mingled with oxygen and moisture in air and low molecular weight compounds such as basic substances that inhibit image-forming reactions, since the photosensitive layer of the present invention is a negative photosensitive layer (to be described hereinafter) and is usually exposed to light in air. The protective layer of this aspect is sometimes referred to as "inorganic lamellar compound-containing protective layer", and will be described in detail hereinafter.

Since the inorganic lamellar compound forms an assembly piled in layers in the vicinity of the surface of the inorganic lamellar compound-containing protective layer, the film strength of the protective layer is improved while the inorganic lamellar compound, per se, exhibits a matting property. Accordingly, the inorganic lamellar compound exhibits an excellent effect that the protective layer is suppressed from adhering to the contiguous back surface of an aluminum support of the planographic printing plate precursor when the planographic printing plate precursors having such protective layer are directly stacked, and scratches on the surface of the protective layer can be suppressed from being generated by contact with the back surface of the support.

Mica compounds are preferably used as the inorganic lamellar compound from the viewpoint of effective inhibition of polymerization.

The mica compound suitable as the inorganic lamellar compound applicable to the inorganic lamellar compound-containing protective layer of the present invention will be described below.

1-4-1. Mica Compound

Examples of the mica compound applicable to the inorganic lamellar compound-containing protective layer include natural mica represented by formula $A(B, C)_2$-$5D_4O)_{10}$ (OH, F, O)$_2$ [where A denotes any one of K, Na and Ca, B and C denotes any one of Fe(II), Fe(III), Mn, Al, Mg and V, and D denote Si or Al], and other groups of mica such as synthetic mica.

Examples of natural mica in the mica group include moscovite, paragonite, phlogopite, biotite and lepidolite. Examples of synthetic mica include non-swellable mica such as fluorine paragonite $KMg_3(AlSi_3O_{10})F_2$, potassium tetrasilicon mica $KMg_{2.5}(Si_4O_{10})F_2$ and swellable mica such as Na tetrasililic mica $NaMg_{2.5}(Si_4O_{10})F_2$, Na or Li teniolite (Na, Li)$Mg_2Li(Si_4O_{10})F_2$, and Na or Li heclite (Na, Li)$_{1/8}$$Mg_{2/5}Li_{1/8}(Si_4O_{10})F_2$ belonging to montmorillonite system. Synthetic smectite is also important.

Fluorine containing swellable mica is useful in the present invention among the above-describe mica compounds. This swellable synthetic mica has a lamellar structure having a unit crystal lattice layer with a thickness from about 10 to 15 Å, and the degree of substitution of metal atoms in the lattice is remarkably larger than in the clay minerals. Consequently, the lattice layer is deficient in positive charges, and cations such as $Na^+$, $Ca^{2+}$ and $Mg^{2+}$ are adsorbed between the layers for compensating deficient charges. The intercalating cations are referred to exchangeable cations, and are able to exchange with various cations. When the intercalating cation is $Li^+$ or $Na^+$, the bond between the lamellar crystal lattices is weak and the lattice is largely swelled with water. The lattice is readily cleaved when a shear force is applied while the crystal is swelled, and the mineral forms stable sol in water. Since swellable synthetic mica has strong tendency to swell, it is useful in the present invention. Therefore, swellable synthetic mica is preferably used in the present invention.

The thinner configuration of the mica compound used in the inorganic lamellar compound-containing protective layer is more favorable for controlling diffusion of light, and the larger planar size is favorable so long as the crystal does not inhibit smoothness of the coating surface and permeability of active light. Accordingly, the aspect ratio is 20 or more, preferably 100 or more, and particularly 200 or more. The aspect ratio is defined as the ratio of the thickness to the length of the major axis, and can be estimated from a projection view on a microscopic photograph. A larger effect may be obtained when the aspect ratio is larger.

The particle of the mica compound used in the present invention preferably has an average major axis length from 0.3 to 20 µm, more preferably from 0.5 to 10 µm, particularly from 1 to 5 µm. The average thickness of the particle is preferably 0.1 µm or less, more preferably 0.05 µm or less, and particularly 0.01 µm or less. Specifically, the swellable synthetic mica as a representative compound has a thickness from 1 to 50 µm and a plane size (major axis length) from about 1 to 20 µm.

The content of the mica compound in the inorganic lamellar compound-containing layer is preferably in the range from 5 to 50% by mass, more preferably in the range from 10 to 40% by mass, with respect to the total solid content in the protective layer. The effect of the present invention can be more evidently manifested due to decrease of oxygen permeability when the content of the mica compound is in the above-mentioned range, while an effect for suppressing the stacked planographic printing plate precursor from adhering to one another as well as an effect for suppressing flaws from being generated may be sufficiently exhibited. Sensitivity also becomes sufficient.

It is preferable that mass ratio of the total amount of the mica compounds is within the above-mentioned range when plural kinds of the mica compounds are used together.

Conventional methods for dispersing the mica compound suitable as the inorganic lamellar compound will be described below. The swellable mica compound (from 5 to 10 parts by mass) as a preferable mica compound is added to 100 parts by mass of water, and is dispersed in a dispersing mill after sufficiently wet with water and swelled. The dispersion mill used herein includes various mills for dispersing by directly applying a mechanical force, a high speed stirring dispersion mill having a large shear force, and a dispersion mill giving high strength ultrasonic energy. Specific examples thereof include ball mill, sand grinder mill, visco mill, colloid mill, homogenizer, dissolver, polytron, homomixer, homoblender, Keddy mill, jet agitator, capillary emulsifier, liquid siren, an electromagnetic distortion ultrasonic wave generator, and an emulsifying device having a Pallmann whistle. The mica compound dispersed by the above-mentioned methods with a concentration from 2 to 15% by mass is a liquid having a high viscosity or a gel, and its storage stability is quite excellent.

For preparing a coating solution for the protective layer using the dispersion solution, it is diluted with water, and is preferably formulated by blending with a binder component such as specific polyvinyl alcohol (or with an aqueous solution dissolving the binder component) after thoroughly stirring.

The inorganic lamellar compound-containing protective layer preferably contains a binder polymer, and polyvinyl alcohol is preferable as the binder polymer. Polyvinyl alcohol capable of being added to the inorganic lamellar compound-containing protective layer will be described below.

1-4-2. Polyvinyl Alcohol

Basic characteristics required for the protective layer provided on a polymerizable negative photosensitive layer such as the planographic printing plate precursor of the present invention are that the protective layer does not substantially inhibit the light used for exposure from permeating, the layer is excellent in adhesivity with the photosensitive layer, and the layer can be readily removed in the development process after the exposure process.

For obtaining the basic characteristics desired for the protective layer, polyvinyl alcohol is preferably used as the binder component in the inorganic lamellar compound-containing protective layer of the present invention. Polyvinyl alcohol used (hereinafter, sometimes referred to as "specific polyvinyl alcohol") preferably has a degree of saponification of 91 mol % or more.

The specific polyvinyl alcohol has excellent film-forming ability, and the protective layer formed by using the specific polyvinyl alcohol is preferable because the layer has a surface having relatively low adhesiveness.

A part of the specific polyvinyl alcohol having the degree of saponification in this range may be substituted with esters, ethers or acetals, so long as it contains non-substituted vinyl alcohol units for giving required oxygen blocking property and low adhesiveness of the surface. Or, a part of polyvinyl alcohol may be modified, or a part of polyvinyl alcohol may contain other polymer components.

Usually, oxygen blocking property is higher as the degree of saponification of PVA is higher (or the content of non-substituted vinyl alcohol units in the protective layer is higher).

Accordingly, the film strength of the protective layer is further improved with higher flaw resistance and oxygen blocking property by using, for example, polyvinyl alcohol with a degree of saponification of 91 mol % or more and above-mentioned mica compound together in the inorganic lamellar compound-containing protective layer.

Such specific polyvinyl alcohol preferably has a degree of polymerization in the range from 200 to 2400. Specific examples thereof include PVA-102, PVA-103, PVA-104, PVA-105, PVA-II0, PVA-117, PVA-120, PVA-124, PVA-117, PVA-135H, PVA-HC, PVA-617, PVA-624, PVA-706, PVA-613, PVA-CS and PVA-CST (trade names: manufactured by Kuraray Co.); GOHSENOL NL-05, NM-11, NM-14, AL-06, P-610, C-500, A-300 and AH-17 (trade names: manufactured by Nippon Synthetic Chemical Industry Co.); and JF-04, JF-05, JF-10, JF-17, JF-17L, JM-05, JM-10, JM-17, JM-17L, JT-05, JT-13 and JT-15 (trade names: manufactured by Japan Vam & Poval Co.).

Carboxyl-modified polyvinyl alcohol modified with itaconic acid and maleic acid, and sulfonic acid-modified polyvinyl alcohol may be also used as the specific polyvinyl alcohol, so long as the degree of saponification is 91 mol % or more.

Examples of acid-modified polyvinyl alcohol favorable as specific polyvinyl alcohol include KL-118, KM-618, KM-118, SK-5102, MP-102 and R-2105 (trade names: manufactured by Kuraray Co.); GOHSENOL CKS-50, T-HS-1, T215, T350, T330 and T-330H (trade names: manufactured by Nippon Synthetic Chemical Industry Co.); and AF-17 and AT-17 (trade names: manufactured by Japan Vam & Poval Co.).

The content of the specific polyvinyl alcohol in the inorganic lamellar compound-containing protective layer is preferably in the range from 45 to 95% by mass, more preferably from 50 to 90% by mass. The content of the specific polyvinyl alcohol in this range permits sufficient film-forming ability and sensitivity to be manifested, while the effect for suppressing the stacked planographic printing plate precursors from adhering to one another may be sufficiently exhibited.

While at least one of the specific polyvinyl alcohol may be used, plural kinds of polyvinyl alcohols may be used together. The total amount of the specific polyvinyl alcohol is preferably within the above-mentioned mass ratio even when plural kinds of polyvinyl alcohols are used.

The components in the inorganic lamellar compound-containing protective layer (inorganic lamellar compound, selection of polyvinyl alcohol and use of additives) and amount of application are selected considering oxygen blocking property, removability by development and flaw resistance.

2. Intermediate Layer Having Oxygen Blocking Property

In a preferable aspect of the photosensitive recording material of the present invention, an intermediate layer for blocking oxygen (hereinafter, sometimes referred to as "oxygen blocking layer") is provided between the protective layer and photosensitive layer to be described hereinafter.

Oxygen permeability through the oxygen blocking layer is preferably from 0.5 to 100 ml/m²·day, more preferably from 0.5 to 30 ml/m² ·day at 25° C. and 60% RH.

Oxygen permeability through the oxygen blocking layer can be controlled by controlling the kinds and contents of the binder polymer and/or other polymers, addition of inorganic lamellar compound, addition of oxygen permeation control agent, adjustment of the thickness of the oxygen blocking layer, or combinations thereof.

Oxygen blocking property through the oxygen blocking layer can be measured by measuring oxygen permeation rate as follows.

An oxygen blocking layer coating solution is applied, as applying on the photosensitive layer, on a photographic paper sheet coated with polyethylene at a thickness of about 20 μm, and the coating layer is dried to prepare a sample for the measurement. Since oxygen permeation rate of the photographic paper sheet is about 700 ml/m²·day·atm under the following measuring condition, the value may be ignored in the measurement of the oxygen permeation rate through the oxygen blocking layer. The oxygen permeation rate through the oxygen blocking layer (ml/m² ·day·atm) is measured at 25° C. and 60% RH using an oxygen permeability meter OX-TRAN2/20 (trade name: manufactured by Mocon Co.).

The oxygen blocking layer preferably contains a binder polymer and an inorganic lamellar compound. Each component contained in the oxygen blocking layer will be described below.

A water-soluble polymer compound may be used as the binder polymer contained in the oxygen blocking layer as in the protective layer. A polyvinyl alcohol is particularly preferable from the viewpoint of block of oxygen.

The same polyvinyl alcohol as used in the protective layer may be used in the oxygen blocking layer. Polyvinyl alcohol having a degree of saponification of 91 mol % or more (hereinafter, sometimes referred to as "specific polyvinyl alcohol") is preferably used.

Examples of suitable polyvinyl alcohol contained in the oxygen blocking layer include such as a carboxyl-modified polyvinyl alcohol modified with itaconic acid or maleic acid, and a polyvinyl alcohol modified with sulfonic acid in the viewpoint of developability. Acid-modified polyvinyl alcohol preferably has a degree of saponification of 91 mol % or more.

Specific examples of acid-modified polyvinyl alcohol favorable as specific polyvinyl alcohol include KL-118, KM-618, KM-118, SK-5102, MP-102 and R-2105 (trade names: manufactured by Kuraray Co.); GOHSENAL CKS-50, T-HS-1, T-215, T-350, T-330 and T330H (trade names: manufactured by Nippon Synthetic Chemical Industry Co.); and AF-17 and AT-17 (trade names: manufactured by Japan Vam & Poval Co.).

The content of the binder polymer in the oxygen blocking layer is preferably in the range from 45 to 95% by mass, more preferably in the range from 50 to 90% by mass, with respect to the total solid content in the oxygen blocking layer. The above-described range permits film forming ability and sensitivity to be more improved.

The oxygen blocking layer preferably contains at least one of the binder polymers, and the total amount of the binder polymer is preferably within the above-mentioned range when the oxygen blocking layer contains plural kinds of the binder polymer.

2-2. Inorganic Lamellar Compound

The oxygen blocking layer of the present invention may contain an inorganic lamellar compound. In a preferable aspect, the oxygen blocking layer contains both polyvinyl alcohol with a degree of saponification of 91 mol % or more and the inorganic lamellar compound.

Oxygen blocking property is further improved in addition to an increase of rigidity of the oxygen blocking layer when the oxygen blocking layer contains the inorganic lamellar compound. Consequently, the oxygen blocking layer can suppress deterioration and incidence of flaws by deformation in addition to having oxygen blocking property.

2-2-1. Mica Compound

Examples of the mica compound applicable to the oxygen blocking layer include mica compounds such as natural mica and synthetic mica represented by formula $A(B,C)_2\text{-}5D_4O_{10}(OH, F, O)_2$ [where A denotes any one of K, Na and Ca, B and C denote any one of Fe(II), Fe(III), Mn, Al, Mg and V, and D denotes Si or Al].

Examples of natural mica in the mica group applicable to the oxygen blocking layer include moscovite, paragonite, phlogopite, biotite and lepidolite. Examples of synthetic mica include non-swellable mica such as fluorine paragonite $KMg_3(AlSi_3O_{10})F_2$, potassium tetrasilicon mica $KMg_{2.5}(Si_4O_{10})F_2$ and swellable mica such as Na tetrasililic mica $NaMg_{2.5}(Si_4O_{10})F_2$, Na or Li teniolite $(Na, Li)Mg_2Li(Si_4O_{10})F_2$, and Na or Li heclite $(Na, Li)_{1/8}Mg_{2/5}Li_{1/8}(Si_4O_{10})F_2$ belonging to montmorillonite system. Synthetic smectite is also important.

Fluorine containing swellable mica is particularly useful for the oxygen blocking layer in the present invention among the above-describe mica compounds. This swellable synthetic mica has a lamellar structure having a unit crystal lattice layer with a thickness from about 1 to 1.5 nm (from 10 to 15 Å), and the degree of substitution of metal atoms in the lattice is remarkably larger than in the clay minerals. Consequently, the lattice layer is deficient in positive charges, and cations such as $Na^+$, $Ca^{2+}$ and $Mg^{2+}$ are adsorbed between the layers for compensating deficient charges. The intercalating cations are referred to exchangeable cations, and are able to exchange with various cations. When the intercalating cation is $Li^+$ or $Na^+$, the bond between the lamellar crystal lattices is weak and the lattice is largely swelled with water. The lattice is readily cleaved when a shear force is applied while the crystal is swelled, and the mineral forms stable sol in water. Since swellable synthetic mica has strong tendency to swell, it is useful in the present invention. Therefore, swellable synthetic mica is preferably used in the present invention.

The thinner configuration of the mica compound used in the inorganic lamellar compound-containing protective layer is more favorable for controlling diffusion of light, and the larger planar size is favorable so long as the crystal does not inhibit smoothness of the coating surface and permeability of active light. Accordingly, the aspect ratio is 20 or more, preferably 100 or more, and particularly 200 or more. The aspect ratio is defined as the ratio of the thickness to the length of the major axis, and can be estimated from a projection view on a microscopic photograph. A larger effect may be obtained when the aspect ratio is larger.

The particle of the mica compound used in the present invention preferably has an average major axis length from 0.3 to 20 μm, more preferably from 0.5 to 10 μm, and particularly from 1 to 5 μm. The average thickness of the mica compound is preferably 0.1 μm or less, more preferably 0.05 μm or less, and particularly 0.01 μm or less. Specifically, the swellable synthetic mica as a representative compound has a thickness from 1 to 50 μm and a plane size (major axis length) from about 1 to 20 μm.

The content of the mica compound in the oxygen blocking layer of the inorganic lamellar compound-containing layer as a favorable example of the mica compound is preferably in the range from 5 to 50% by mass, particularly in the range from 10 to 40% by mass, from the viewpoints of suppression of adhesion of the stacked planographic printing plate precursors, suppression of incidence of flaws, decreased sensitivity by blocking laser light for exposure, and decrease of oxygen permeability. The total amount of the inorganic lamellar compound is preferably within the above-mentioned mass ratio when plural kinds of the inorganic lamellar compounds are used.

2-3. Oxygen Permeability Controlling Agent

One method for controlling oxygen permeability through the oxygen blocking layer is to mix other water-soluble polymers as an oxygen permeability control agent with polyvinyl alcohol suitable as the binder polymer.

Examples of other water-soluble polymers include polyvinyl pyrrolidone, polyethyleneglycol, soluble starch, carboxymethyl cellulose, hydroxyethyl cellulose and ethylene oxide-propylene oxide copolymer. Ethylene oxide-propylene oxide copolymer is favorable among them.

The content of the oxygen permeability controlling agent in the oxygen blocking layer is preferably in the range from 1 to 30% by mass, particularly in the range from 3 to 25% by mass, relative to the total solid fraction in the oxygen blocking layer.

2-4. Formation of Oxygen Blocking Layer

The oxygen blocking layer is formed by applying a coating solution for the oxygen blocking layer containing each component in the oxygen blocking layer on the photosensitive layer to be described below.

Known additives such as a surfactant for improving applicability and a water-soluble plasticizer for improving the property of the coating film may be added to the coating solution for the oxygen blocking layer. Examples of the water-soluble plasticizer include propionamide, cyclohexane diol, glycerin and sorbitol. Water-soluble (meth)acrylic polymers may be added. Known additives may be added to the coating solution for improving adhesiveness of the oxygen blocking layer to a layer provided at the support side and for improving time-dependent stability of the coating solution.

The method for coating the oxygen blocking layer is not particularly restricted, and the methods described in U.S. Pat. No. 3,458,311 or in JP-A No. 55-49729 may be applied.

The coating amount of the oxygen blocking layer is preferably from 0.25 to 1.5 g/m², more preferably from 0.30 to 1.00 g/m², form the viewpoints of film strength, flaw resistance, maintenance of image quality, and maintaining appropriate oxygen permeability for exhibiting compatibility with the safelight.

Since the oxygen blocking layer is provided so that a sufficient oxygen blocking property may be exhibited, the protective layer formed on the oxygen blocking layer is not necessarily required to have an oxygen blocking property.

Accordingly, the protective layer does not necessarily contain the inorganic lamellar compound when the photosensitive planographic printing plate precursor has an oxygen blocking layer.

3. Photosensitive Layer

The photosensitive layer of the present invention is a polymerizable negative photosensitive layer, and contains a polymerization initiator, sensitizing agent and polymerizable compound as essential components. The photosensitive layer preferably contains a binder polymer and optionally a colorant and other arbitrary components.

The photosensitive layer of the present invention is preferably formed as an infrared light reactive layer, for example as a layer sensitive to an infrared laser.

When the photosensitive layer is reactive to the infrared laser, the sensitizing agent (infrared absorbing agent) is turned into an electronically excited state by irradiating with (exposing to) the infrared laser. Electron transfer, energy transfer and heating (photothermal conversion) caused by the electronically excited state stimulate the polymerization initiator in the photosensitive layer, and radicals are generated by inducing a chemical change in the polymerization initiator.

The mechanism for generating the radical include (1) generation of the radical by heat decomposition of the polymerization initiator (for example sulfonium salts) to be described later due to the heat generated by the photothermal conversion function of the infrared absorbing agent, (2) generation of the radical by transfer of electrons caused by the infrared absorbing agent to the polymerization initiator (for example active halogen compounds), and (3) generation of the radical by electron transfer from the polymerization initiator (for example borate compounds) to the excited infrared absorbing agent. The polymerizable compound initiates a polymerization reaction by the radical generated, and the exposed portion is hardened to form an image portion.

The photosensitive planographic printing plate precursor of the present invention is particularly suitable for making a printing plate directly drawn with an infrared laser light having a wavelength region from 750 to 1400 nm since the photosensitive layer contains the sensitizing agent. Accordingly, the planographic printing plate precursor can exhibit higher image forming ability than conventional planographic printing plate precursor. Each component constituting a photosensitive layer of the present invention will be described later.

3-1. Sensitizing Agent

The photosensitive layer of the present invention contains a sensitizing agent for exhibiting energy transfer (electron transfer) function and photothermal conversion function. The sensitizing agent may be appropriately selected depending on a light source for exposing the planographic printing plate prepared.

When the photosensitive layer is formed as a layer reactive to infrared light, the photosensitive layer preferably contains an infrared absorbing agent. The infrared absorbing agent as a favorable sensitizing agent of the present invention will be described in detail below.

3-1-1. Infrared Absorbing Agent

The infrared absorbing agent turns into an electronically excited state with high sensitivity by irradiating (exposing to) the infrared laser light. A chemical change arises in the polymerization initiator with high sensitivity by the action of electron transfer, energy transfer and heat generation (photothermal conversion function) due to the electronically excited state, and radicals are generated with high efficiency.

The infrared absorbing agent used in the present invention is preferably a dye or pigment having an absorption maximum wavelength in the range from 750 to 1400 nm.

The dye available include commercially available dyes, for example those described in literatures such as "Senryou Binran (Handbook of Dyes)", edited by the Society of Synthetic Organic Chemistry, Japan, 1970. Specific examples of the dye include azo dye, metal complex azo dye, pyrazolone azo dye, naphthoquinone dye, anthraquinone dye, phthalocyanine dye, carbonium dye, quinoneimine dye, methine dye, cyanin dye, squalilium dye, pyrylium dye, and dyes of metal thiolate.

Examples of preferable dyes include cyanin dyes described in JP-A Nos. 58-125246, 59-84356 and 60-78787; methine dyes described in JP-A Nos. 58-173696, 58-181690 and 58-194595; naphthoquinone dyes described in JP-A Nos. 58-112793, 58-224793, 59-48187, 59-73996, 60-52940 and 60-63744; squalilium dyes described in JP-A No. 58-112792; and cyanine dyes described in BP No. 434,875.

The near infrared absorbing sensitizing agent described in U.S. Pat. No. 5,156,938 is favorably used. Substituted arylbenzo(thio)pyrylium salts described in U.S. Pat. No. 3,881,924; trimethine thiapyrylium salts described in JP-A No. 57-142645 (U.S. Pat. No. 4,327,169); pyrylium compounds described in JP-A Nos. 58-181051, 58-220143, 59-41363, 59-84248, 59-84249, 59-146063 and 59-146061; cyanin dyes described in JP-A No. 59-216146; pentamethine thiopyrylium salts described in U.S. Pat. No. 4,283,476; and pyrylium compounds described in JP-B Nos. 5-13514 and 5-19702 are also preferably used. Other examples of preferable dyes are near infrared absorbing dyes represented by formulae (I) and (II) in the specification of U.S. Pat. No. 4,756,993.

Other preferable examples of the infrared absorbing pigment of the present invention include specified indolenine cyanine pigments described in JP-A No. 2002-278057 and exemplified below.

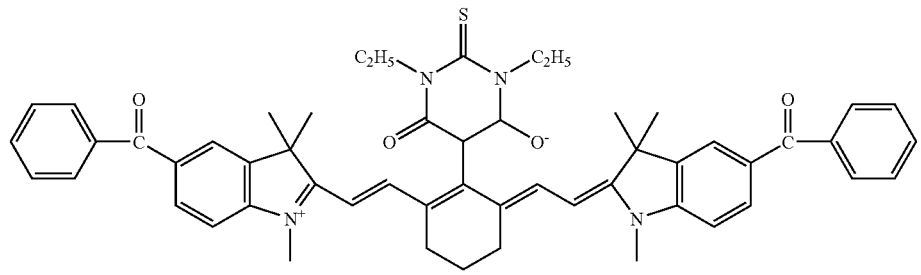

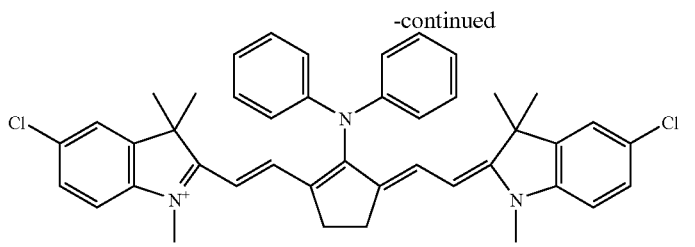

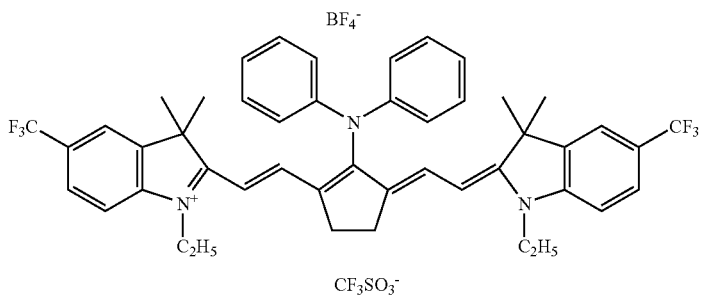

Examples of the particularly preferable dyes include a cyanin dye, a squalilium dye, pyrylium dye, a nickel thiolate complexs and an indolenine cyanin dye. The cyanin dye and the indolenine cyanin dye are more preferable, and the cyanin dye represented by the following formula (a) is particularly preferable.

Formula (a)

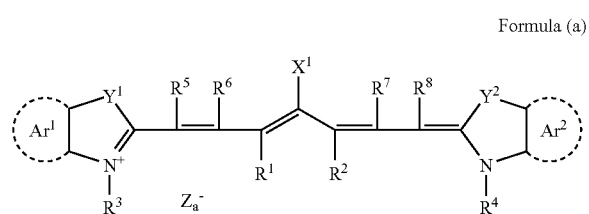

In formula (a), $X^1$ represents a hydrogen atom, a halogen atom, —$NPh_2$, $X^2$-$L^1$ or groups shown below. $X^2$ represents an oxygen atom, a nitrogen atom or a sulfur atom, and $L^1$ represents a hydrocarbon group having 1 to 12 carbon atoms, an aromatic group having a heteroatom or a hydrocarbon group including heteroatoms and having 1 to 12 carbon atoms. The heteroatom used herein denotes N, S, O, halogen atom or Se. $Xa^-$ is defined as $Za^-$ described below, and $R^a$ denotes a substituent selected from hydrogen atom, alkyl groups, aryl groups, substituted or non-substituted amino groups and halogen atoms.

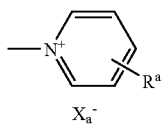

$R^1$ and $R^2$ each independently denotes a hydrocarbon group having 1 to 12 carbon atoms. $R^1$ and $R^2$ are preferably hydrocarbon groups having 2 or more carbon atoms from the viewpoint of storage stability of the coating solution for the photosensitive layer. It is particularly preferable that $R^1$ and $R^2$ are linked together to form a 5- or 6-membered ring.

$Ar^1$ and $Ar^2$ may be the same or different to one another, and represent aromatic hydrocarbon groups that may have substituents. Examples of the preferable aromatic hydrocarbon group include benzene ring and naphthalene ring. Examples of the preferable substituent include hydrocarbon groups having 12 or less carbon atoms, halogen atoms, and alkoxy groups having 12 or less carbon atoms. $Y^1$ and $Y^2$ may be the same or different to one another, and represent a sulfur atom or dialkyl methine group having 12 or less carbon atoms. $R^3$ and $R^4$ may be the same or different to one another, and represents a hydrocarbon group having 20 or less carbon atoms that may be substituted. Examples of the preferable substituent include alkoxy groups having 12 or less carbon atoms, carboxyl group and sulfo group. $R^5$, $R^6$, $R^7$ and $R^8$ may be the same or different to one another, and denote hydrogen atoms or hydrocarbon groups having 12 or less carbon atoms. Hydrogen atom is preferable in terms of availability of starting materials. $Za^-$ represents a counter-anion. However, $Za^-$ is not needed when the cyanin pigment represented by formula (a) has an anionic substituent in its structure and the charge is not required to be neutralized. Preferable $Za^-$ is a halogen ion, perchlorate ion, tetrafluoroborate ion, hexafluorophosphate ion and sulfonate ion, and perchlorate ion, hexafluorophosphate ion and arylsulfonate ion are particularly preferable in terms of storage stability of the coating solution for photosensitive layer.

Specific examples of the favorably used cyanin dye represented by formula (a) include those described in paragraph Nos. (0017) to (0019) in JP-A No. 2001-133969.

Other particularly preferable examples include the specified indolenine cyanin dyes described in JP-A 2000-278057.

Pigments containing no halogen ions as counter-ions are particularly preferable.

Examples of the pigment includes commercially available pigments and those described in the Color Index (C. I.) Handbook, Saishin Ganryo Binran (Latest Dye Handbook) (published in 1977 and compiled by the Japanese Society of Pigment Technology); Saishin Ganryho Oyo Gijyutsu (Latest Pigment Applied Technology) (published in 1986 by CMC Publishing Co., Ltd.); and Insatsu Inki Gijyutsu (Printing Ink Technology) (published in 1984 by CMC Publishing Co., Ltd.).

Examples of the pigments include black pigments, yellow pigments, orange pigments, blown pigments, red pigments, purple pigments, blue pigments, green pigments, fluorescent pigments, metal powder pigments, and other polymer-linked pigments. Specific examples of the pigment available include insoluble azo pigments, azo lake pigments, condensed azo pigments, chelate azo pigments, phthalocyanine pigments, anthraquinone pigments, perylene and perynone pigments, thioindigo pigments, quinacridone pigments, dioxazine pigments, isoindolinone pigments, quinophthalone pigments, blue and white lake pigments, azine pigments, nitroso pigments, natural pigments, fluorescent pigments, inorganic pigments, and carbon black. Carbon black is preferable among them.

These pigments may be used after surface treatment, or without surface treatment. The surface treatment method available includes surface coating with resins or waxes, adhesion of surfactants, and bonding of reactive substances (for example silane coupling agents, epoxy compounds and polyisocyanate) on the surface of the pigment. The surface treatment methods are described in "Properties and Applications of Metal Soaps", Saiwai Shobo Co.; "Printing Ink Technology", CMC Publishing Co., 1984; and "Novel Application Technologies of Pigments", CMC Publishing Co., 1986.

The particle diameter of the pigment is preferably in the range from 0.01 to 10 μm, more preferably in the range from 0.05 to 1 μm, particularly in the range from 0.1 to 1 μm. Dispersion stability of the pigment in the photosensitive layer is excellent when the particle diameter is within the above-mentioned range, and a uniform photosensitive layer is obtained.

Dispersion technologies used for the production of inks and toners may be used for dispersing the pigment. Examples of the dispersing machine include ultrasonic dispersion apparatus, sand mill, attriter, pearl mill, super mill, ball mill, impeller, disperser, KD mill, colloid mill, dynatron, three-roll mill and pressurizing kneader. Details are described in "Novel Application Technologies of Pigments", CMC Publishing Co., 1986.

When these infrared absorbing agents are used in the photosensitive layer of the present invention, the agent may be added to the same layer as the layer containing other components, or may be added to a separately provided layer.

These infrared absorbing agents may be added in a range from 0.01 to 50% by mass, preferably from 0.1 to 10% by mass, or particularly from 0.5 to 10% when the agent is a dye, or particularly from 0.1 to 10% by mass when the agent is a pigment, with respect to the total solid content in the photosensitive layer from the viewpoints of uniformity in the photosensitive layer and durability of the photosensitive layer.

3-2. Polymerization Initiator

The polymerization initiator of the present invention has a function for starting and advancing the hardening reaction of the polymerizable compound to be described below. Any compounds may be used, provided that the compound is able to generate radicals by applying energy, such as a heat decomposable radical generator that generates radicals by being decomposed with heat, an electron transfer radical generator that generates radicals by receiving excited electrons from the infrared absorbing agent, or an electron transfer radical generator that generates radicals by electron transfer to the excited infrared absorbing agent. Examples of the polymerization initiator include onium salts, activated halogen compounds, oxime ester compounds and borate compounds. A plurality of these compounds may be used together. The onium salt is preferable in the present invention, and sulfonium compound is particularly preferable among them.

An example of the sulfonium salt polymerization initiator favorably used in the present invention is an onium salt represented by the following formula (1):

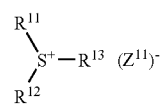

Formula (1)

In the formula (1), $R^{11}$, $R^{12}$ and $R^{13}$ each independently represent a hydrocarbon group having 20 or less carbon atoms, which may have a substituent group. The substituent group is preferably a halogen atom, a nitro group, an alkyl group having 12 or less carbon atoms, an alkoxy group having 12 or less carbon atoms, or an aryloxy group having 12 or less carbon atoms. $(Z^{11})^-$ represents a counter ion selected from the group consisting of a halogen ion, a perchlorate ion, a tetrafluoroborate ion, a hexafluorophosphate ion, a carboxylate ion and a sulfonate ion, preferably a perchlorate ion, a hexafluorophosphate ion, a carboxylate ion and an aryl sulfonate ion.

Hereinafter, examples of the onium salts ([OS-1] to [OS-12]) represented by the formula (1) are mentioned, but the onium salts are not limited thereto.

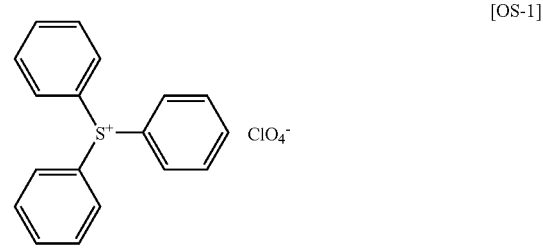

[OS-1]

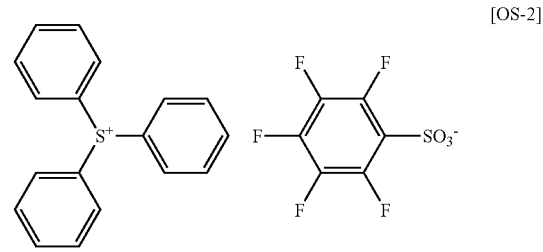

[OS-2]

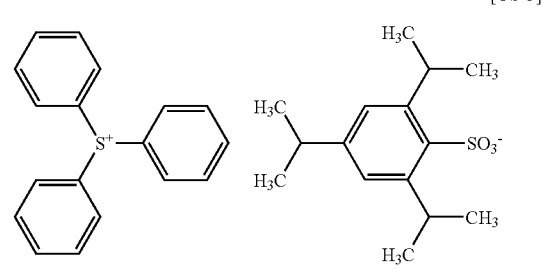

[OS-3]

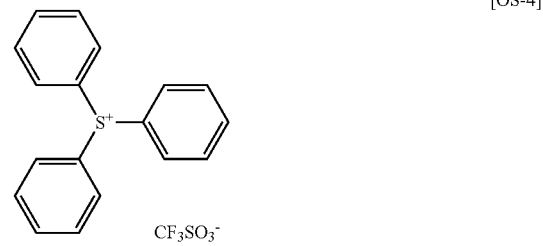

[OS-4]

[OS-5]
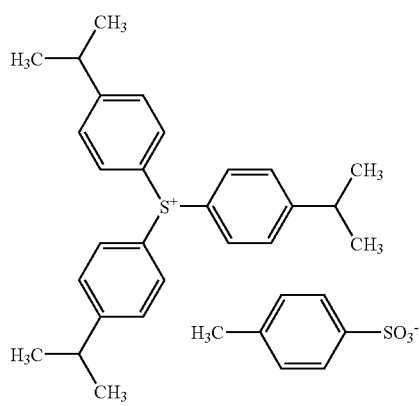

[OS-6]
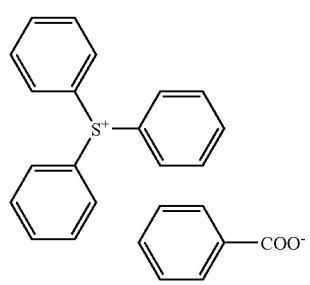

[OS-7]
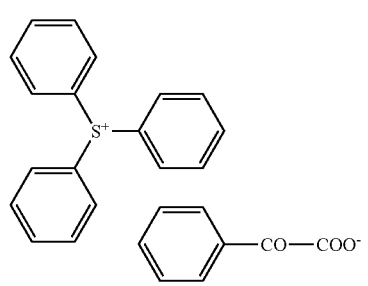

[OS-8]
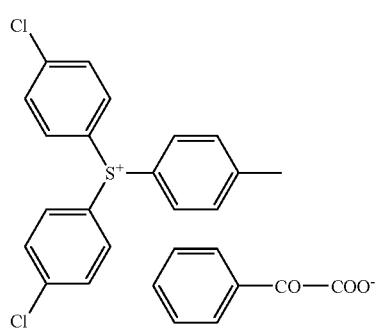

[OS-9]
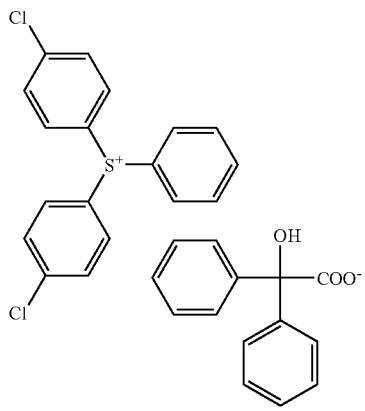

[OS-10]
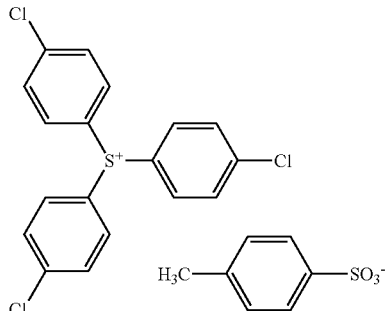

[OS-11]
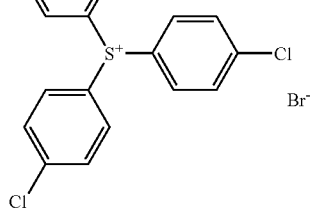

[OS-12]
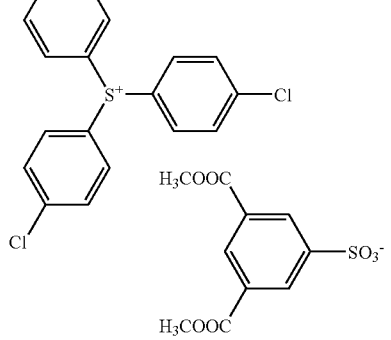

Specific aromatic sulfonium salts described in JP-A Nos. 2002-148790, 2002-148790, 2002-350207 and 2002-6482 may be favorably used in addition to those described above.

Other polymerization initiators (other radical generators) may be used in the present invention other than the above-mentioned sulfonium salt polymerization initiators. Examples of other radical generators include onium salts except sulfonium salts, triazine compounds having trihalomethyl groups, peroxides, azo polymerization initiators, azide compounds, quinone diazide compounds, active halogen compounds, oxime ester compounds and triaryl monoalkyl borates compounds. Onium salts are preferable among them due to their high sensitivity. These polymerization initiators (radical generators) may be used together with the above-mentioned sulfonium salt polymerization initiator as an essential component.

Examples of other onium salts favorably used in the present invention include iodonium salts and diazonium salts. These onium salts function as radical polymerization initiators in the present invention, not as acid generators.

Examples of other onium salts in the present invention are shown by formulae (2) and (3) below:

Ar$^{21}$—I$^+$—Ar$^{22}$(Z$^{21}$)$^-$  Formula (2)

Ar$^{31}$—N$^+$≡N(Z$^{31}$)$^-$  Formula (3)

In the formula (2), Ar$^{21}$ and Ar$^{22}$ each independently represent an aryl group having 20 or less carbon atoms, which may have a substituent group. When this aryl group has a substituent group, the substituent group is preferably a halogen atom, a nitro group, an alkyl group having 12 or less carbon atoms, an alkoxy group having 12 or less carbon atoms, or an aryloxy group having 12 or less carbon atoms. (Z$^{21}$)$^-$ represents a counter ion having the same meaning as defined for (Z$^{11}$)$^-$.

In the formula (3), Ar$^{31}$ represents an aryl group having 20 or less carbon atoms, which may have a substituent group. The substituent group is preferably a halogen atom, a nitro group, an alkyl group having 12 or less carbon atoms, an alkoxy group having 12 or less carbon atoms or an aryloxy group having 12 or less carbon atoms, an alkylamino group having 12 or less carbon atoms, a dialkylamino group having 12 carbon atoms, an arylamino group having 12 or less carbon atoms, or a diarylamino group having 12 or less carbon atoms. (Z$^{31}$)$^-$ represents a counter ion having the same meaning as defined for (Z$^{11}$)$^-$.

Preferable examples of the iodonium salts ([OI-1] to [OI-10]) represented by the formula (2) and the diazonium salts ([ON-1] to [ON-5]) represented by the formula (3) are mentioned below, but the onium salts are not limited thereto.

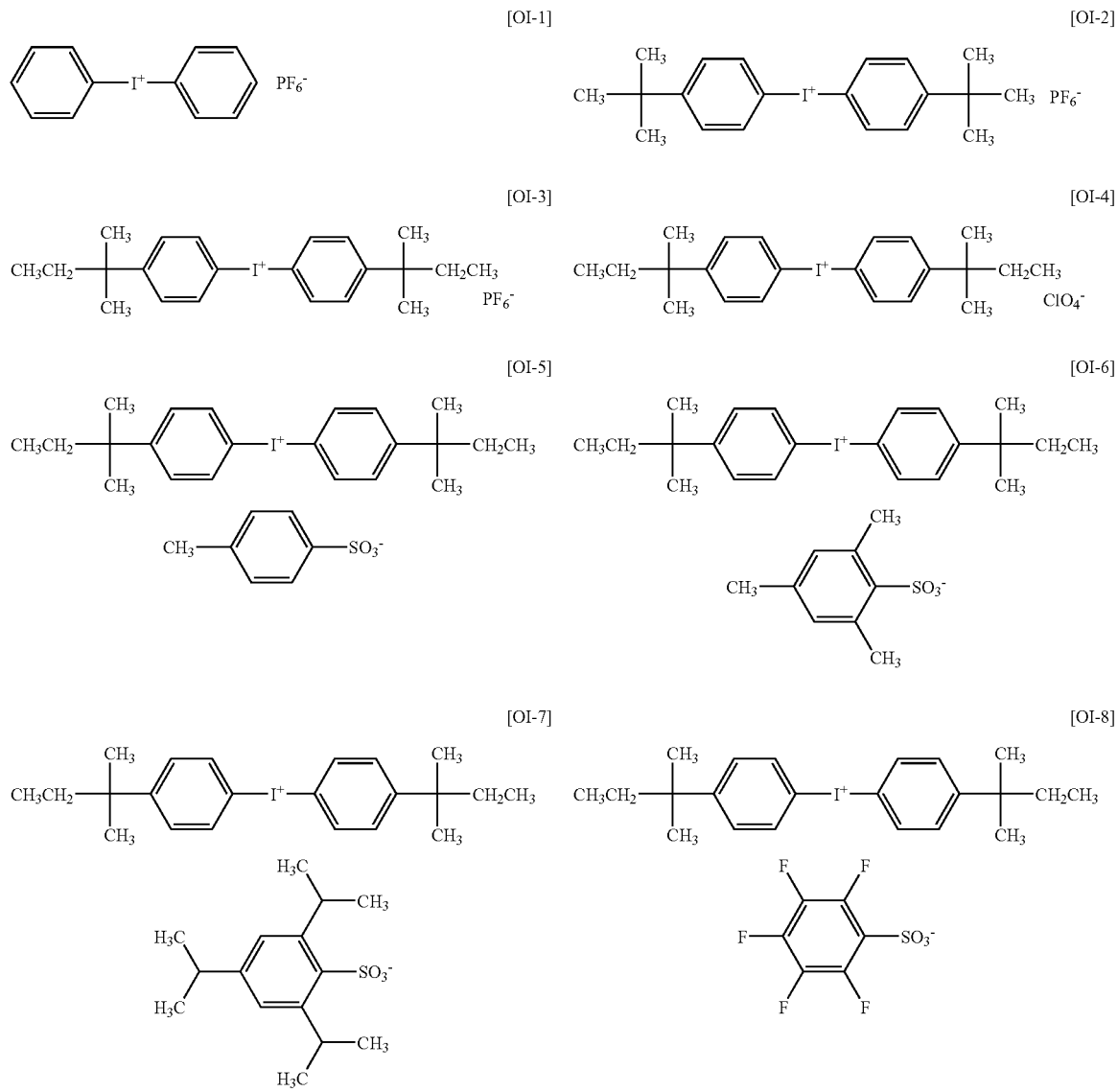

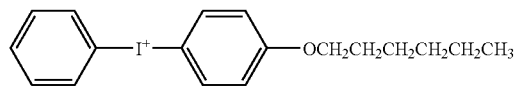

[OI-9]

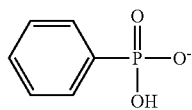

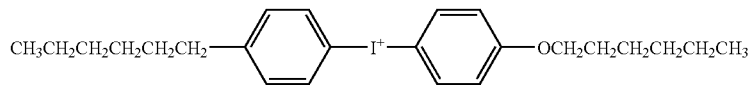

[OI-10]

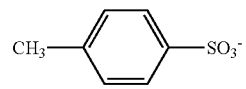

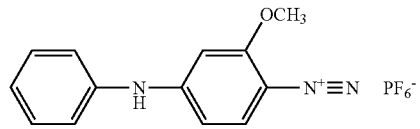

[ON-1]

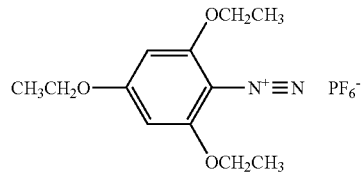

[ON-2]

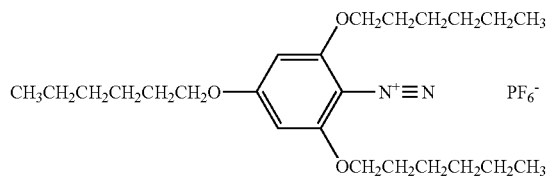

[ON-3]

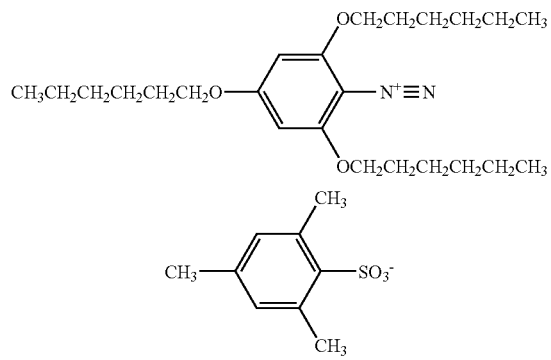

[ON-4]

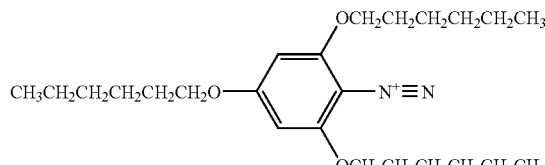

[ON-5]

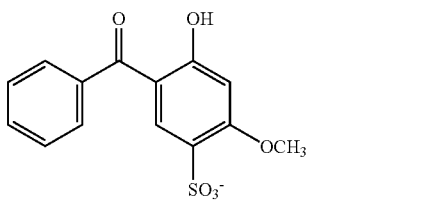

Specific examples of the onium salts preferably used as the polymerization initiator (radical generator) in the present invention include those described in JP-A No. 2001-133696.

The polymerization initiator (radical generator) used in the present invention preferably has an absorption maximum wavelength of 400 nm or less, more preferably 360 nm or less. Restricting the absorption wavelength in the UV region permits the planographic printing plate precursor to be manipulated under white light.

From the viewpoint of sensitivity and the generation of smudging in a non-image portion at the time of printing, the total content of the polymerization initiator in the present invention is 0.1 to 50% by mass, and preferably 0.5 to 30% by mass, more preferably 1 to 20% by mass, with respect to the total solid content in the photosensitive layer.

Only one of the polymerization initiators may be used in the present invention or a plurality of them may be used together. Plural sulfonium salt polymerization initiators that are favorably used may be used, or the sulfonium salt polymerization initiator may be used together with other polymerization initiators when a plurality of polymerization initiators is used.

When the sulfonium salt polymerization initiator is used together with other polymerization initiators, the proportion (mass ratio) is preferably from 100/1 to 100/50, more preferably from 100/5 to 100/25.

The polymerization initiator may be added to the same layer as the layer containing other components, or may be added to a separately provided layer.

The radical polymerization reaction can be effectively proceeded and the image portion is highly strengthened by adding a highly sensitive sulfonium salt polymerization initiator that is preferable as the polymerization initiator to the photosensitive layer of the present invention. Accordingly, a planographic printing plate having a high strength of the image portion can be formed in combination with high oxygen blocking property of the protective layer to be described below to consequently enhance print durability. Since the sulfonium salt polymerization initiator, per se, is excellent in time-dependent stability, it is an advantage of using the sulfonium salt polymerization initiator that undesired polymerization reactions may be suppressed from occurring when the prepared planographic printing plate precursor is preserved.

3-3. Polymerizable Compound

The polymerizable compound used in the present invention is an addition polymerizable compound having at least one ethylenically unsaturated double bond, and is selected from compounds having at least one, preferably a plurality of, ethylenically unsaturated double bond. Such group of compounds is widely known in the art, and these compounds may be used in the present invention without any restrictions. These compounds have chemical configurations such as monomers or prepolymers, or dimers, trimers or oligomers, or mixtures thereof and copolymers thereof. Examples of the monomer and copolymer thereof include unsaturated carboxylic acids (for example acrylic acid, methacrylic acid, itaconic acid, crotonic acid, isocrotonic acid and maleic acid) and esters thereof and amides thereof. Esters of unsaturated carboxylic acid and aliphatic polyfunctional alcohols, and amides of unsaturated carboxylic acid and aliphatic polyfunctional mines are used. Addition reaction products of unsaturated carboxylic acid esters or amides having nucleophilic substituents such as hydroxyl group, amino group and mercapto group with monofunctional or polyfunctional isocyanate or epoxy compounds or dehydration condensation products with monofunctional or polyfunctional carboxylic acids may be favorably used. Addition reaction products of unsaturated carboxylic acid esters or amides having electrophilic substituents such as isocyanate group and epoxy group with monofunctional or polyfunctional alcohols, amines or thiols, and substitution reaction products of unsaturated carboxylic acid esters or amides having eliminating substituents such as halogen group and tosyloxy group with monofunctional or polyfunctional alcohols, amines and thiols are also favorable. In other examples, a group of compounds in which unsaturated carboxylic acids are replaced with unsaturated phosphonic acid, styrene or vinyl ether may be used.

Specific examples of monomers of the ester between the aliphatic polyfunctional alcoholic compound and unsaturated carboxylic acid include, as acrylic acid esters, ethyleneglycol diacrylate, triethyleneglycol diacrylate, 1,3-butanediol diacrylate, tetramethyleneglycol diacrylate, propyleneglycol diacrylate, neopentylglycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethyleneglycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanulate, and polyester acrylate oligomer.

Examples of methacrylic acid ester include tetramethyleneglycon methacrylate, triethyleneglycol dimethacrylate, neopentylglycol dimethacrylate, trimethylolpropane trimethacrylate, trimethylolethane trimethacrylate, ethyleneglycol dimethacrylate, 1,3-buranediol dimethacrylate, hexanediol dimethacrylate, pentaerythritol dimethacrylate, pentaerythritol trimethacrylate, pentaerythritol tetramethacrylate, pentaerythritol pentamethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, and bis[p-(methacdyloxyethoxy)phenyl]dimethylmethane.

Examples of itaconic acid ester include ethyleneglycol diitaconate, propyleneglycol diitaconate, 1,3-butanediol diitaconate, 1,4-butanediol diitaconate, tetramethyleneglycol diitaconate, pentaerythritol diitaconate, and sorbitol tetraitaconate.

Examples of crotonic acid ester include ethyleneglycol dicrotonate, tertamethyleneglycol dicrotonate, pentaerythritol dicrotonate, and sorbitol tetracrotonate.

Examples of isocrotonic acid ester include ethyleneglycol diisocrotonate, pentaerythritol diisocrotonate, and sorbitol tetraisocrotonate.

Examples of maleic acid ester include ethyleneglycol dimaleate, triethyleneglycol dimaleate, pentaerythritol dimaleate and sorbitol tetramaleate.

Examples of other favorably used esters include aliphatic alcohol esters described in JP-B Nos. 46-27926 and 51-47334, and JP-A No. 57-196231; those having aromatic frames described in JP-A Nos. 59-5240, 59-5241 and 2-226149; and those containing amino group described in JP-A No. 1-165613. The above-mentioned ester monomers may be used as mixtures.

Specific examples of amide monomers between aliphatic polyfunctional amine compounds and unsaturated carboxylic acids include methylenebis-acrylamide, methylenebis-methacrylamide, 1,6-hexamethylenebis-acrylamide, 1,6-hexamethylenebis-methacrylamide, diethylenetriamine trisacrylamide, xylylene bisacrylamide, and xylylene bismethacrylamide. Examples of other preferable amide monomers include those having a cyclohexylene structure described in JP-B No. 54-21726.

Urethane addition polymerizable compounds produced by using addition reactions of isocyanate with hydroxyl group are also favorable, and examples thereof include vinylurethane compounds having plural polymerizable vinyl groups in the molecule prepared by adding vinyl monomers having hydroxyl groups as shown in the formula below to polyisocyanate compounds having plural isocyanate groups in the molecule as described in JP-B No. 48-41708;

$$CH_2=C(R^a)COOCH_2CH(R^b)OH \qquad \text{formula (b)}$$

In the formula, $R^a$ and $R^b$ denote H or $CH_3$.

Urethane acrylates described in JP-A No. 51-37193 and JP-B Nos. 2-32293 and 2-16765, and urethane compounds having ethyleneoxide frames described in JP-B Nos. 58-49860, 56-17654, 62-39417 and 62-39418 are also favorable. Photopolymerizable compositions quite excellent in photosensitizing speed can be obtained by using addition polymerizable compounds having amino structures and sulfide structures in the molecule as described in JP-A Nos. 63-277653, 63-260909 and 1-105238.

Other examples include polyfunctional acrylates and methacrylates such as polyester acrylates and epoxy acrylates obtained by allowing epoxy resins to react with (meth)acrylic acid as described in JP-A No. 48-64183 and JP-B Nos. 49-43191 and 52-30490. Further examples include specified unsaturated compounds described in JP-B No. 46-43946, 1-40337 and 1-40336, and vinylsulfonic acid compounds described in JP-A No. 2-25493. Structures having perifluoroalkyl group as described in JP-A No. 61-22048 may be favorably used in some cases. Compounds described as light curable monomers and oligomers in Journal of the Adhesion Society of Japan, Vol. 20, No. 7, p 300-308 (1984) may be also used.

Details of methods of use of these addition polymerizable compounds such as structures, uses of one compound alone or concomitant uses, and the amount of addition may be arbitrarily determined in accordance with final design of performance. For example, the compounds are selected from the following points of view. A structure having a larger amount of unsaturated groups per one molecule is preferable with respect to photosensitizing speed, and bifunctional or more of groups are preferable in many cases. Trifunctional or more of compounds are favorable for enhancing the strength of the image portion or hardened film, and methods for controlling both photosensitivity and strength by using compounds having different numbers of functional groups and different polymerizable groups (for example, acrylic acid ester, methacrylic acid ester, styrene compounds and vinylether compounds) together are also effective. While compounds having a large molecular weight or high hydrophobicity are excellent in photosensitizing speed and film strength, they may be not preferable with respect to the speed of development and precipitation in the developer. Selection of the addition polymerizable compounds and the method of use thereof are crucial factors for compatibility with other components (for example binder polymer, initiator and colorant) in the composition of the photosensitive layer and dispersibility. For example, compatibility may be improved by using low purity compounds or plural compounds together.

A specified structure may be selected in the planographic printing plate precursor for improving adhesiveness of the photosensitive layer to the support or protective layer.

With respect to the content of the addition polymerizable compound in the composition of the photosensitive layer, the addition polymerizable compound is preferably used in the range from 5 to 80% by mass, more preferably in the range from 40 to 75% by mass, relative to the solid fraction in the composition of the photosensitive layer, from the viewpoints of sensitivity, occurrence of phase separation and adhesiveness of the photosensitive layer as well as precipitation from the developer.

One of these compounds may be used alone, or a plurality of them may be used together. Other methods for using the addition polymerization compound such as proper structures, the amount of blending and the amount of addition may be arbitrarily selected in terms of the extent of polymerization inhibition by oxygen, resolution, fogging, changes of refractive index and surface adhesiveness. Layer structures and coating methods such as overcoat and undercoat may be employed for the planographic printing plate precursor of the present invention.

3-4. Binder Polymer

While the binder polymer used in the present invention is added for improving the property of the film, various polymers may be used so long as the polymer exhibits a function of improving the property of the film. A binder polymer having the repeating unit represented by the following formula (i) is suitable as the binder polymer of the present invention.

3-4-1. Binder Polymer Having the Repeating Unit Represented by Formula (I)

The binder polymer having the repeating unit represented by formula (i) is appropriately referred to a specified binder polymer, which will be described in detail.

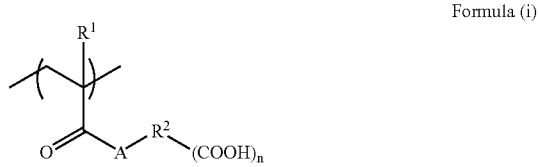

Formula (i)

In the formula (i), $R^1$ represents a hydrogen atom or a methyl group; $R^2$ represents a linking group containing two or more atoms selected from the group consisting of a carbon atom, a hydrogen atom, an oxygen atom, a nitrogen atom and a sulfur atom, and the total number of atoms in $R^2$ is 2 to 82; A represents an oxygen atom or —$NR^3$— in which $R^3$ represents a hydrogen atom or a monovalent hydrocarbon group having 1 to 10 carbon atoms; and n is an integer from 1 to 5.

$R^1$ in the formula (i) represents a hydrogen atom or a methyl group, preferably a methyl group.

The linking group represented by $R^2$ in the formula (i) is a linking group containing two or more atoms selected from the group consisting of a carbon atom, a hydrogen atom, an oxygen atom, a nitrogen atom and a sulfur atom, and the total number of atoms in $R^2$ is 2 to 82, preferably 2 to 50, and more preferably 2 to 30. The total number of atoms refers to the number of atoms including atoms in a substituent group, if any, on the linking group. Specifically, the number of carbon atoms in the main skeleton of the linking group represented by $R^2$ is preferably 1 to 30, more preferably 3 to 25, still more preferably 4 to 20, and most preferably 5 to 10. The "main skeleton of the linking group" in the present invention refers to an atom or an atomic group used in linking A to the terminal COOH in the formula (i), and when a plurality of linkages are present, the main skeleton refers to an atom or an atomic group constituting a linkage having the smallest number of atoms. Accordingly, when the linking group has a cyclic structure, its linking sites (for example, o-, m-, p-, etc.) are different in the number of atoms to be introduced into them.

Specific examples of the linking group represented by $R^2$ include an alkylene group, a substituted alkylene group, an arylene group and a substituted arylene group, and these divalent groups may be in a chain structure bound to one another via amide or ester linkages.

Linking groups in the chain structure include ethylene, propylene, etc. A structure comprising these alkylene groups bound to one another via ester linkages is also preferable.

The linking group represented by $R^2$ in formula (i) is preferably a (n+1)-valent hydrocarbon group having an alicyclic structure having 3 to 30 carbon atoms. Examples thereof include (n+1)-valent hydrocarbon groups obtained by removing (n+1) hydrogen atoms on arbitrary carbon atoms constituting compounds having an alicyclic structure, such as cyclopropane, cyclopentane, cyclohexane, cycloheptane, cyclooctane, cyclodecane, dicyclohexyl, tertiary cyclohexyl and norbornane which may be substituted with one or more arbitrary substituent groups. $R^2$ is preferably the one containing 3 to 30 carbon atoms including carbon atoms in a substituent group if any.

The arbitrary carbon atoms in a compound constituting an alicyclic structure may be substituted with one or more heteroatoms selected from the group consisting of a nitrogen atom, an oxygen atom and a sulfur atom. In terms of printing durability, $R^2$ is preferably a (n+1)-valent hydrocarbon group having an alicyclic structure which may have a substituent group having 5 to 30 carbon atoms comprising two or more rings, such as a condensed polycyclic aliphatic hydrocarbon, a crosslinked alicyclic hydrocarbon, spiroaliphatic hydrocarbon, and combined aliphatic hydrocarbon rings (plural rings combined directly or via linking groups). The number of carbon atoms refers to the number of carbon atoms including carbon atoms in a substituent group, if any.

The linking group represented by $R^2$ is preferably a group containing 5 to 10 atoms constituting a main structure of the linking group, having a cyclic structure containing an ester linkage or the cyclic structure described above.

A substituent group which can be introduced into the linking group represented by $R^2$ includes a monovalent non-metal atomic group excluding hydrogen, and examples thereof include a halogen atom (—F, —Br, —Cl, —I), hydroxyl group, alkoxy group, aryloxy group, mercapto group, alkyl thio group, aryl thio group, alkyl dithio group, aryl dithio group, amino group, N-alkyl amino group, N,N-dialkyl amino group, N-aryl amino group, N,N-diaryl amino group, N-alkyl-N-aryl amino group, acyloxy group, carbamoyloxy group, N-alkylcarbamoyloxy group, N-aryl carbamoyloxy group, N,N-dialkyl carbamoyloxy group, N,N-diaryl carbamoyloxy group, N-alkyl-N-aryl carbamoyloxy group, alkyl sulfoxy group, aryl sulfoxy group, acyl thio group, acyl amino group, N-alkyl acyl amino group, N-aryl acyl amino group, ureido group, N'-alkyl ureido group, N',N'-dialkyl ureido group, N'-aryl ureido group, N',N'-diaryl ureido group, N'-alkyl-N'-aryl ureido group, N-alkyl ureido group, N-aryl ureido group, N'-alkyl-N-alkyl ureido group, N'-alkyl-N-aryl ureido group, N',N'-dialkyl-N-alkyl ureido group, N',N'-dialkyl-N-aryl ureido group, N'-aryl-N-alkyl ureido group, N'-aryl-N-aryl ureido group, N',N'-diaryl-N-alkyl ureido group, N',N'-diaryl-N-aryl ureido group, N'-alkyl-N'-aryl-N-alkyl ureido group, N'-alkyl-N'-aryl-N-aryl ureido group, alkoxy carbonyl amino group, aryloxy carbonyl amino group, N-alkyl-N-alkoxycarbonyl amino group, N-alkyl-N-aryloxy carbonyl amino group, N-aryl-N-alkoxycarbonyl amino group, N-aryl-N-aryloxycarbonyl amino group, formyl group, acyl group, carboxyl group and its conjugated basic group, alkoxy carbonyl group, aryloxy carbonyl group, carbamoyl group, N-alkyl carbamoyl group, N,N-dialkyl carbamoyl group, N-aryl carbamoyl group, N,N-diaryl carbamoyl group, N-alkyl-N-aryl carbamoyl group, alkyl sulfinyl group, aryl sulfinyl group, alkyl sulfonyl group, aryl sulfonyl group, sulfo group (—SO$_3$H) and its conjugated basic group, alkoxy sulfonyl group, aryloxy sulfonyl group, sulfinamoyl group, N-alkyl sulfinamoyl group, N,N-dialkyl sulfinamoyl group, N-aryl sulfinamoyl group, N,N-diaryl sulfinamoyl group, N-alkyl-N-aryl sulfinamoyl group, sulfamoyl group, N-alkyl sulfamoyl group, N,N-dialkyl sulfamoyl group, N-aryl sulfamoyl group, N,N-diaryl sulfamoyl group, N-alkyl-N-aryl sulfamoyl group, N-acyl sulfamoyl group and its conjugated basic group, N-alkyl sulfonyl sulfamoyl group (—SO$_2$NHSO$_2$ (alkyl)) and its conjugated basic group, N-aryl sulfonyl sulfamoyl group (—SO$_2$NHSO$_2$(aryl)) and its conjugated basic group, N-alkyl sulfonyl carbamoyl group (—CONHSO$_2$(alkyl)) and its conjugated basic group, N-aryl sulfonyl carbamoyl group (—CONHSO$_2$(aryl)) and its conjugated basic group, alkoxy silyl group (—Si(O-alkyl)$_3$), aryloxy silyl group (—Si(O-aryl)$_3$), hydroxylyl group (—Si (OH)$_3$) and its conjugated basic group, pohsphono group (—PO$_3$H$_2$) and its conjugated basic group, dialkyl phosphono group (—PO$_3$(alkyl)$_2$), diaryl phosphono group (—PO$_3$(aryl)$_2$), alkyl aryl phosphono group (—PO$_3$(alkyl) (aryl)), monoalkyl phosphono group (—PO$_3$H(alkyl)) and its conjugated basic group, monoaryl phosphono group (—PO$_3$H(aryl)) and its conjugated basic group, phosphonoxy group (—OPO$_3$H$_2$) and its conjugated basic group, dialkyl phosphonoxy group (—OPO$_3$(alkyl)$_2$), diaryl phosphonoxy group (—OPO$_3$(aryl)$_2$), alkyl aryl phosphonoxy group (—OPO$_3$(alkyl)(aryl)), monoalkyl phosphonoxy group (—OPO$_3$H(alkyl)) and its conjugated basic group, monoaryl phosphonoxy group (—OPO$_3$H(aryl)) and its conjugated basic group, cyano group, nitro group, dialkyl boryl group (—B(alkyl)$_2$), diaryl boryl group (—B(aryl)$_2$), alkyl aryl boryl group (—B(alkyl)(aryl)), dihydroxy boryl group (—B (OH)$_2$) and its conjugated basic group, alkyl hydroxy boryl group (—B(alkyl)(OH)) and its conjugated basic group, aryl hydroxy boryl group (—B(aryl)(OH)) and its conjugated basic group, aryl group, alkenyl group and alkynyl group.

In the photosensitive composition of the present invention, although it depends on the design of the photosensitive layer, a substituent group having a hydrogen atom capable of hydrogen bonding, particularly a substituent group having acidity whose acid dissociation constant (pKa) is lower than that of carboxylic acid, is not preferable because it tends to deteriorate printing durability. On the other hand, a hydrophobic substituent group such as a halogen atom, a hydrocarbon group (alkyl group, aryl group, alkenyl group, alkynyl group), an alkoxy group and an aryloxy group is preferable because it tends to improve printing durability, and particularly when the cyclic structure is a 6- or less memberred monocyclic aliphatic hydrocarbon such as cyclopentane or cyclohexane, the hydrocarbon preferably has such hydrophobic substituent groups. If possible, these substituent groups may be bound to one another or to a substituted hydrocarbon group to form a ring, and the substituent groups may further be substituted.

When A in formula (i) is NR$^3$—, R$^3$ represents a hydrogen atom or a monovalent hydrocarbon group having 1 to 10 carbon atoms. The monovalent hydrocarbon group having 1 to 10 carbon atoms represented by R$^3$ includes an alkyl group, aryl group, alkenyl group and alkynyl group.

Examples of the alkyl group include a linear, branched or cyclic alkyl group having 1 to 10 carbon atoms such as a methyl group, ethyl group, propyl group, butyl group, pentyl group, hexyl group, heptyl group, octyl group, nonyl group, decyl group, isopropyl group, isobutyl group, sec-butyl group, tert-butyl group, isopentyl group, neopentyl group, 1-methylbutyl group, isohexyl group, 2-ethylhexyl group, 2-methylhexyl group, cyclopentyl group, cyclohexyl group, 1-adamanthyl group and 2-norbornyl group.

Examples of the aryl group include an aryl group having 6 to 10 carbon atoms such as a phenyl group, naphthyl group and indenyl group, and a heteroaryl group having 5 to 10 carbon atoms containing one heteroatom selected from the group consisting of a nitrogen atom, an oxygen atom and a sulfur atom, for example a furyl group, thienyl group, pyrrolyl group, pyridyl group and quinolyl group.

Examples of the alkenyl group include a linear, branched or cyclic alkenyl group having 2 to 10 carbon atoms such as a vinyl group, 1-propenyl group, 1-butenyl group, 1-methyl-1-propenyl group, 1-cyclopentenyl group and 1-cyclohexenyl group.

Examples of the alkynyl group include an alkynyl group having 2 to 10 carbon atoms such as an ethynyl group, 1-propynyl group, 1-butynyl group and 1-octynyl group. Substituent groups which may be possessed by $R^3$ include the same substituent groups as those capable of being introduced into $R^2$. The number of carbon atoms in $R^3$, including the number of carbon atoms in its substituent group, is 1 to 10.

A in the formula (i) is preferably an oxygen atom or —NH— because of easy synthesis.

n in the formula (i) is an integer from 1 to 5, preferably 1 in view of printing durability.

Preferable examples of the repeating unit represented by the formula (i) in the specific binder polymer are shown below, but the present invention is not limited thereto.

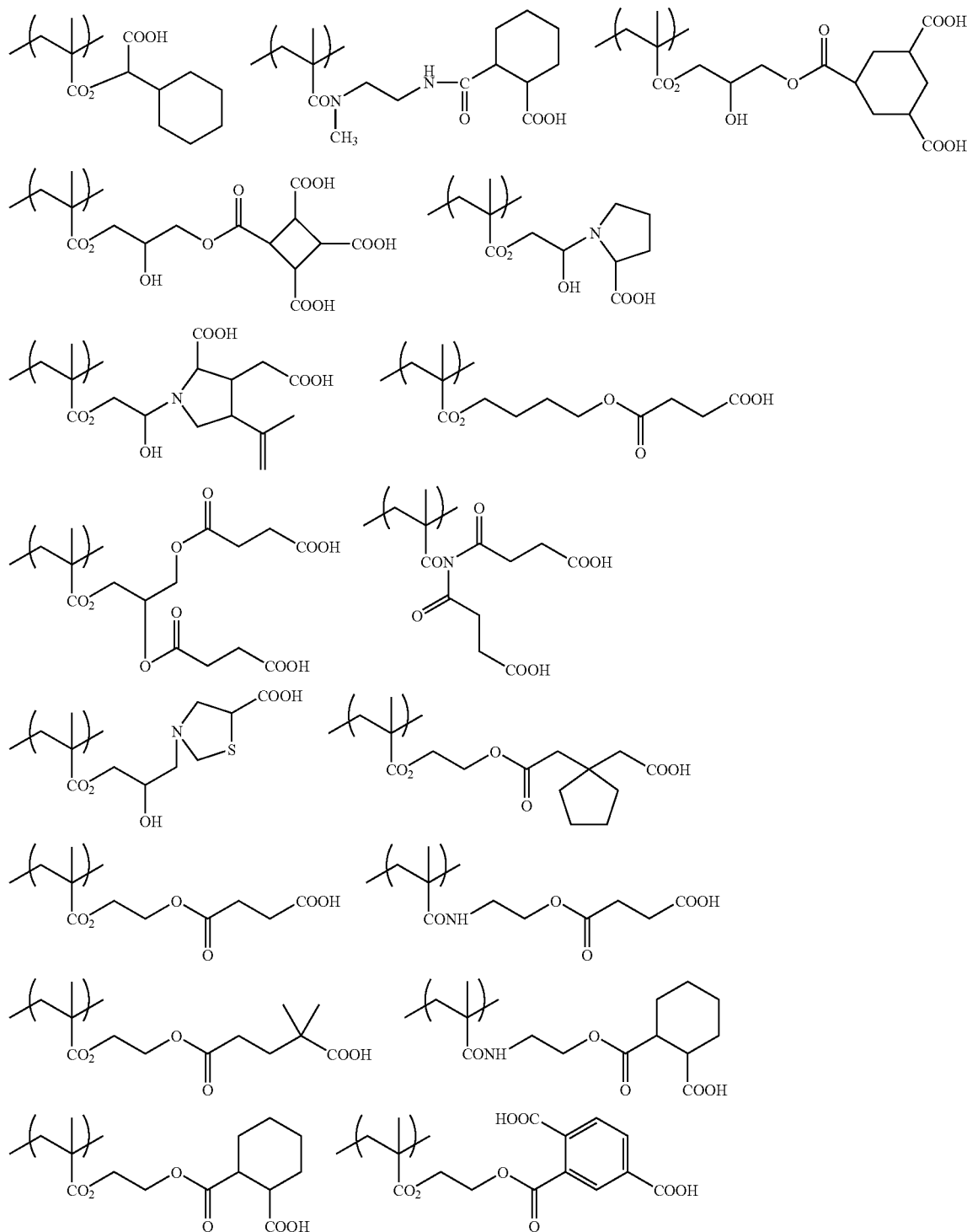

-continued
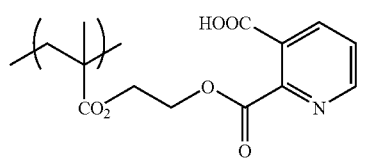 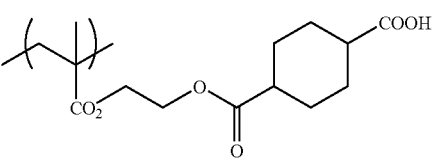
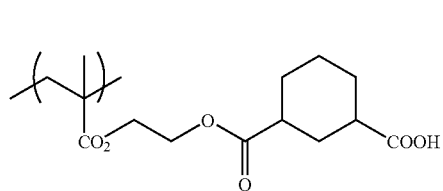 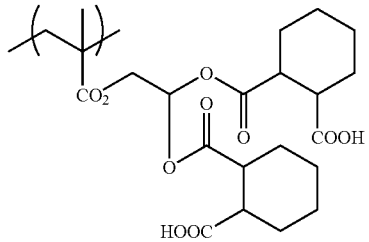
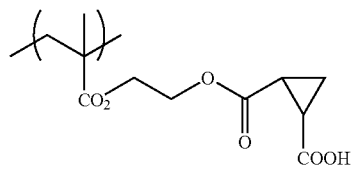 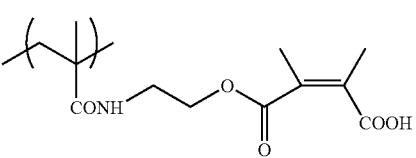
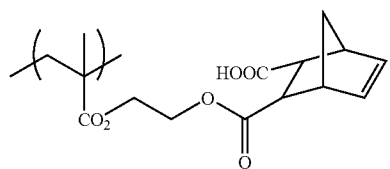 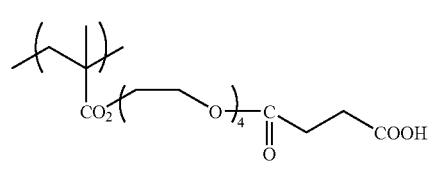
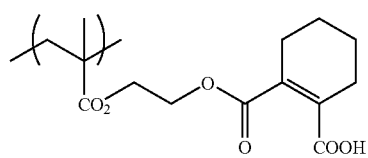 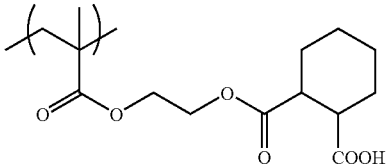
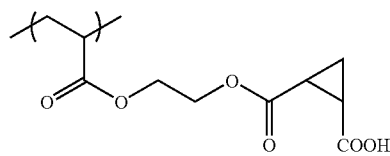 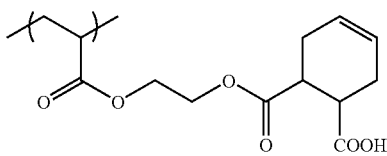
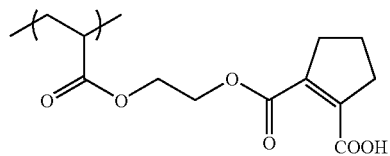 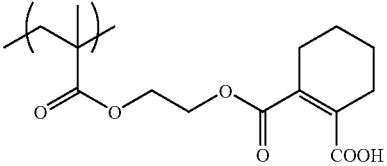
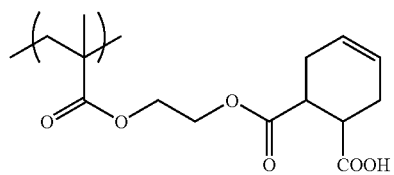 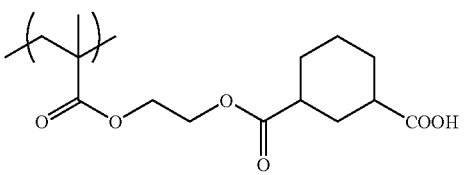
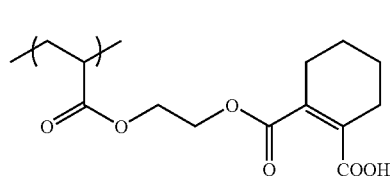 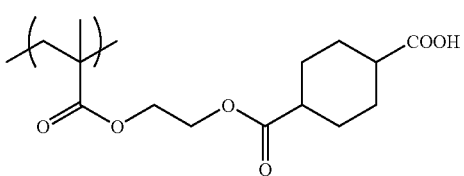

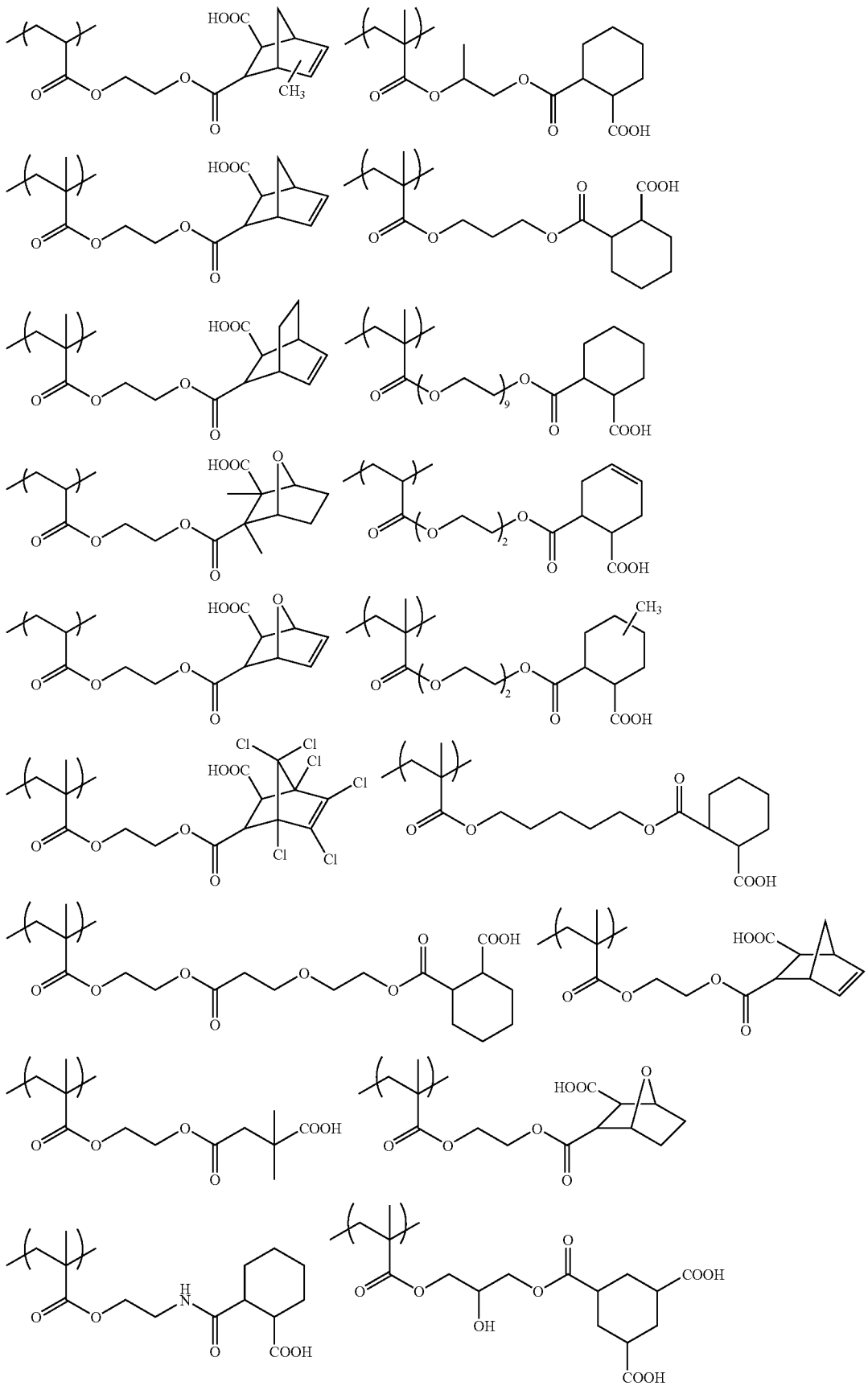

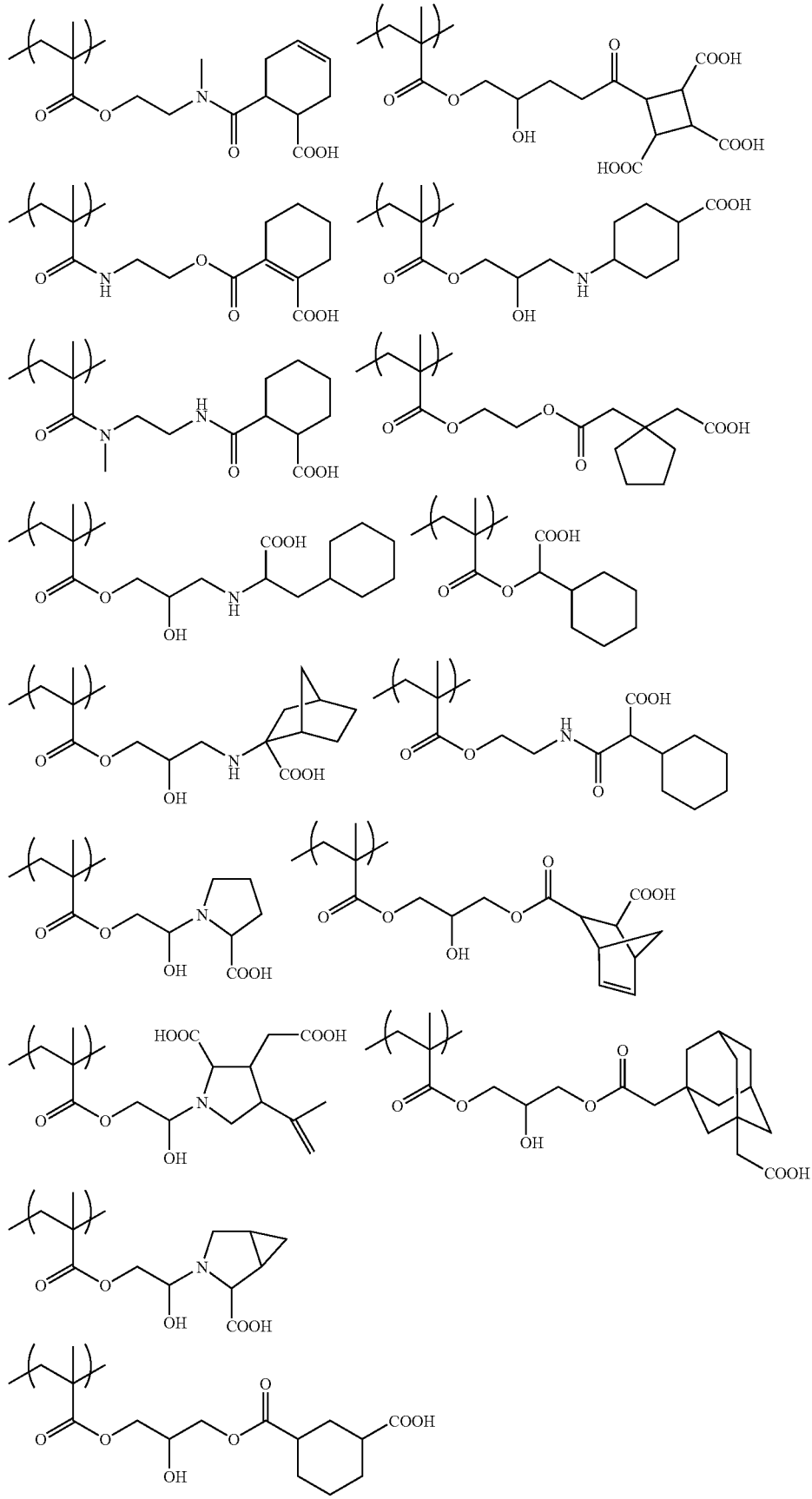

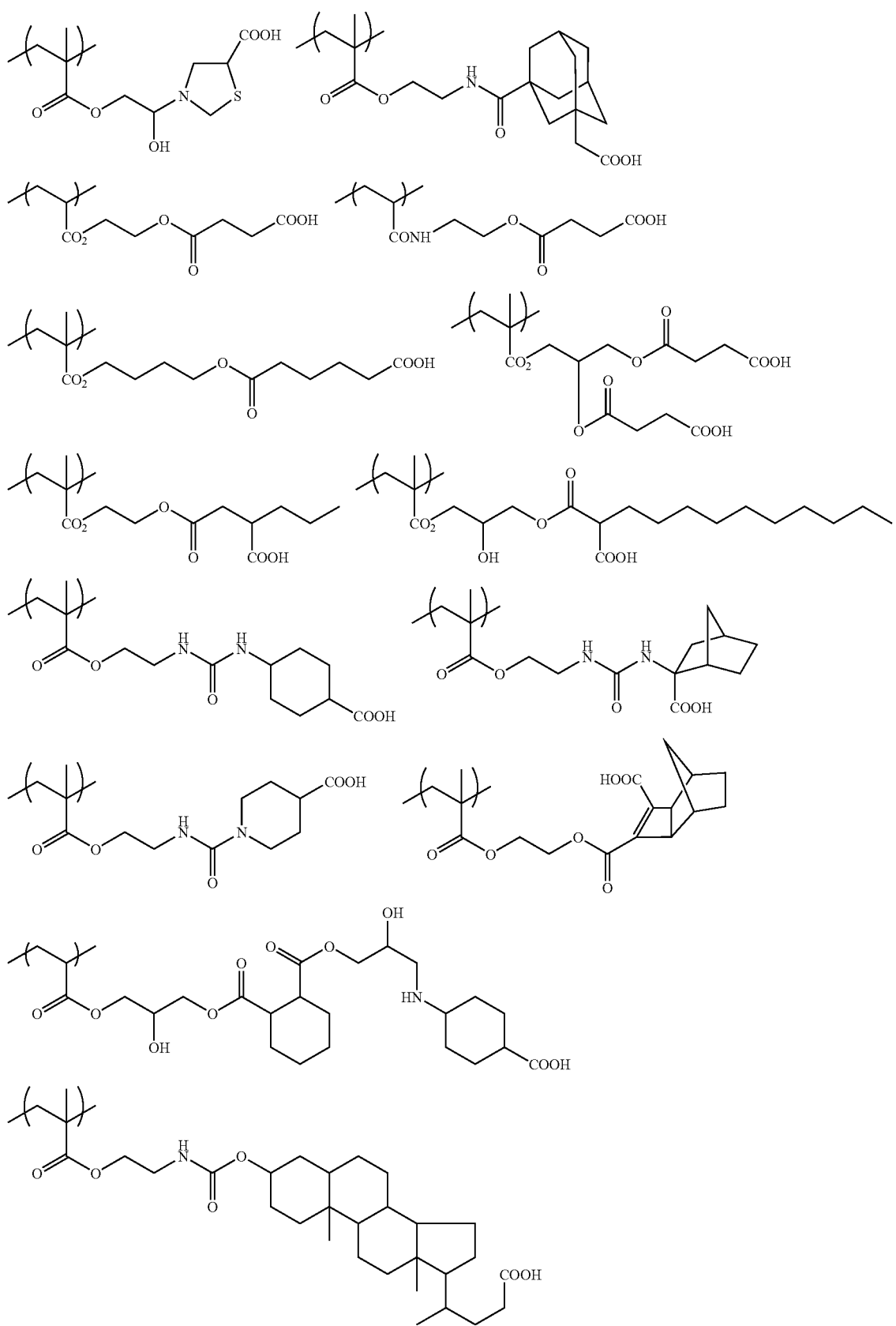

-continued

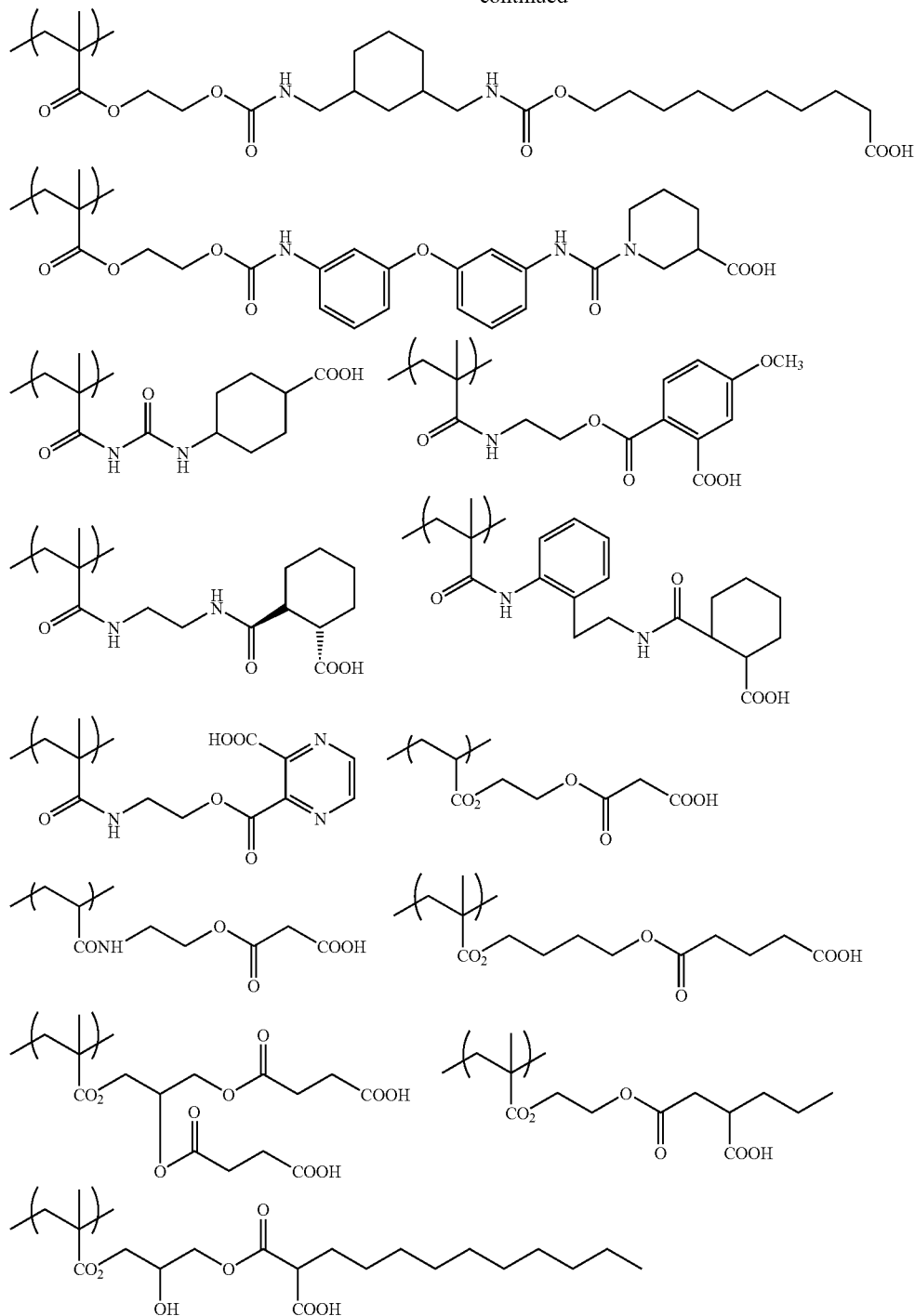

One or two or more kinds of repeating unit represented by the formula (i) may be contained in the binder polymer. The specific binder polymer in the present invention may be a polymer composed exclusively of the repeating unit represented by the formula (i), but is usually used as a copolymer containing other copolymerizable components. The total content of the repeating unit represented by the formula (i) in the copolymer is suitably determined depending on the structure of the copolymer, design of the photosensitive layer, etc., but usually the repeating unit represented by the formula (i) is contained in an amount of 1 to 99% by mole, more preferably 5 to 40% by mole, and still more preferably 5 to 20% by mole, based on the total molar amount of the polymer components.

When a copolymer is used as the binder polymer, copolymerizable components known in the art can be used without limitation insofar as they are radical-polymerizable monomers. Specifically, monomers described in the Polymer Data Handbook—Fundamental Version—compiled by the Society of Polymer Science, Japan and published by Baifukan, 1986 are exemplified. Such copolymerizable components can be used alone or in combination.

The molecular weight of the specific binder polymer in the present invention is suitably determined from the viewpoint of image-forming property and printing durability. The molecular weight is preferably in the range of 2,000 to 1,000,000, more preferably 5,000 to 500,000, and still more preferably 10,000 to 200,000.

As the binder polymer used in the photosensitive layer in the present invention, the specific binder polymer may be used alone, or may be used in combination with one or more other binder polymers. When the specific binder is used, binder polymers used in combination therewith are used in the range of 1 to 60% by mass, preferably 1 to 40% by mass, and more preferably 1 to 20% by mass, based on the total weight of the binder polymer components. As the binder polymer, any known binder polymers can be used without limitation, and specifically an acrylic main-chain binder and an urethane binder used often in this field are preferably used.

The total amount of the specific binder polymer and binder polymers which can be used in combination therewith in the photosensitive layer composition can be suitably determined, and is usually 10 to 90% by mass, preferably 20 to 80% by mass, and more preferably 30 to 70% by mass, based on the total mass of nonvolatile components in the photosensitive composition.

The acid value (meg/g) of the binder polymer is preferably in the range of 2.00 to 3.60.

3-4-2. Other Binder Polymers Usable in Combination

The binder polymer which can be used in combination with the specific binder polymer is preferably a binder polymer having a radical-polymerizable group. The radical-polymerizable group is not particularly limited insofar as it can be polymerized with a radical, and examples thereof include α-substituted methyl acryl group [—OC(=OC(—CH$_2$Z) =CH$_2$ wherein Z is a hydrocarbon group starting from a heteroatom], acryl group, methacryl group, allyl group and styryl group, among which an acryl group and methacryl group are preferable.

The content of the radical-polymerizable group in the binder polymer (content of radical-polymerizable unsaturated double bonds determined by iodine titration) is preferably 0.1 to 10.0 mmol, more preferably 1.0 to 7.0 mmol, and most preferably 2.0 to 5.5 mmol, per 1 g of the binder polymer from the viewpoint of sensitivity and storability.

Preferably, the binder polymer further has an alkali-soluble group. The content of the alkali-soluble group (acid value determined by neutralization titration) in the binder polymer is preferably 0.1 to 3.0 mmol, more preferably 0.2 to 2.0 mmol, and most preferably 0.45 to 1.0 mmol, per 1 g of the binder polymer, from the viewpoint of precipitation of development scum and printing durability.

The weight-average molecular weight of the binder polymer is in the range of preferably 2,000 to 1,000,000, more preferably 10,000 to 300,000, and most preferably 20,000 to 200,000, from the viewpoint of film property (printing durability) and solubility in a coating solvent.

The glass transition point (Tg) of the binder polymer is in the range of preferably 70° to 300° C., more preferably 80° to 250° C., and most preferably 90° to 200° C., from the viewpoint of storage stability, printing durability and sensitivity.

As a means of increasing the glass transition point of the binder polymer, its molecule preferably contains an amide group or imide group, and particularly preferably contains methacrylamide derivatives.

3-5. Other Components

In addition to the fundamental components described above, other components suitable for uses, process, etc., can be added to the photosensitive composition of the present invention. Hereinafter, preferable additives are mentioned.

3-5-1. Colorant

Dyes or pigments may be added to the photosensitive layer of the present invention for the purpose of coloring. The plate-checking property, that is, the visibility of the printing plate after plate-making and the applicability for image densitometer can thereby be improved when the composition is applied to the printing plate. Examples of the colorant include pigments such as phthalocyanine type pigments, azo type pigments, carbon black and titanium oxide, and dyes such as ethyl violet, crystal violet, azo type dyes, anthraquinone type dyes and cyanine type dyes. Among these colorants, cationic dyes are preferable.

The amount of the dyes and pigments added is preferably about 0.5 to about 5% by mass of nonvolatile components in the entire photosensitive layer composition.

3-5-2. Polymerization Inhibitor

A small amount of a heat-polymerization inhibitor is preferably added to the photosensitive layer of the present invention in order to inhibit undesired heat polymerization of the polymerizable compound having an ethylenically unsaturated double bond. Preferable examples of the heat-polymerization inhibitor include hydroquinone, p-methoxyphenol, di-t-butyl-p-cresol, pyrogallol, t-butyl catechol, benzoquinone, 4,4'-thiobis(3-methyl-6-t-butyl phenol), 2,2'-methylene bis(4-methyl-6-t-butyl phenol), N-nitrosophenyl hydroxylamine primary cerium salts, etc. The amount of the heat-polymerization inhibitor added is preferably about 0.01 to about 5% by mass relative to the mass of nonvolatile components in the entire composition. To prevent the inhibition of polymerization by oxygen, a higher fatty acid derivative such as behenic acid or behenic amide may be added as necessary so that it is allowed to be locally present on the surface of the photosensitive layer in the drying step after application. The amount of the higher fatty acid derivative added is preferably about 0.5 to about 10% by mass relative to nonvolatile components in the entire photosensitive layer composition.

3-5-3. Other Additives

Known additives such as inorganic fillers for improving the physical properties of the cured layer, as well as other plasticizers and sensitizers for improving inking properties on the surface of the photosensitive layer may also be added to the photosensitive layer of the invention. The plasticizers include dioctyl phthalate, didodecyl phthalate, triethylene glycol dicaprylate, dimethyl glycol phthalate, tricresyl phosphate, dioctyl adipate, dibutyl sebacate, triacetyl glycerin, etc., and these can be added in an amount of 10% by mass or less relative to the total mass of the binder polymer and the addition-polymerizable compound.

In the photosensitive layer of the invention, UV initiators and heat-crosslinking agents for enhancing the effect of heating and irradiation after development can also be added for the purpose of improving the layer strength (printing durability) described later.

4. Support

A hydrophilized support as will be described below is used for the support of the present invention. Examples of such support include paper, polyester film or aluminum plate, and the aluminum plate is preferable among them since it is excellent in dimensional stability, is relatively inexpensive and is able to provide a surface excellent in hydrophilicity and strength by applying an appropriate surface treatment. A composite sheet prepared by bonding an aluminum sheet on a polyethylene terephthalate sheet as described in JP-B No. 48-18327 is also preferable.

The aluminum plate as a most suitable support of the present invention is a metal plate stable in size and mainly comprising aluminum, and is selected from pure aluminum plate as well as from an alloy plate mainly comprising aluminum with a minute amount of foreign elements, and plastic film or paper sheet on which aluminum (alloy) is laminated or deposited. The support made of aluminum or an aluminum alloy as described above is collectively referred to an aluminum support in the descriptions hereinafter. The foreign elements contained in the aluminum alloy include silicon, iron, manganese, copper, magnesium, chromium, zinc, bismuth, nickel and titanium, and the content of the foreign element in the alloy is 10% by mass or less. While a pure aluminum plate is favorable in the present invention, the aluminum plate may contain a minute amount of foreign elements since production of perfectly pure aluminum is difficult for the refining technology. Known materials such as those defined by JIS A1050, JIS A1100, JIS A3103 and JIS A3005 may be appropriately used.

The thickness of the aluminum support used in the present invention is from about 0.1 mm to about 0.6 mm. The thickness may be appropriately changed depending on the size of the printing machine, size of the printing plate and demands of users.

The aluminum support is hydrophilized by applying a surface treatment as will be described later.

4-1. Surface Roughening Treatment

Surface roughening treatments include mechanical surface roughening, mechanical etching and electrolytic graining as disclosed in JP-A No. 56-28893. Other surface roughening methods include an electrochemical surface roughening method by which the surface is electrochemically roughened in an electrolyte solution such as aqueous hydrochloric acid solution or nitric acid solution, and mechanical roughening methods such as a wire brushing method by which the surface of aluminum is scratched with a metal wire, a ball graining method by which the aluminum surface is ground with polishing balls and abrasive, and a brush graining method for roughening the surface with a nylon brush and abrasive. One of these surface roughening methods may be used alone, or these methods may be combined for use. The electrochemical method by which the surface is chemically roughened in an aqueous hydrochloric acid or nitric acid solution is useful for roughening the surface among the above-described methods, and suitable quantity of electricity per hour at the anode is in the range from 50 to 400 C/dm². Specifically, the surface is subjected to AC and/or DC electrolyses at a temperature from 20 to 80° C. for a time from 1 to 30 seconds with a current density from 100 to 400 C/dm² in an electrolyte solution containing from 0.1 to 50% hydrochloric acid or nitric acid.

The aluminum support after surface roughening treatment may be chemically etched with an acid or alkali. Favorably used etching agents include sodium hydroxide, sodium carbonate, sodium aluminate, sodium metasilicate, sodium phosphate, potassium hydroxide and lithium hydroxide. Preferable ranges of the concentration and temperature are from 1 to 50% and from 20 to 100° C., respectively. The plate is washed with an acid in order to remove contamination (smut) remaining on the surface after etching. The acid used is nitric acid, sulfuric acid, phosphoric acid, chromic acid, hydrofluoric acid and borohydrofluoric acid. In particular, the smut is removed after the electrochemical surface roughening treatment preferably by allowing the surface to contact an aqueous sulfuric acid solution with a concentration from 15 to 65% by mass at a temperature from 50 to 90° C. as described in JP-A No. 53-12739, or by etching with an alkali as described in JP-B No. 48-28123. The method and condition are not particularly restricted, so long as the surface roughness Ra after the above-mentioned surface treatment is in the range from about 0.2 to about 0.5 μm.

4-2. Anodic Oxidation Treatment

The aluminum support treated as described above and on which an oxide layer is formed is subjected to anodic oxidation treatment thereafter.

One of sulfuric acid, phosphoric acid, oxalic acid and boric acid/sodium borate solution or a combination thereof is used for the anodic oxidation treatment as the principal component of the electrolyte bath. Naturally, components usually contained at least in the Al alloy plate, electrodes, city water and underground water may be contained in the electrolyte solution. A second or third component may be also added in the electrolyte solution. Examples of the second and third components herein include cations such as metal ions including Na, K, Mg, Li, Ca, Ti, Al, V, Cr, Mn, Fe, Co, Ni, Cu and Zn ions, and ammonium ion, and anions such as nitrate ion, carbonate ion, chloride ion, phosphate ion, fluoride ion, sulfite ion, titanate ion, silicate ion and borate ion. The concentration may be in the range from 0 to 10,000 ppm. While the condition for anodic oxidation is not particularly restricted, the plate is treated by direct or AC current electrolysis preferably at an electrolyte concentration from 30 to 500 g/liter, treatment liquid temperature from 10 to 70° C., and current density from 0.1 to 40 A/dm². The thickness of the anodic oxidation film is in the range from 0.5 to 1.5 μm, preferably from 0.5 to 1.0 μm. The treatment condition is preferably selected so that the support prepared as described above has a micro-pore diameter in the range from 5 to 10 nm, and pore density in the range from $8 \times 10^{15}$ to $1 \times 10^{16}$ pored/m².

Known methods can be widely applied for the hydrophilizing treatment of the surface of the support. A preferable method is to hydrophilize the surface with silicate or polyvinyl phosphonic acid. The coating film is formed at a concentration of an element Si or P from 2 to 40 mg/m², preferably from 4 to 30 mg/m². The amount of coating can be measured by X-ray fluorescence analysis.

The surface of the support is hydrophilized by immersing the aluminum support, on which the anodic oxidation film is formed, in an aqueous solution with a concentration of an alkali metal silicate or polyvinyl phosphonic acid from 1 to 30% by mass, preferably from 2 to 15% by mass, and having a pH from 10 to 13 at 25° C. for 0.5 to 120 seconds at a temperature from 15 to 80° C.

The alkali metal silicate used for the hydrophilizing treatment is sodium silicate, potassium silicate or lithium silicate. The hydroxide used for increasing the pH of the aqueous alkali metal silicate solution is sodium hydroxide, potassium hydroxide or lithium hydroxide. An alkali earth metal salt or a group IVB metal salt may be blended in the treatment liquid. Examples of the alkali earth metal salt include nitrate salts such as calcium nitrate, strontium nitrate, magnesium nitrate and barium nitrate, and water-soluble salts such as sulfate salts, hydrochloride salts, phosphate salts, acetate salts, oxalate salts and borate salts. Examples of the group IVB metal salt include titanium tetrachloride, titanium trichloride, potassium titanium fluoride, potassium titanium oxalate, titanium sulfate, titanium tetraiodide, zirconium oxychloride, zirconium dioxide, zirconium oxychloride and zirconium tetrachloride.

One of the alkali earth metal salts or group IVB metal salts may be used alone, or a plurality of them may be used in combination. The metal salts are preferably used in the range from 0.01 to 10% by mass, more preferably from 0.05 to 5.0% by mass. Electrodeposition of silicate as described in U.S.

Pat. No. 3,658,662 is also effective. A surface treatment as a combination the anodic oxidation and hydrophilization on the support subjected to electrolytic graining as disclosed in JP-B No. 46-27481 and JP-A Nos. 52-58602 and 52-30503 is also useful.

5. Undercoat Layer

An intermediate layer (undercoat layer) for improving adhesiveness between the photosensitive layer and support and for improving fouling resistance may be provided in the planographic printing plate precursor of the present invention. Specific examples of the intermediate layer include those described in JP-B No. 50-7481, and JP-A Nos. 54-72104, 59-101651, 60-149491, 60-232998, 3-56177. 4-282637, 5-16558, 5-246171, 7-159983, 7-314937, 8-202025, 8-320551, 9-34104, 9-236911, 9-269593, 10-69092, 10-115931, 10-161317, 10-260536, 10-282682, 11-84674, 10-69092, 10-115931, 11-38635, 11-38629, 10-282645, 10-301262, 11-24277, 12-109641, 10-319600, 11-84674, 11-327152, 2000-10292, 2000-236254, 2000-352854 and 2001-209170, and Japanese Patent Application Publication No. 11-284091.

6. Production of Planographic Printing Plate Precursor

The planographic printing plate precursor of the present invention includes a photosensitive layer and protective layer formed on or above a support in this order with an optional undercoat layer. The planographic printing plate precursor is produced by sequentially applying the coating solutions containing the above-mentioned various components dissolved in respective solvents on the support.

For applying the photosensitive layer, a coating solution for the photosensitive layer is prepared by dissolving the components of the photosensitive layer in various organic solvents, and is applied on the support or undercoat layer.

Examples of the solvent used include acetone, methylethyl ketone, cyclohexane, ethyl acetate, ethylene dichloride, tetrahydrofuran, toluene, ethyleneglycol monomethylether, ethyleneglycol monoethylether, ethyleneglycol dimethylether, propyleneglycol monomethylether, propyleneglycol monoethylether, acetylacetone, cyclohexanone, diacetone alcohol, ethyleneglycol monomethylether acetate, ethyleneglycol ethylether acetate, ethyleneglycol monoisopropylether acetate, ethyleneglycol monobutylether acetate, 3-methoxypropanol, methoxymethoxy ethanol, diethyleneglycol monomethylether, diethyleneglycol monoethylether, diethyleneglycol dimethylether, diethyleneglycol diethylether, propyleneglycol monomethylether acetate, propyleneglycol monoethylether acetate, 3-methoxypropyl acetate, N,N-dimethylformamide, dimethylsulfoxide, γ-butylolactone, methyl lactate and ethyl lactate. One of these solvents may be used alone, or a mixture thereof may be used. An appropriate concentration of the solid fraction in a coating solution for the photosensitive layer is from 2 to 50% by mass.

It is desirable to appropriately select the amount of coating of the photosensitive layer depending on the uses of the layer, since the amount of coating may affect the sensitivity of the photosensitive layer, developability, strength of the exposed film and print durability. Print durability is insufficient when the amount of coating is too small. On the other hand, an excess amount is not preferable since sensitivity decreases and exposure requires too long time while a long period of time is necessary for development. An appropriate amount of coating after drying is in the range from 0.1 to 10 g/m$^2$, more preferably from 0.5 to 5 g/m$^2$, for the planographic printing plate precursor for scanning exposure.

7. Plate Making Method

The plate making method of a planographic printing plate precursor of the present invention preferably comprises the steps of: forming a stack of a plurality of the planographic printing plate precursor by allowing the protective layer to directly contact the back surface of the support; setting the stack in a plate setter; automatically feeding the planographic printing plate precursor one after another; exposing the planographic printing plate precursor to a light having a wavelength region from 750 to 1400 nm; and developing the exposed planographic printing plate precursor at a feed speed of 1.25 m/minute without substantial heat treatment.

The planographic printing plate precursor of the present invention can be applied to the above-mentioned plate making method since the planographic printing plate precursor are suppressed from adhering to one another and from generating flaws on the protective layer even by stacking without inserting any interleaf sheet between the planographic printing plate precursors.

According to the plate making method of the present invention, removal of interleaf sheets is not necessary since the stack used has no interleaf sheet inserted between the planographic printing plate precursor, and productivity in the plate making step is improved.

While it is needles to say that the above-mentioned plate making method is suitable for making the printing plate from the planographic printing plate precursor of the present invention, the method may be favorably used for the planographic printing plate precursor having a polymerizable negative photosensitive layer that contains at least an infrared absorbing agent, a polymerization initiator and a polymerizable compound, and solubility of which in an alkali developer decreases by exposing to a light having a wavelength in the range from 750 to 1400 nm. Specifically, the photosensitive layer may contain each component of the infrared absorbing agent, polymerization initiator and polymerizable compound described in the section of each component constituting the photosensitive layer of the planographic printing plate precursor of the present invention. Known binder polymers may be contained or not contained.

The photosensitive layer to which the plate making method is applied preferably has a development speed of non-exposed portions of 80 nm/sec or more in an alkali developer having a pH from 10 to 13.5, and a permeation speed of the alkali developer of 50 nF/sec or less into the exposed portion. The methods available for measuring the development speed of the non-exposed portion of the photosensitive layer and permeation speed of the alkali developer into the photosensitive layer after hardening are described in Japanese Patent Application Publication No. 2004-248535 filed in advance by the inventors of the present invention. While the development speed of the non-exposed portion of the photosensitive layer and permeation speed of the alkali developer into the photosensitive layer after hardening can be controlled by a conventional method, a representative method is to use a specified binder polymer. Otherwise, addition of a hydrophilic compound is useful for improving the development speed of the non-exposed portion, while addition of a hydrophobic compound is useful for controlling permeation of the developer into the exposed portion.

7-1. Exposure

The light source used for exposure in the present invention is preferably able to emit a light with a wavelength from 750 to 1400 nm, and an example of the light source is an infrared laser.

A solid laser or a semiconductor laser capable of emitting an infrared light with a wavelength from 750 to 1400 nm is preferably used for exposing the image in the present invention. The laser output is preferably 100 mW or more, and a multi-beam laser device is preferably used for shortening the exposure time. The exposure time per one pixel is preferably 20 μsec or shorter. The total energy irradiated to the planographic printing plate precursor is preferably in the range from 10 to 300 mJ/cm$^2$. Hardening of the photosensitive layer does not sufficiently proceed when the energy for exposure is too low, while the image is damaged by laser ablation of the photosensitive layer when the energy of exposure is too high.

Exposure by overlapping the light beam of the light source is possible in the exposure treatment of the present invention. Overlap exposure refers to exposure using a sub-scanning pitch width smaller than the diameter of the beam. The overlap ratio can be quantitatively expressed by FWH/sub-scanning pitch width (overlap coefficient), when the beam diameter is represented by a half-width of the beam intensity (FWHM). The overlap coefficient is preferably 0.1 or more in the present invention.

The scanning method of the light source of the exposure apparatus used in the present invention is not particularly restricted, and any of the methods for scanning the outer surface of a cylinder and for scanning the inner surface of a cylinder, and plane scanning method may be used. While the light source channel may be single channel or multi-channel, multi-channel is preferably used for the cylinder outer surface scanning method.

The planographic printing plate precursor after exposure as described above is developed without any heat treatment and washing with water in the present invention. Omitting the heat treatment permits irregular images ascribed to the heat treatment to be suppressed from being formed. Omitting the heat treatment and washing with water enables the development process to be stable and high speed.

7. Development

Non-image portions are removed in the development process of the present invention using a developer.

The treatment speed in the development process, or the feed speed (line speed) of the planographic printing plate precursor in the development process, is required to be 1.25 m/min or more, preferably 1.35 m/min or more. While the upper limit of the feed speed is not particularly restricted, the speed is preferably 3 m/min or less in terms of stability of transfer.

The developer of the present invention will be described below.

7-2-2. Developer

The developer used in the present invention is preferably an aqueous alkali solution having a pH of 14 or less, and preferably contains an aromatic anionic surfactant.

Aromatic Anionic Surfactant

The aromatic anionic surfactant used in the developer of the present invention exhibits a development accelerating effect and an effect for stabilizing dispersion of the components of the polymerizable negative photosensitive layer and the components of the protective layer in the developer, and is preferable for stabilizing the development process.

The compound represented by formula (A) or formula (B) below is preferable as the aromatic anionic surfactant used in the present invention.

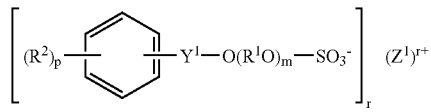

Formula (A)

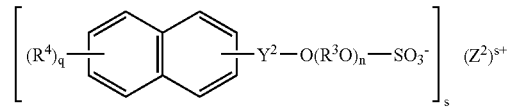

Formula (B)

In formula (A) or formula (B), $R^1$ and $R^3$ each independently represents a linear or branched alkylene group having 1 to 5 carbon atoms, and specific examples thereof include ethylene group, propylene group, butylene group and pentylene group. The ethylene group and propylene group are particularly preferable among them.

m and n each independently represents an integer selected from the range from 1 to 100. m and n are preferably from 1 to 30, more preferably from 2 to 20. Plural $R^1$ may be the same or different when m is 2 or more. Plural $R^3$ may be also the same or different, when n is 2 or more.

t and u each independently represents 0 or 1.

$R^2$ and $R^4$ each independently represents a linear or branched alkyl group having 1 to 20 carbon atoms. Specific examples of them include methyl group, ethyl group, propyl group, butyl group, hexyl group and dodecyl group, and methyl group, ethyl group, iso-propyl group, n-propyl group, n-butyl group, iso-butyl group and tert-butyl group are preferable among them.

p and q each independently represents an integer selected from 0 to 2. $Y^1$ and $Y^2$ each represents a single bond or an alkylene group having 1 to 10 carbon atoms. Specifically, the single bond, methylene group and ethylene group are preferable, and the single bond is particularly preferable.

$(Z^1)^{r+}$ and $(Z^2)^{s+}$ each independently represents an alkali metal ion, alkali earth metal ion or a substituted ammonium ion or ammonium ion substituted with alkyl groups. Specific examples include lithium ion, sodium ion, potassium ion, magnesium ion, calcium ion, ammonium ion, and secondary to quaternary ammonium ion substituted with alkyl group, aryl group or aralkyl group having 1 to 20 carbon atoms. Sodium ion is particularly preferable. r and s each represents 1 or 2.

While specific examples of the aromatic anionic surfactant are shown below, the present invention is not restricted thereto:

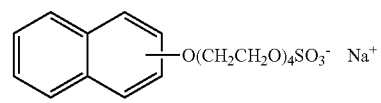

K-1

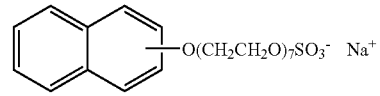

K-2

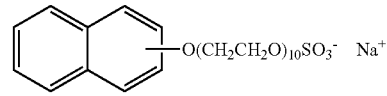

K-3

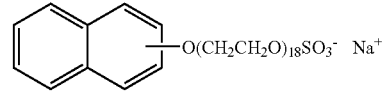

K-4

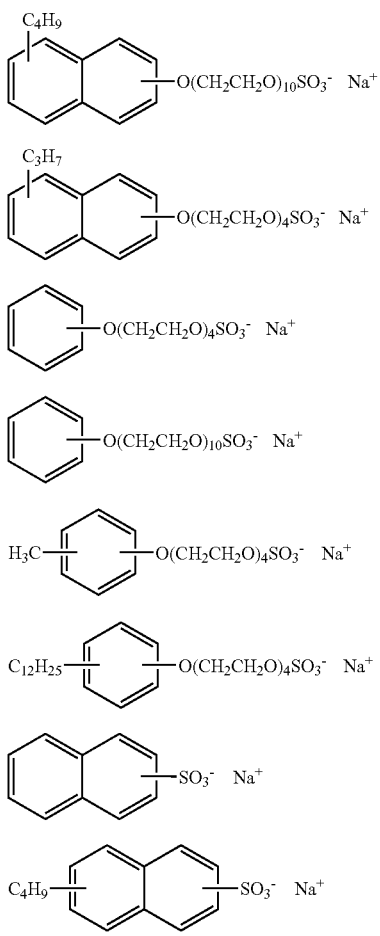

One of these aromatic anionic surfactants may be used alone, or a plurality of them may be combined for use. It is effective that the amount of addition of the aromatic anionic surfactant is preferably adjusted so that the concentration of the aromatic anionic surfactant in the developer is in the range from 1.0 to 10% by mass, more preferably from 2 to 10% by mass. When the content is 1.0% by mass or less, developability and solubility of the component of the photosensitive layer are decreased, while print durability of the printing plate is deteriorated when the content is 10% by mass or more.

Other surfactants may be added together to the developer of the present invention, in addition to the aromatic anionic surfactant. Examples of other surfactant include for example, polyoxyethylene alkyl ethers such as polyoxyethylene naphthyl ether, polyoxyethylene alkylphenyl ether, polyoxyethylene lauryl ether, and polyoxyethylene cetyl ether, polyoxyethylene stearyl ether; sorbitan alkyl esters such as sorbitan monolaurate, sorbitan monostearate, sorbitan distearate, sorbitan monooleate, sorbitan sesquioleate, and sorbitab trioleate; and glyceride alkyl esters such as glycerol monostearate and glycerol monooleate.

The content of other surfactants in the developer is preferably from 0.1 to 10% by mass as converted into the effective component.

(Chelating Agent for Divalent Metals)

The developing solution according to the invention is preferably made to contain a chelating agent for a divalent metal with the intention to suppress the influences of, for example, calcium ions contained in hard water. Examples of the chelating agent for a divalent metal include polyphosphates such as $Na_2P_2O_7$, $Na_5P_3O_3$, $Na_3P_3O_9$, $Na_2O_4P$ ($NaO_3P$)$PO_3Na_2$ and Calgon (sodium polymethaphosphate); aminopolycarboxylic acids such as ethylenediaminetetraacetic acid and its potassium salts, sodium salts and amine salts, diethylenetriaminepentaacetic acid and its potassium salts and sodium salts, triethylenetetraminehexaacetic acid and its potassium salts and sodium salts, hydroxyethylethylenediaminetriacetic acid and its potassium salts and sodium salts, nitrilotriacetic acid and its potassium salts and sodium salts, 1,2-diaminocyclohexanetetraacetic acetic acid and its potassium salts and sodium salts, and 1,3-diamino-2-propanoltetraacetic acid and its potassium salts and sodium salts; and organic phosphonic acids such as 2-phosphono-1,2,4-butanetricarboxylic acid and its potassium salts and sodium salts, 2-phosphono-2,3,4-butanetricarboxylic acid and its potassium salts and sodium salts, 1-phosphono-11,2,2-ethanetricarboxylic acid and its potassium salts and sodium salts, 1-hydroxyethane-1,1-diphosphonic acid and its potassium salts and sodium salts, and aminotri(methylenephosphonic acid) and its potassium salts and sodium salts. Among these compounds, ethylenediaminetetraacetic acid and its potassium salts, sodium salts and amine salts, ethylenediaminetetra(methylenephosphonic acid) and its ammonium salts and potassium salts; and hexamethylenediaminetetra(methylenephosphonic acid) and its ammonium salts and potassium salts are preferable.

The optimum amount of the chelating agent varies corresponding to the hardness and amount of hard water to be used. However, the chelating agent is contained in an amount of generally 0.01 to 5% by mass and preferably 0.01 to 0.5% by mass in the developing solution during use.

Also, alkali metal salts of organic acids or inorganic acids may be added as developing regulators to the developing solution according to the invention. For example, sodium carbonate, potassium carbonate, ammonium carbonate, sodium citrate, potassium citrate and ammonium citrate may be used singly or in combinations of two or more.

(Alkali Agent)

Examples of the alkali agent used in the developing solution according to the invention include inorganic alkali agents such as sodium tertiary phosphate, potassium tertiary phosphate, ammonium tertiary phosphate, sodium borate, potassium borate, ammonium borate, sodium hydroxide, potassium hydroxide, ammonium hydroxide and lithium hydroxide and organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, pyridine and tetramethylammoniumhydroxide. In the invention, these compounds may be used either singly or in combinations of two or more.

Also, examples of alkali agents other than the above agents may include alkali silicates. These alkali silicates may be used in combination with a base. Examples of the alkali silicates to be used are those exhibiting alkalinity when dissolved in water and include sodium silicate, potassium silicate, lithium silicate and ammonium silicate. These silicates may be used either singly or in combinations of two or more.

The developing solution used in the invention may be easily adjusted to an optimum range by controlling the mixing ratio of silicon oxide $SiO_2$ which is a component of silicate (silicate is a component to impart hydrophilicity to the support) to an alkali oxide $M_2O$ (M represents an alkali metal or an ammonium group) which is an alkali component, and the concentrations of these components. The mixing ratio (molar ratio of $SiO_2/M_2O$) of silicon oxide $SiO_2$ to an alkali oxide $M_2O$ is preferably in a range from 0.75 to 4.0 and more preferably in a range from 0.75 to 3.5 from the viewpoint of suppressing the occurrence of stains caused by excess dissolution (etching) of an anodic oxide film of the support and generation of insoluble gas caused by the formation of a complex of dissolved aluminum and a silicate.

Also, the concentration of the alkali silicate in a developing solution is preferably in a range from 0.01 to 1 mol/L and more preferably in a range from 0.05 to 0.8 mol/L as the amount of $SiO_2$ based on the mass of the developing solution from the viewpoint of the effect of suppressing dissolution (etching) of an anodic oxide film of the support, developing ability, the effect of suppressing precipitation and generation of crystals and the effect of preventing gelation when developing solution waste is neutralized.

The developing solution used in the invention may use the following components together according to the need besides the above components. Examples of these components include organic carboxylic acids such as benzoic acid, phthalic acid, p-ethylbenzoic acid, p-n-propylbenzoic acid, p-isopropylbenzoic acid, p-n-butylbenzoic acid, p-t-butylbenzoic acid, p-2-hydroxyethylbenzoic acid, decanoic acid, salicylic acid and 3-hydroxy-2-naphthoic acid; organic solvents such as propylene glycol; and others including reducing agents, dyes, pigments, water softeners and antiseptics.

The developing solution used in the invention has a pH in a range from preferably 10 to 12.5 and more preferably 11 to 12.5 at 25° C. Since the developing solution of the invention contains the aforementioned surfactant, excellent developing characteristics are developed in the non-image area even if a developing solution having such low pH is used. Such a measures as to make the developing solution have a lower pH reduces damages to the image area during developing and improves the handling characteristics of the developing solution.

Also, the conductivity x of the developing solution preferably satisfies the equation $2<x<30$ mS/cm and is more preferably 5 to 25 mS/cm.

Here, it is preferable to add alkali metal salts of organic acids or inorganic acids as conductive regulators that regulate conductivity.

The above developing solution may be used as a developing solution for an exposed planographic printing plate precursor and as a developing replenishing solution and is preferably applied to an automatic developing machine. In the case of carrying out developing using an automatic developing machine, the developing solution is exhausted correspondingly to the throughput and a replenishing or fresh developing solution may be therefore used to recover developing capability. This replenishing system is also preferably applied in the plate-making method of the invention.

In order to recover the developing capability of the developing solution by using an automatic developing machine, it is preferable to replenish using a method as described in U.S. Pat. No. 4,882,246. Developing solutions as described in each publication of JP-A Nos. 50-26601 and 58-54341 and JP-B Nos. 56-39464, 56-42860 and 57-7427 are also preferable.

The planographic printing plate precursor developed in this manner is subjected to after-treatment performed using rinsing water, a rinsing solution containing surfactants and the like and a protective gum solution containing gum arabic and a starch derivative as its major components. For the after-treatment of the planographic printing plate precursor of the present invention, these treatments are used in various combinations. The planographic printing plate obtained by such treatments is placed in an offset printer and used for printing a number of copies.

In the method of making a planographic printing plate according to the invention, the developed image may be subjected to after-heating treatment and exposure performed on the entire surface for the purpose of improving image strength and printing durability.

Very strong conditions can be utilized in the heating after the image is developed. The heating is usually carried out at a temperature in a range from 200 to 500° C. If the heating temperature after the development treatment is too low, only an insufficient image strengthening effect is obtained whereas if the heating temperature is too high, there is fears of a deterioration of the support and thermal decomposition of the image area.

The planographic printing plate obtained by such treatments is placed in an offset printer and used for printing a number of copies.

As the plate cleaner used to remove stains on the plate during printing, a conventionally known plate cleaner for PS plate is used. Examples of the plate cleaner include CL-1, CL-2, CP, CN-4, CN, CG-1, PC-1, SR and IC (manufactured by Fuji Photo Film Co., Ltd.).

EXAMPLES

The present invention is described with reference to examples, however, the present invention is by no means restricted to these examples.

The photosensitive planographic printing plate precursor as a preferable aspect of the photosensitive recording material of the present invention is produced and evaluated in the examples below.

Example 1-1

Preparation of Support

An aluminum plate of JIS A1050 with a thickness of 0.30 mm and a width of 1030 mm was subjected to surface treatment as shown below.

<Surface Treatment>

In the surface treatment, the following various treatments (a) to (f) were continuously carried out. After each treatment and washing, a nip roller was used to drain off.

(a) The aluminum plate was subjected to etching treatment carried out in the following condition: concentration of caustic soda: 26% by mass, concentration of ammonium ions: 6.5% by mass and temperature: 70° C., to dissolve 5 g/m$^2$ of the aluminum plate, followed by washing with water.

(b) The aluminum plate was subjected to desmatting treatment carried out using an aqueous 1% by mass of nitric acid solution (including 0.5% by mass of aluminum ions) kept at 30° C. by spraying, followed by washing with water.

(c) The aluminum plate was subjected to electrochemical surface roughing treatment carried out continuously by using 60 Hz a.c. current. The electrolytic solution used at this time was an aqueous 1% by mass of nitric acid solution (including 0.5% by mass of aluminum ions and 0.07% by mass of ammonium ions) kept at 30° C. Electrochemical surface roughening treatment was carried out by using an a.c. power source with a trapezoidal rectangular wave a.c. current having the following characteristics: the time TP required for the current to reach a peak from zero: 2 msec and duty ratio: 1:1 and also using a carbon electrode as the counter electrode. Ferrite was used as the auxiliary anode. The current density was 25 A/dm² when the current reached a peak and the quantity of electricity was 250 C/cm² as the sum of the quantity of electricity when the aluminum plate served as the anode. 5% of the current flowing from the power source was distributed to the auxiliary anode and then the aluminum plate was washed with water.

(d) The aluminum plate was subjected to etching treatment carried out by spraying in the following condition: concentration of caustic soda: 26% by mass, concentration of ammonium ions: 6.5% by mass and temperature: 35° C., to dissolve 0.2 g/m2 of the aluminum plate, to thereby remove the smut component which was produced when the electrochemical surface roughening treatment using a.c. current in the previous stage and primarily contained aluminum hydroxide and to dissolve the edge part of the generated pit, thereby smoothing the edge part. Then, the aluminum plate was washed with water.

(e) The aluminum plate was subjected to desmatting treatment carried out using an aqueous 25% by mass of sulfuric acid solution (including 0.5% by mass of aluminum ions) kept at 60° C. by spraying, followed by washing with water.

(f) The aluminum plate was subjected to anodic oxidation treatment in the following condition: concentration of sulfuric acid: 170 g/l (containing 0.5% by mass of aluminum ions), temperature: 33° C. and current density: 5 (A/dm²), for 50 seconds, followed by washing with water. The weight of the anodic oxide film at this time was 2.7 g/m².

The surface roughness Ra of the aluminum support obtained in this manner was 0.27 (measuring device: SURF-COM, manufactured by TOKYO SEIMITSU Co., Ltd., diameter of the tracer head: 2 μm).

(Undercoat Layer)

Next, the following undercoat layer coating solution was applied to this aluminum support by using a wire bar and dried at 90° C. for 30 minutes. The amount applied was 10 mg/m².

<Undercoat Layer Coating Solution)>

| | |
|---|---|
| Polymer compound A having the following structure (weight average molecular weight: 10000) | 0.05 g |
| Methanol | 27 g |
| Ion exchange water | 3 g |

Polymer compound A

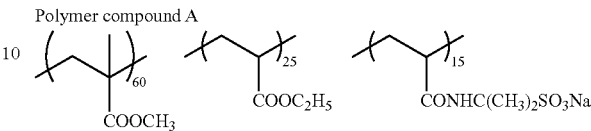

(Photosensitive Layer)

Next, the following photosensitive layer coating solution (P1-1) was prepared and applied to the foregoing aluminum support by using a wire bar. A drying operation was carried out at 115° C. for 34 seconds in a hot air drier to obtain a planographic printing plate precursor. The coating amount after the film was dried was 1.4 g/m².

<Photosensitive Layer Coating Solution P1-1>

| | |
|---|---|
| Infrared absorbing agent(IR-1) | 0.25% by mass |
| Polymerization initiator (OS-1) | 0.92% by mass |
| Polymerization initiator (OS-2) | 0.29% by mass |
| Additive (PM-1) | 0.50% by mass |
| Additive (PM-2) | 0.22% by mass |
| Additive (PM-3) | 0.20% by mass |
| Polymerizable compound (AM-1) | 3.14% by mass |
| Specific binder polymer (BT-1) | 2.40% by mass |
| Specific binder polymer (BT-2) | 1.60% by mass |
| Ethyl violet (C-1) | 0.13% by mass |
| Fluorochemical surfactant(trade name: MEGAFACE F-780-F, manufactured by Dainippon Ink and Chemicals, Incorporated, methyl isobutyl ketone (MIBK) 30% by mass solution) | 0.05% by mass |
| Methyl ethyl ketone | 36.84% by mass |
| Methanol | 17.11% by mass |
| 1-methoxy-2-propanol | 36.84% by mass |

The structures of the compounds used for the photosensitive layer coating solution are shown below:

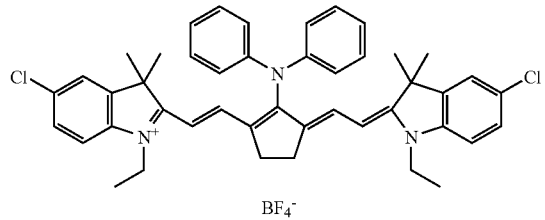
(IR-1)

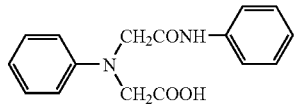
(PM-1)

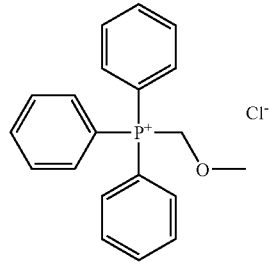
(PM-2)

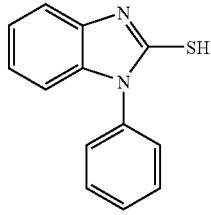
(PM-3)

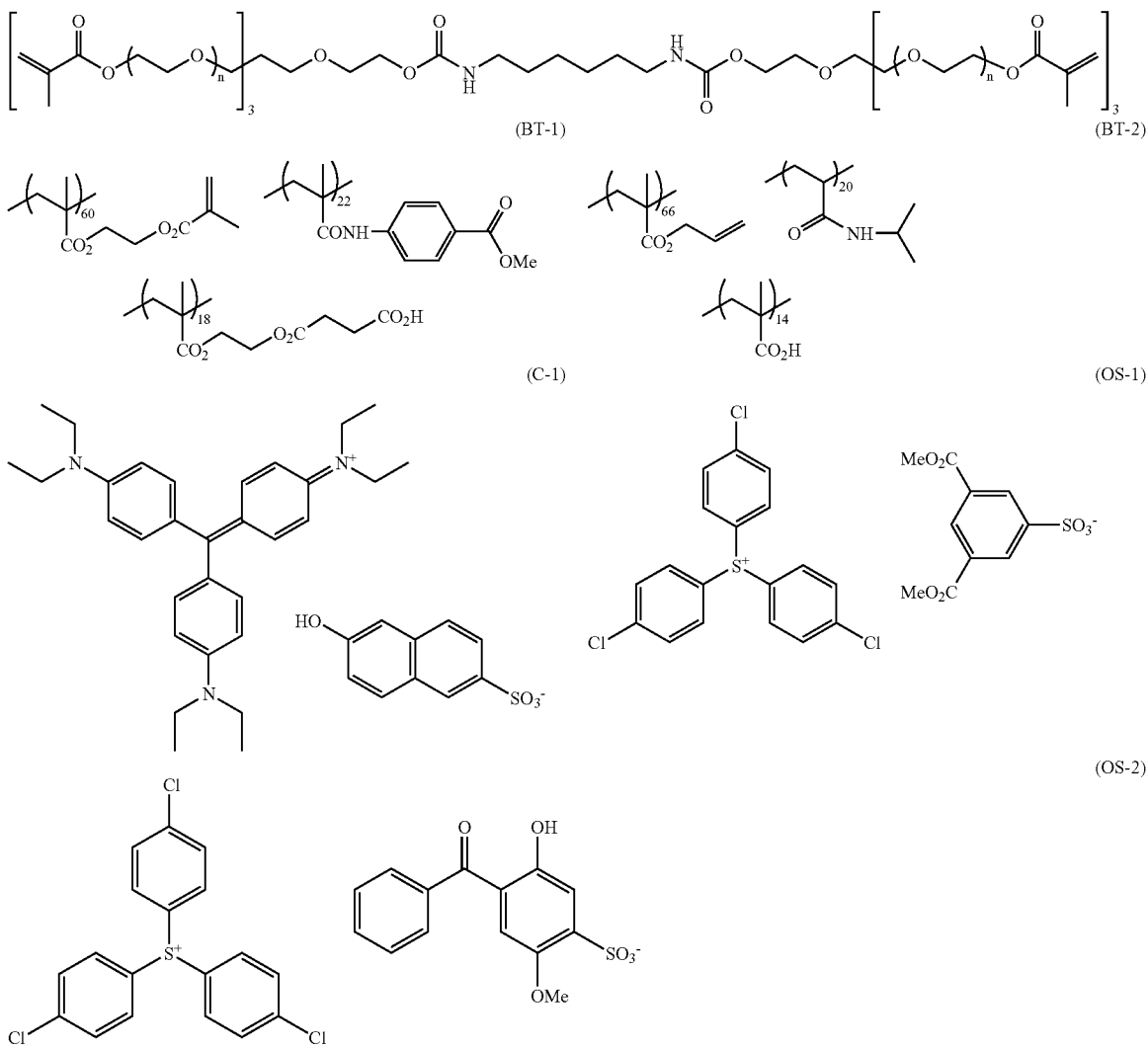

(Protective Layer)

A mixed aqueous solution (protective layer coating solution) containing a specific polyvinyl alcohol with degree of saponification of 91 mol % or more (GOHSERAN CKS-50, degree of saponification 99 mol %, degree of polymerization 300, sulfonic acid-modified polyvinyl alcohol, manufactured by Nippon Synthetic Chemical Industry Co.), the following aqueous dispersion of the solid dispersion dye, and a surfactant (trade name: EMULEX 710, manufactured by Nippon Emulsion Co.) was applied onto the surface of the foregoing photosensitive layer by a wire bar and dried at 125° C. for 75 seconds in a hot air type drier.

The solid dispersion dye used was exemplified compound III-9 (trade name: 1306F, manufactured by Daito Chemics Co.) with volume average particle diameters of 2 μm and 0.5 μm. The aqueous dispersion of the solid dispersion dye was prepared as follows.

-Preparation of Aqueous Dispersion of Solid Dispersion Dye-

Pure water (33.6 g), a surfactant (2.3 g, a condensation product of naphthalene sulfonic acid and formalin), and a solid dispersion dye (14.1 g) were mixed and, after stirring form 16 hours, the mixture was stirred for 1 hour with a dyna-mill by adding glass beads with a particle diameter in the range from 0.425 to 0.600 μm. The solid dispersion dye with a volume average particle diameter of 0.5 μm was obtained by removing the glass beads thereafter. The solid dispersion dye with a diameter of 2.0 μm was obtained by heat-treating the solid dispersion dye with a diameter of 0.5 μm obtained as described above at 85° C. for 1 hour.

The proportion of content of specific polyvinyl alcohol/solid dispersion dye/surfactant in the mixed aqueous solution (i.e. the protective layer coating solution) was 89.5/6/4.5 (% by mass), and the total coating amount (the coating amount after drying) was 1.6 g/m$^2$.

Three of the obtained planographic printing plate precursors (10 cm×10 cm) were conditioned at 25° C. and 75% RH for 2 hours. Then, these three planographic printing plate precursors were stacked in the same direction with interleaf sheets inserted between them. The stack was wrapped with aluminum craft paper, and was kept standing at 30° C. for 5 days while being pressed with a 4 kg weight (corresponding to 500 sheets of planographic printing plate precursors), to obtain a loaded stack of the planographic printing plate precursors.

Example 1-2

The planographic printing plate precursor and a stack thereof were obtained in the same manner as in Example 1-1, except that the solid dispersion dye (exemplified compound III-9, trade name: 1306F, manufactured by Daito Chemics Co.) with an average particle diameter of 2 μm used in the protective layer coating solution was replaced with the same dye having an average particle diameter of 0.5 μm.

Examples 1-3 and 1-4

A stack of the planographic printing plate precursors was obtained by using three of the planographic printing plate precursors obtained in Examples 1-1 or 1-2, and stacking the planographic printing plate precursors, without inserting interleaf sheets between them when they were stacked, so that the protective layer thereof was directly in contact with the back surface of the aluminum support.

Examples 1-5 and 1-6

A planographic printing plate precursor was obtained in the same manner as in Examples 1-1 or 1-2, except that synthetic mica (trade name: SOMASIF ME-100, 8% aqueous dispersion solution, manufactured by CO-OP Chemical Co.) was added to the protective layer coating solution of Example 1-1 or 1-2. The proportion of mixing of the specific polyvinyl alcohol/synthetic mica/solid dispersion pigment/surfactant in the mixed aqueous solution (the protective layer coating solution) was 77.5/12/6/4.5 (% by mass), and the total coating amount (coating amount after drying) was 1.6 g/m$^2$.

A stack of the planographic printing plate precursors was obtained by using three of the obtained planographic printing plate precursors, and stacking the planographic printing plate precursors, without inserting interleaf sheets when they were stacked, so that the protective layer thereof was directly in contact with the back surface of the aluminum support.

Comparative Example 1-1

A planographic printing plate precursor was obtained in the same manner as in Example 1-1, except that the solid dispersion dye was not added to the protective layer coating solution of Example 1-1. Further, a stack of the planographic printing plate precursors was obtained by stacking three planographic printing plate precursors and inserting interleaf sheets between them.

Comparative Example 1-2

A stack of the planographic printing plate precursors was obtained by using three of the planographic printing plate precursors obtained in Comparative Example 1-1, and stacking the planographic printing plate precursors, without inserting interleaf sheets when they were stacked, so that the protective layer thereof was directly in contact with the back surface of the aluminum support.

The planographic printing plate precursor obtained in Examples 1-1 to 1-6 and Comparative Examples 1-1 and 1-2, and stacks thereof, were evaluated as shown in Evaluation 1 below.

Evaluation 1

(1-1) Evaluation of Sensitivity

Each of the obtained planographic printing plate precursors was exposed to light in a TRENDSETTER 800 II Quantum (trade name, manufactured by Creo) under the following conditions: resolution: 2400 dpi; rotation of the outside surface drum: 300 rpm, with power variation in steps of 1.5 W in a power range from 0 to 12.5 W. The precursor was exposed to light under conditions of 25° C. and 50% RH. After being exposed to light, the precursor was developed at a developing temperature of 30° C. at a conveying speed (line speed) of 2 m/min. in an automatic developing machine LP-1310 News (manufactured by Fuji Photo Film Co., Ltd.) without carrying out heating treatment and water-washing treatment. DH-N diluted with water (1:4) was used as the developing solution, FCT-421 diluted with water (1:1.4) was used as the developer replenishing liquid, and GN-2K (trade name, manufactured by Fuji Photo Film Co., Ltd.) diluted with water (1:1) was used as the finisher As to the density of the image area of the planographic printing plate obtained after developing, cyan density was measured using a Macbeth reflection densitometer RD-918 and a red filter set to the densitometer. The inverse of the exposure amount necessary to obtain a cyan density of 0.9 is defined as an index of sensitivity. In the results of the evaluation, the sensitivity of the planographic printing plate obtained in Comparative Example 1 was set as 100 to rate each sensitivity of other planographic printing plates relatively. The larger the value, the higher the sensitivity is.

(1-2) Evaluation of Adhesion Between Planographic Printing Plate Precursors The stack of planographic printing plate precursors was hermetically wrapped with A1 craft paper, and the wrapped stack was allowed to stand for 5 days at 30° C. under a load of 4 kg. Adhesion between the surface at the photosensitive layer side (the surface of the protective layer) of the planographic printing plate precursor and the back surface of the support of the contiguous planographic printing plate precursor in the stack was evaluated thereafter. Adhesion between the planographic printing plate precursors was evaluated by a sensory test in five ranks. Rank 3 was evaluated as the lower limit of the practically acceptable level, and ranks 2 and 1 were evaluated as practically non-acceptable levels. The evaluation criteria are shown below.

-Evaluation Criteria-

1. The entire surface is adhered when the surface of the protective layer is peeled from the contiguous support, and the protective layer is peeled off.

2. A part of the surface is adhered when the surface of the protective layer is peeled from the contiguous support, and the protective layer is partially peeled off.

3. While a part of the surface is adhered when the surface of the protective layer is peeled from the contiguous support, the protective layer is not peeled off.

4. While a slight resistance is sensed when the surface of the protective layer is peeled from the contiguous support, no adhesion is observed.

5. Resistance is not sensed at all when the surface of the protective layer is peeled from the contiguous support.

(1-3) Evaluation of Safelight Allowable Time

The obtained planographic printing plate precursor was exposed under a UV-cut fluorescent light at a luminous energy of 400 Lx, and the time before the appearance of fogging in the non-image portion after development was compared. The criterion of incidence of fog was defined to be a portion having a density 0.02 or more higher than the reflection density of a non-image portion that had not been exposed under the safelight.

(1-4) Measurement of Average Particle Diameter of Solid Dispersion Dye

The average particle diameter of the solid dispersion dye was measured as follows. A laser diffraction/scattering particle diameter distribution measuring apparatus (trade name: LA-910, manufactured by Horiba Co.) was used under the conditions of 10 instances of data acquisition, relative refractive index 1.18 to 0.001, stirring 2 minutes, circulation 5 minutes, and volumetric particle diameter mode.

The results are shown in Table 1.

TABLE 1

|  | Solid dispersion dye | Particle diameter (μm) | Interleaf sheets | Sensitivity | Time before appearing fog (relative value) | Adhesion (sensory test) |
|---|---|---|---|---|---|---|
| Example 1-1 | III-9 | 2.0 | Yes | 100 | 100 | 5 |
| Example 1-2 | III-9 | 0.5 | Yes | 100 | 100 | 5 |
| Example 1-3 | III-9 | 2.0 | No | 100 | 100 | 5 |
| Example 1-4 | III-9 | 0.5 | No | 100 | 100 | 3 |
| Example 1-5 | III-9 | 2.0 | No | 120 | 100 | 5 |
| Example 1-6 | III-9 | 0.5 | No | 120 | 100 | 5 |
| Comparative Example 1-1 | No | — | Yes | 120 | 30 | 5 |
| Comparative Example 1-2 | No | — | No | 120 | 30 | 1 |

The results in Table 1 show that the stacks of the planographic printing plate precursors in the examples, which use the planographic printing plate precursor in Examples 1-1 to 1-6 having the protective layer containing the solid dispersion dye, show no adhesion of the planographic printing plate precursor to one another when preserved in a high humidity environment without inserting interleaf sheets, due to the matting effect displayed by the solid dispersion dye or, when adhered, no peeling of the protective layer was seen when peeling contiguous protective layers from one another.

It was also shown that the planographic printing plate precursor in Examples 1-1 to 1-6, or the planographic printing plate precursor including, on the polymerizable negative photosensitive layer, the protective layer containing the solid dispersion dye, is highly sensitive and is excellent in compatibility with the safelight due to the filter effect of the solid dispersion dye.

As shown in Examples 1-5 and 1-6, the protective layer containing the solid dispersion dye as well as synthetic mica (protective layer containing an inorganic lamellar compound) permits a highly sensitive planographic printing plate precursor to be obtained while adhesiveness and compatibility with the safelight are maintained.

On the other hand, the planographic printing plate precursor in Comparative Examples 1-1 and 1-2, which includes a protective layer containing no solid dispersion dye, was remarkably poor in compatibility with the safelight, although sensitivity is excellent. In addition, the stacks using the planographic printing plate precursors in these comparative examples show remarkable adhesiveness between the printing plates, at a practically unacceptable level.

Example 2-1

Preparation of Support

An aluminum plate of JIS A1050 with a thickness of 0.30 mm and a width of 1030 mm was surface-treated as shown in Example 1-1.

The surface roughness Ra of the aluminum support thus obtained was 0.27 as measured with a surface roughness meter (trade name: SURFCOM, manufactured by Tokyo Seimitsu Co.; the diameter of the tip of the stylus=2 μm).

(Undercoat Layer)

Next, the following undercoat layer coating solution was applied to this aluminum support by using a wire bar and dried at 90° C. for 30 minutes. The amount applied was 10 mg/m².

<Undercoat Layer Coating Solution>

| | |
|---|---|
| Polymer compound A having the following structure (weight average molecular weight: 10000) | 0.05 g |
| Methanol | 27 g |
| Ion exchange water | 3 g |

Polymer compound A

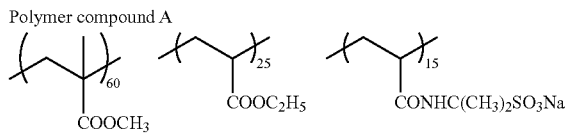

(Photosensitive Layer)

Next, the following photosensitive layer coating solution (P2-1) was prepared and applied to the foregoing aluminum support by using a wire bar. A drying operation was carried out at 115° C. for 34 seconds in a hot air drier to obtain a planographic printing plate precursor. The coating amount after the film was dried was 1.4 g/m².

<Photosensitive Layer Coating Solution P2-1>

| | |
|---|---|
| Infrared absorbing agent IR-1 | 0.074 g |
| Polymerization initiator OS-12 | 0.280 g |
| Additive PM-1 | 0.151 g |
| Polymerizable compound AM-1 | 1.00 g |
| Specific binder polymer BT-1 | 1.00 g |
| Ethyl violet C-1 | 0.04 g |
| Fluorochemical surfactant (trade name: MEGAFAC F-780-F, manufactured by Dainippon Ink and Chemicals, Incorporated, methyl | 0.015 g |

| -continued | |
|---|---|
| isobutyl ketone (MIBK) 30% by mass solution) | |
| Methyl ethyl ketone | 10.4 g |
| Methanol | 4.83 g |
| 1-methoxy-2-propanol | 10.4 g |

The polymerization initiator (OS-12) used in the coating layer of the photosensitive layer refers to the compound exemplified the onium salt compound represented by formula 1. The structures of the infrared absorbing agent (IR-1), additive (PM-1), polymerizable compound (AM-1), binder polymer (BT-1) and ethyl violet (C-1) are shown below.

name: GOHSERAN CKS-50, manufactured by Nippon Synthetic Chemical Industry Co., degree of saponification: 99 mol %, degree of polymerization: 300, sulfonic acid-modified polyvinyl alcohol) and an emulsifier (trade name: EMULEX 710, manufactured by Nippon Emulsion Co.) was applied onto the surface of the foregoing photosensitive layer by a wire bar and dried at 125° C. for 75 seconds in a hot air type drier.

The proportion of content of the mica solid fraction/the polyvinyl alcohol/the surfactant in the mixed aqueous solution (the oxygen blocking layer coating solution) was 18/80/2 (% by mass), and the total coating amount (coating amount after drying) was 0.5 g/m$^2$.

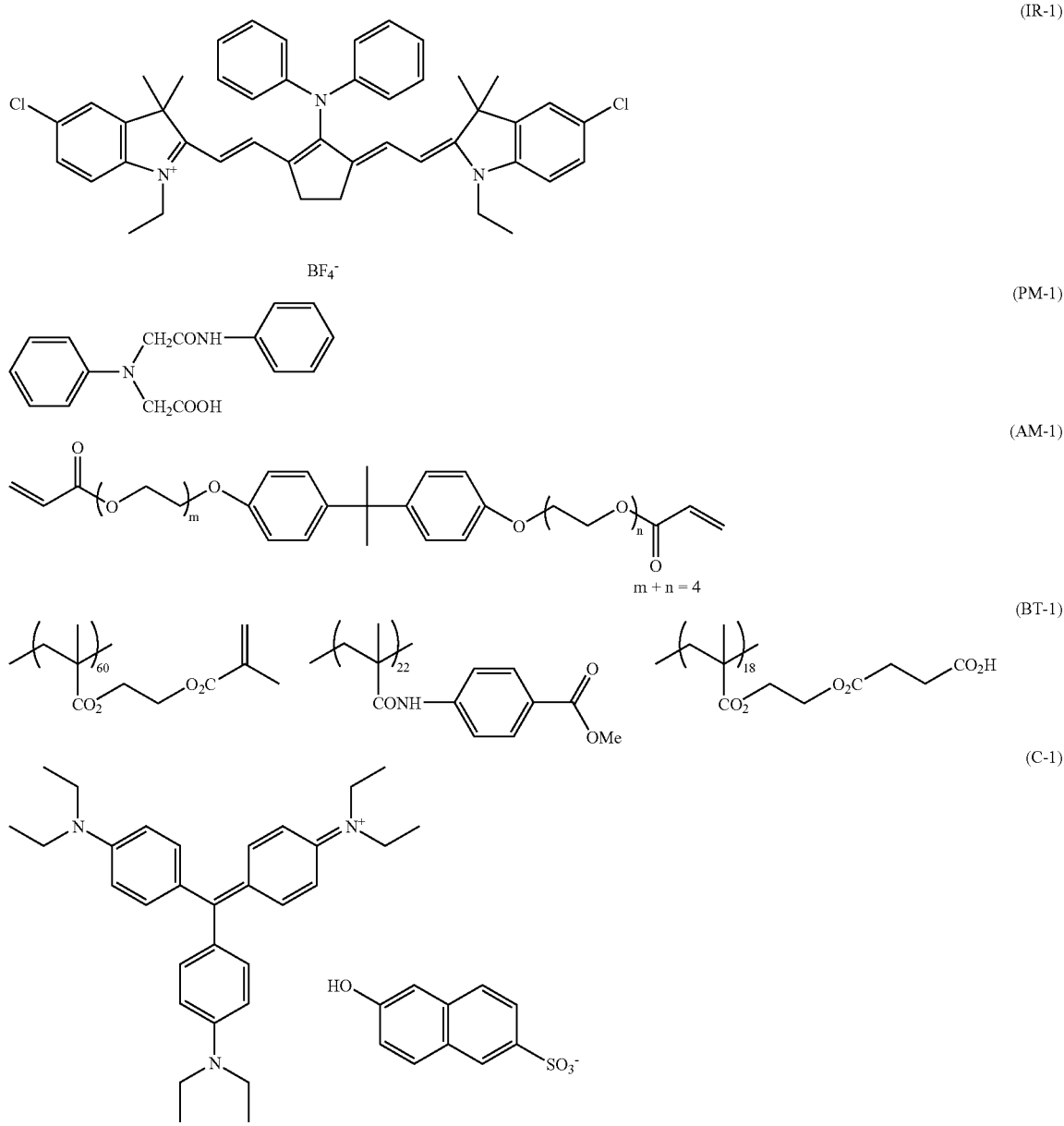

(Oxygen Blocking Layer)

A mixed aqueous solution (oxygen blocking layer coating solution) containing synthetic mica (trade name: SOMASIF ME-100, manufactured by CO-OP Chemical Co., 8% aqueous dispersion solution), a specific polyvinyl alcohol (trade (Protective Layer)

A mixed aqueous solution (protective layer coating solution) containing a specific polyvinyl alcohol with a degree of saponification of 91 mol % or more (trade name: GOHSERAN CKS-50, manufactured by Nippon Synthetic Chemical Industry Co., degree of saponification: 99 mol %, degree of polymerization: 300, sulfonic acid-modified polyvinyl alcohol) and the exemplified compound (III-9) (trade name 1306F, manufactured by Daito Chemics Co., volume average particle diameter 2 µm) as a solid dispersion dye and a surfactant (EMULEX 710, manufactured by Nippon Emulsion Co.) was applied onto the surface of the oxygen blocking layer formed as described above with a wire bar, and the layer was dried at 125° C. for 75 seconds in a hot air type drier.

-Preparation of Dispersion of Solid Dispersion Dye-

The dispersion of solid dispersion dye was prepared as follows.

Pure water (33.6 g), surfactant (2.3 g, a condensation product of naphthalene sulfonic acid and formalin) and a solid dispersion dye (14.1 g) were mixed and stirred for 16 hours, and the mixture was stirred for 1 hour by adding glass beads with a diameter from 0.425 to 0.600 µm. A solid dispersion dye with a volume average particle diameter of 0.5 µm was obtained thereafter by removing the glass beads, and the product was further heat-treated at 85° C. for 1 hour.

The proportion of content in the mixed aqueous solution (i.e. the protective layer coating solution) was 89.5/6/4.5 (% by mass), and the total coating amount (the coating amount after drying) was 1.6 g/m$^2$.

The planographic printing plate precursor in Example 2-1 was thus obtained.

Example 2-2

The planographic printing plate precursor in Example 2-2 was obtained in the same manner as in Example 2-1, except that synthetic mica (trade name: SOMASIF ME-100, manufactured by CO-OP Chemical Co., 8% aqueous dispersion solution) used for the oxygen blocking layer in the planographic printing plate precursor in Example 2-1 was replaced with the specific polyvinyl alcohol (trade name: GOHSERAN CKS-50, manufactured by Nippon Synthetic Chemical Industry Co., degree of saponification: 99 mol %, degree of polymerization: 300, sulfonic acid-modified polyvinyl alcohol) in the same proportion.

Comparative Example 2-1

The planographic printing plate precursor in Comparative Example 2-1 was obtained in the same method as in Example 2-1, except that the solid dispersion dye used for the protective layer in the planographic printing plate precursor in Example 2-1 was replaced with the specific polyvinyl alcohol (trade name: GOHSERAN CKS-50, manufactured by Nippon Synthetic Chemical Industry Co., degree of saponification: 99 mol %, degree of polymerization: 300, sulfonic acid-modified polyvinyl alcohol) in the same proportion.

(2-1) Evaluation of Sensitivity

Each of the obtained planographic printing plate precursor was exposed to light in TRENDSETTER 800 II Quantum (trade name, manufactured by Creo) under the following condition: resolution: 2400 dpi and rotation of the outside surface drum: 300 rpm, with varying a power in steps of 1.5 W in a power range from 0 to 12.5 W. The precursor was exposed to light under condition of 25° C. and 50% RH. After being exposed to light, the precursor was developed at a developing temperature of 30° C. at a conveying speed (line speed) of 2 m/min. in an automatic developing machine LP-1310 News manufacture by Fuji Photo Film Co., Ltd. without carrying out heating treatment and water-washing treatment. DH-N diluted with water (1:4) was used as the developing solution, FCT-421 diluted with water (1:1.4) was used as the developer replenishing liquid, and GN-2K (trade name, manufactured by Fuji Photo Film Co., Ltd.) diluted with water (1:1) was used as the finisher As to the density of the image area of the planographic printing plate obtained after developing, cyan density was measured using a Macbeth reflection densitometer RD-918 and a red filter set to the densitometer. The inverse of the exposure amount necessary to obtain a cyan density of 0.9 is defined as an index of sensitivity. In the results of the evaluation, the sensitivity of the planographic printing plate obtained in Comparative Example 1 was set as 100 to rate each sensitivity of other planographic printing plates relatively. The larger the value, the higher the sensitivity is.

(2-2) Evaluation of Adhesion Between Planographic Printing Plate Precursors

Three sheets of the planographic printing plate precursors (10 cm×10 cm) were conditioned at 25° C. in an environment of 75% RH for 2 hours, and a stack was obtained by sequentially piling three sheets of the planographic printing plate precursors in the same direction without inserting interleaf sheets. The stack was hermetically wrapped with Al craft paper, and the wrapped stack was allowed to stand for 5 days at 30° C. under a load of 4 kg. Adhesion between the surface at the photosensitive layer side (the surface of the protective layer) of the planographic printing plate precursor and the back surface of the support of the adjoining planographic printing plate precursor in the stack was evaluated thereafter. Adhesion between the planographic printing plate precursors was evaluated by the following evaluation criteria. Rank 3 was evaluated as the lower limit of the practically acceptable level, and ranks 2 and 1 were evaluated as practically non-acceptable levels.

-Evaluation Criteria-

1. The entire surface is adhered when the surface of the protective layer is peeled from the contiguous support, and the protective layer is peeled off.

2. A part of the surface is adhered when the surface of the protective layer is peeled from the contiguous support, and the protective layer is partially peeled off.

3. While a part of the surface is adhered when the surface of the protective layer is peeled from the contiguous support, the protective layer is not peeled off.

4. While a slight resistance is sensed when the surface of the protective layer is peeled from the contiguous support, no adhesion is observed.

5. Resistance is not sensed at all when the surface of the protective layer is peeled from the contiguous support.

(2-3) Evaluation of Safelight Allowable Time

The obtained planographic printing plate precursor was exposed under a UV-cut fluorescent light at a luminous energy of 400 Lx, and the time before the appearance of fogging in the non-image portion after development was compared. The criterion of incidence of fog was defined to be a portion having a density 0.02 or more higher than the reflection density of a non-image portion that had not been exposed under the safelight.

(2-4) Evaluation of Image Defect

The planographic printing plate precursor was exposed at resolution of 2400 dpi, outer drum rotation speed of 200 rpm and output energy of 5W with TRENDSETTER 800 II QUANTUM (trade name, manufactured by Creo Co.) to form a solid image. After exposure, the plate was developed with an automatic development machine (trade name: P-1320 HII, manufactured by Fuji Film Co.) at a conveying speed (line speed) of 2 m/min and at a development temperature of 30° C. without heat-treatment and washing with water. DN-N diluted with water (1:4) was used as the developing solution.

Defects of the image (i.e. whitening portion), if any, appearing at the image portion of the planographic printing plate obtained by development were visually evaluated.

The image was evaluated in 5 ranks by sensory evaluation, and rank 3 was evaluated as a lower level of practical acceptability, while ranks 2 and 1 were evaluated to be practically unacceptable.

(2-5) Oxygen Blocking Property of Oxygen Blocking Layer

The oxygen blocking property of the oxygen blocking layer was confirmed by measuring oxygen permeability as follows.

The oxygen blocking layer coating solution was applied on a photographic paper sheet with a thickness of about 200 μm coated with 20 μm of polyethylene on both surfaces, in the same manner as it would be coated on a photosensitive layer, to prepare a sample for the measurement. Since oxygen permeability of the photographic paper sheet is about 700 ml/m²·day·atm under the following conditions, this value may be ignored in the measurement of oxygen permeability of the oxygen blocking layer. Oxygen permeability (ml/m²·day·atm) of the oxygen blocking layer was measured at 25° C. and 60% RH using an OX-TRAN 2/20 (trade name: manufactured by Mocon Co.) according to the permeability evaluation method described in JIS K7126B and ASTM D3985.

(2-6) Evaluation of Incidence of Scratches

The planographic printing plate precursors were stacked without inserting interleaf sheets. The stack was set into a cassette, each plate was transferred from the setting portion to a TRENDSETTER 3244 (trade name: manufactured by Creo Co.) by an autoloader, and a 50% density planar net image was exposed at a resolution of 2400 dpi at an output energy of 7 W, outer drum rotation speed of 150 rpm and in-plane energy of 110 mJ/cm². The exposed plate was developed as in the evaluation of sensitivity. The plate was developed after exposure as in the evaluation of sensitivity described above. Incidence of scratches, if any, in the planar net image was visually evaluated. The image was evaluated in 5 ranks of ranks 1 to 5 by sensory test. Rank 3 was evaluated as a lower level of practical acceptability, while ranks 2 and 1 were evaluated to be practically unacceptable.

The results are shown in Table 2.

As described above, the present invention can provide a photosensitive recording material capable of recording with laser and suppressing polymerization inhibition of the photosensitive layer. In addition, even when the photosensitive recording materials are stored long term in a high humidity environment or transported as a stack of the recording materials, the outermost surface at the photosensitive layer side of the photosensitive recording material and the outermost surface opposite to the photosensitive layer side of a contiguous photosensitive recording material are prevented from adhering to one another. The present invention also provides a planographic printing plate precursor that is used the photosensitive recording material of the present invention.

Further, the present invention provides a stack of photosensitive recording materials or a stack of planographic printing plate precursors which is formed by stacking the photosensitive recording materials or the stacked photosensitive planographic printing plate precursors of the present invention.

All publications, patent applications, and technical standards mentioned in this specification are herein incorporated by reference to the same extent as if each individual publication, patent application, or technical standard was specifically and individually indication to be incorporated by reference.

What is claimed is:

1. A photosensitive recording material comprising a support, and a photosensitive layer and a protective layer formed in this order on or above the support, wherein:

the photosensitive layer comprises a polymerization initiator, a sensitizing agent, and a polymerizable compound; and the protective layer comprises a water-insoluble and alkali-soluble dye that has an absorption wavelength region different from the absorption wavelength region of the sensitizing agent, wherein the dye is dispersed in a solid state in the protective layer, and wherein the dye has an absorption maximum in a range of from 300 to 500 nm.

2. The photosensitive recording material according to claim 1, further comprising an intermediate layer having an oxygen blocking property between the photosensitive layer and the protective layer.

TABLE 2

| | Protective layer Kind of solid dispersion dye | Oxygen blocking layer Content of mica compound | Sensitivity | Time before appearing fog (relative time) | Adhesion (sensory test) | Incidence of scratches | Image defect at exposed portion |
|---|---|---|---|---|---|---|---|
| Example 2-1 | III-9 | Yes | 5 | 100 | 100 | 5 | 5 | 5 |
| Example 2-2 | III-9 | No | 90 | 90 | 100 | 5 | 4 | 4 |
| Comparative Example 2-1 | — | Yes | 5 | 120 | 30 | 2 | 3 | 5 |

The results in Table 2 show that neither adhesion between the planographic printing plate precursors to one another or incidence of scratches is observed when plural plates are directly stacked without inserting interleaf sheets, or the stack of the planographic printing plate precursors is formed, using the planographic printing plate precursor of Examples 2-1 and 2-2 comprising the oxygen blocking layer on the photosensitive layer and a solid dispersion dye. In addition, the planographic printing plate precursors of Examples 2-1 and 2-2 are highly sensitive and excellent in compatibility with safelight while no defects of the image are observed in the exposed portion.

3. The photosensitive recording material according to claim 2, wherein the intermediate layer having an oxygen blocking property comprises an inorganic lamellar compound.

4. The photosensitive recording material according to claim 3, wherein the inorganic lamellar compound is a mica compound.

5. The photosensitive recording material according to claim 2, wherein the intermediate layer having an oxygen blocking property further comprises a binder polymer.

6. The photosensitive recording material according to claim 1, wherein the sensitizing agent has an absorption maximum in the infrared region.

7. The photosensitive recording material according to claim 1, wherein the volume average particle diameter of the dye is in a range of from 0.2 µm to 30 µm.

8. The photosensitive recording material according to claim 1, wherein the volume average particle diameter of the dye is in a range of from 0.5 µm to 20 µm.

9. The photosensitive recording material according to claim 1, wherein the protective layer further comprises a binder polymer.

10. The photosensitive recording material according to claim 1, wherein the protective layer further comprises an inorganic lamellar compound.

11. The photosensitive recording material according to claim 10, wherein the inorganic lamellar compound is a mica compound.

12. A stack of photosensitive recording materials comprising a plurality of the photosensitive recording materials according to claim 1, wherein an outermost surface at a photosensitive layer side of a photosensitive recording material directly contacts an outermost surface of a side opposite to the photosensitive layer side of a contiguous photosensitive recording material.

13. A photosensitive lithographic planographic printing plate precursor using the photosensitive recording material according to claim 1.

14. A stack of photosensitive recording materials comprising a plurality of the planographic printing plate precursors according to claim 13, wherein an outermost surface of a photosensitive layer side of a planographic printing plate precursor directly contacts an outermost surface of a side opposite to the photosensitive layer side of a contiguous planographic printing plate precursor.

* * * * *